(12) United States Patent
Nishiyama et al.

(10) Patent No.: US 7,998,654 B2
(45) Date of Patent: Aug. 16, 2011

(54) POSITIVE RESIST COMPOSITION AND PATTERN-FORMING METHOD

(75) Inventors: Fumiyuki Nishiyama, Shizuoka (JP); Hiromi Kanda, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 111 days.

(21) Appl. No.: 12/056,330

(22) Filed: Mar. 27, 2008

(65) Prior Publication Data

US 2008/0248425 A1    Oct. 9, 2008

(30) Foreign Application Priority Data

Mar. 28, 2007 (JP) .................... 2007-085212
Mar. 17, 2008 (JP) .................... 2008-067962

(51) Int. Cl.
*G03F 7/004* (2006.01)
*G03F 7/30* (2006.01)

(52) U.S. Cl. .................. 430/270.1; 430/326; 430/905; 430/907; 430/910

(58) Field of Classification Search .............. 430/270.1, 430/326, 905, 910, 907
See application file for complete search history.

(56) References Cited

U.S. PATENT DOCUMENTS

| | | | |
|---|---|---|---|
| 2,008,020 A * | 7/1935 | Jackman | 352/140 |
| 7,521,169 B2 * | 4/2009 | Nishimura et al. | 430/270.1 |
| 2006/0166136 A1 * | 7/2006 | Kanda | 430/270.1 |
| 2006/0246373 A1 | 11/2006 | Wang | |
| 2006/0292490 A1 * | 12/2006 | Kodama et al. | 430/270.1 |
| 2007/0218401 A1 | 9/2007 | Ando et al. | |
| 2009/0042132 A1 | 2/2009 | Irie et al. | |
| 2009/0053650 A1 | 2/2009 | Irie | |

FOREIGN PATENT DOCUMENTS

| | | |
|---|---|---|
| EP | 1 739 483 A2 | 1/2007 |
| EP | 1754999 A2 | 2/2007 |
| EP | 1764652 A2 | 3/2007 |
| EP | 1 795 960 A2 | 6/2007 |
| JP | 57-153433 A | 9/1982 |
| JP | 7-220990 A | 8/1995 |
| WO | WO2004040376 * | 5/2004 |
| WO | 2007/094192 A1 | 8/2004 |
| WO | 2004/077158 A1 | 9/2004 |
| WO | 2007/069548 A1 | 6/2007 |
| WO | 2007/116664 A1 | 10/2007 |

OTHER PUBLICATIONS

B.J. Lin, "Semiconductor Foundry, Lithography, and Partners", Proc. SPIE, Emerging Lithographic Technologies VI, 2002, pp. 11-24, vol. 4688.
J.A. Hoffnagle, et al., "Liquid Immersion Deep-Ultraviolet Interferometric Lithography", J. Vac. Sci. Techonol. B, Nov./Dec. 1999, pp. 3306-3309, vol. 17, No. 6, American Vacuum Society.
Hiroshi Ito, et al., "Dissolution/Swelling Behavior of Cycloolefin Polymers in Aqueous Base", Advances in Resist Technology and Processing XVII, 2000, pp. 2-12, Proceedings of SPIE.
Partial European Search Report dated Aug. 11, 2008.
Extended European Search Report dated Oct. 9, 2008.

* cited by examiner

*Primary Examiner* — John S Chu
(74) *Attorney, Agent, or Firm* — Sughrue Mion, PLLC

(57) ABSTRACT

A positive resist composition comprises: (A) a resin that has a repeating unit represented by general formula (a1) and increases its solubility in an alkali developer by action of an acid; (B) a compound which generates an acid upon irradiation with an actinic ray or a radiation; and (C) a resin that has at least one of a fluorine atom and a silicon atom and has a group selected from the group consisting of (x), (y) and (z); and (D) a solvent:

(x) an alkali-soluble group;
(y) a group capable that decomposes by action of an alkali developer to undergo an increase in a solubility of the resin (C) in an alkali developer; and
(z) a group that decomposes by action of an acid,

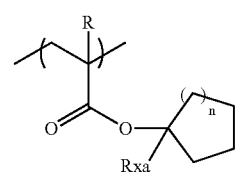

(a1)

wherein R represents a hydrogen atom or a methyl group, Rxa represents an alkyl group or a cycloalkyl group, and n represents an integer of 1 to 8.

14 Claims, 1 Drawing Sheet

FIGURE
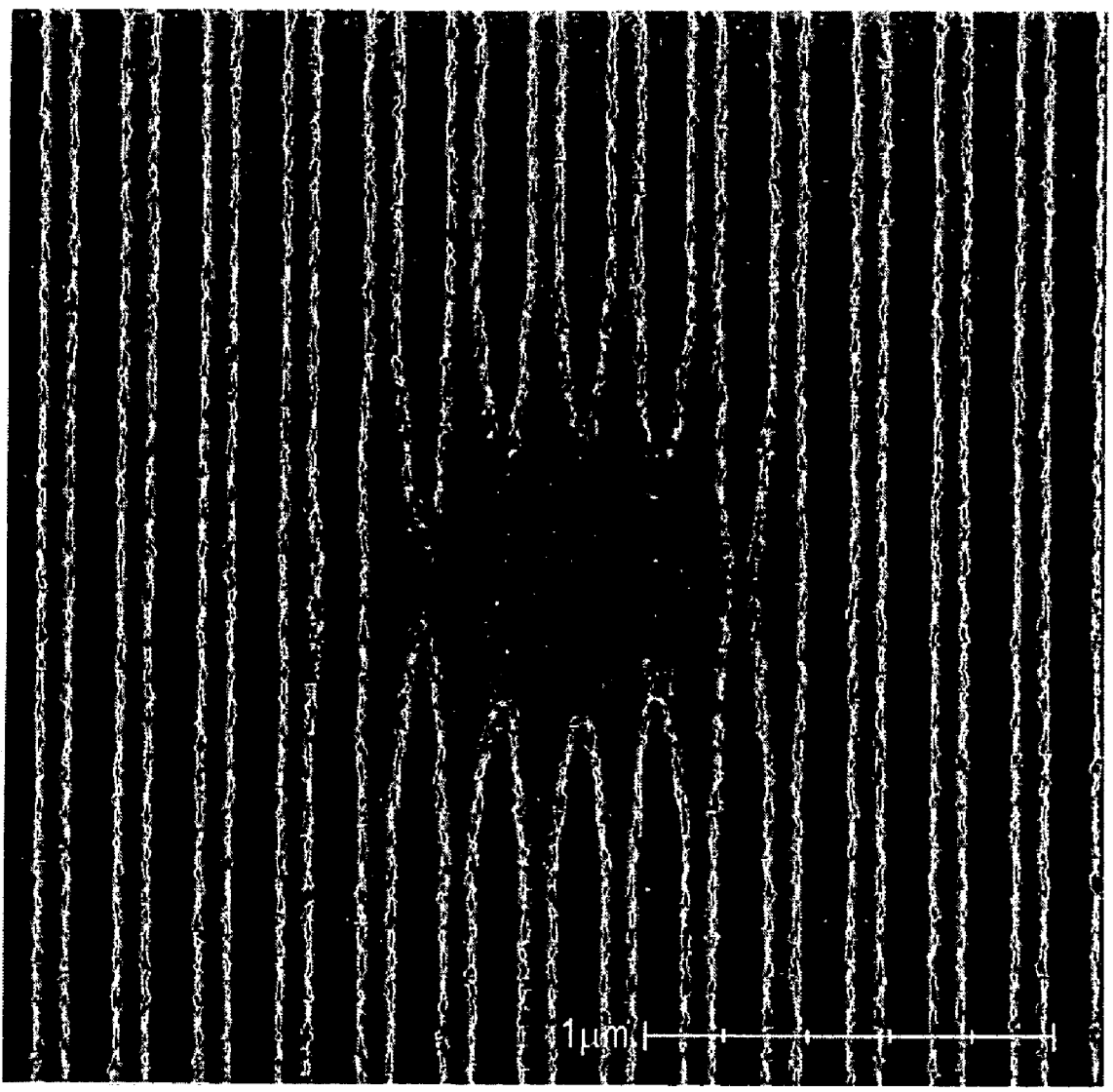

POSITIVE RESIST COMPOSITION AND PATTERN-FORMING METHOD

BACKGROUND OF THE INVENTION

1. Field of the Invention

The present invention relates to a positive resist composition which can be used in the step of producing semiconductors such as ICs, producing circuit substrates for liquid crystal or thermal head, or in other photo fabrication steps, and to a pattern-forming method using the resist composition. In particular, it relates to a positive resist composition suitable for exposure with an immersion exposure type projection exposure apparatus employing deep ultraviolet rays having a wavelength of 300 nm or shorter as an exposure light, and to a pattern-forming method using the composition.

2. Description of the Related Art

With the trend toward size reduction in semiconductor elements, the wavelengths of exposure lights are decreasing and the numerical apertures (NA) of projection lenses are increasing. An exposure apparatus which has an NA of 0.84 and employs an ArF excimer laser having a wavelength of 193 nm as a light source has been developed so far. As is generally well known, resolution and focal depth can be expressed by the following equations:

$$(\text{Resolution}) = \kappa_1 \cdot (\lambda / NA)$$

$$(\text{Focal depth}) = \pm \kappa_2 \cdot \lambda / NA^2$$

wherein $\lambda$ is the wavelength of the exposure light, NA is the numerical aperture of the projection lens, and $\kappa_1$ and $\kappa_2$ are coefficients relating to the process.

An exposure apparatus employing an $F_2$ excimer laser having a wavelength of 157 nm as a light source is being investigated for the purpose of enhancing resolution by using a shorter wavelength. However, use of this apparatus is disadvantageous in that materials for the lens to be used in the exposure apparatus and materials for resists are considerably limited due to the use of such a shorter wavelength. Because of this, the cost of apparatus and material production is high and it is extremely difficult to stabilize quality. There is hence a possibility that an exposure apparatus and a resist which have sufficient performances and stability might be unavailable in a desired period.

The so-called immersion method has been known as a technique for enhancing resolution with respect to optical microscopes. In this method, the space between the projection lens and the sample is filled with a liquid having a high refractive index (hereinafter also referred to as "immersion liquid").

This "immersion" has the following effects. In the immersion, the resolution and the focal depth can be expressed by the following equations on the assumption that $NA_0 = \sin \theta$:

$$(\text{Resolution}) = \kappa_1 \cdot (\lambda_0 / n) / NA_0$$

$$(\text{Focal depth}) = \pm \kappa_2 \cdot (\lambda_0 / n) / NA_0^2$$

wherein $\lambda_0$ is the wavelength of the exposure light in air, n is the refractive index of the immersion liquid relative to that of air, and $\theta$ is the convergence half angle of the light.

Namely, the immersion produces the same effect as the use of an exposure light having a wavelength reduced to 1/n. In other words, in the case of an optical projection system having the same NA, the focal depth can be increased to n times by the immersion.

This is effective in all pattern shapes and can be used in combination with a super resolution technique such as the phase shift method or the deformation illumination method.

Examples of apparatus in which this effect is applied to the transfer of fine circuit patterns for semiconductor elements are introduced in JP-A-57-153433, JP-A-7-220990, etc.

Recent progresses in the immersion exposure technique are reported in *SPIE Proc* 4688, 11 (2002), *J. Vac. Sci. Technol. B* 17 (1999), *SPIE Proc* 3999, 2 (2000), and WO2004-077158.

In the case where an ArF excimer laser is used as a light source, pure water (refractive index at 193 nm: 1.44) is thought to be most promising from the standpoints of safety in handling and transmittance and refractive index at 193 nm. Although solutions containing fluorine are being investigated for use in the case of using an $F_2$ excimer laser as a light source from the standpoint of a balance between transmittance and refractive index at 157 nm, no immersion liquid has been found which is sufficient from the standpoints of environmental safety and refractive index. In view of the degree of the effect of the immersion and the degree of completion of resists, the technique of immersion exposure is thought to be employed first in an ArF exposure apparatus.

Since the advent of resists for KrF excimer lasers (248 nm), the technique of image formation called chemical amplification has been used as a resist image formation method for the purpose of compensating for a sensitivity decrease caused by light absorption. To describe the positive chemical amplification type image-forming method as an example, it is a method for forming an image which comprises exposing a resist film to light to thereby cause an acid generator in the exposed areas to decompose and generate an acid, subjecting the resist film to post-exposure bake (PEB) to utilize the resultant acid as a reaction catalyst to convert alkali-insoluble groups into alkali-soluble groups, and removing the exposed areas by alkali development.

Although resists for an ArF excimer laser (wavelength: 193 nm) using this chemical amplification mechanism are predominating at present, they involve the problem that a formed line pattern can collapse to cause defects upon production of a device. Thus, this problem has been required to solve.

It has been pointed out that, when a chemical amplification type resist is subjected to immersion exposure, the resist layer might be deteriorated or ingredients exerting detrimental influences might ooze from the resist layer into the immersion liquid, since the resist layer comes into contact with the immersion liquid upon exposure. WO2004-068242 describes a case wherein the resist performance is changed when the resist for ArF exposure is dipped in water before and after exposure, and this is indicated as a problem in the immersion exposure.

Also, in conducting immersion exposure, there can result a circular defect called water mark, and this defect is required to remove.

SUMMARY OF THE INVENTION

In consideration of the above-described problems with the related art, an object of the invention is to provide a positive resist composition capable of suppressing generation of water mark upon immersion exposure and provide a pattern-forming method using the composition.

The inventors have found that a positive resist composition which can solve the above-mentioned problems and which is excellent in margin of film reduction and a pattern-forming method using the composition can be obtained by the following constitution.

<1> A positive resist composition comprising: (A) a resin that has a repeating unit represented by general formula (a1) and increases its solubility in an alkali developer by action of an acid; (B) a compound which generates an acid upon irradiation with an actinic ray or a radiation; and (C) a resin that has at least one of a fluorine atom and a silicon atom and has a group selected from the group consisting of (x), (y) and (z); and (D) a solvent:

(x) an alkali-soluble group;

(y) a group capable that decomposes by action of an alkali developer to undergo an increase in a solubility of the resin (C) in an alkali developer; and (z) a group that decomposes by action of an acid.

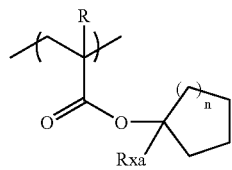
(a1)

In formula (a1), R represents a hydrogen atom or a methyl group, Rxa represents an alkyl group or a cycloalkyl group, and n represents an integer of 1 to 8.

<2> The positive resist composition as described in <1> above, wherein the resin (A) further comprises a repeating unit represented by formula (a1-1) or (a1-2).

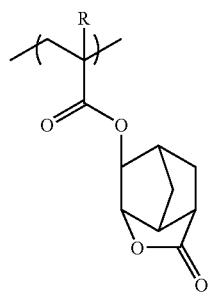
(a1-1)

(a1-2)

In formulae (a1-1) and (a1-2), R represents a hydrogen atom or a methyl group.

<3> The positive resist composition as described in <1> or <2> above, wherein the resin (A) further comprises a repeating unit represented by formula (a2).

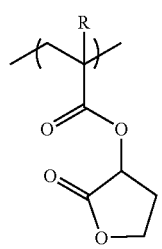
(2a)

In formula (a2), R represents a hydrogen atom or a methyl group, p represents an integer of 0 to 8, $Ra_2$ represents an alkyl group, a cyano group or a group represented by $-(CH_2)_q-C(CF_3)_2OH$ and, when a plurality of $Ra_2$s exist, $Ra_2$s may be the same or different or may be connected to each other to form a ring, and q represents an integer of 0 to 3.

<4> A pattern-forming method comprising: forming a resist film with the resin composition described in any one of <1> to <3> above; and exposing and developing the resist film.

BRIEF DESCRIPTION OF THE DRAWINGS

FIG. 1 shows an example of watermark.

DETAILED DESCRIPTION OF THE INVENTION

The invention will be described in detail below.

Additionally, with respect to description of a group (a group of atoms) used in this specification, a group described without description on the presence or absence of a substituent includes both a substituted group and an unsubstituted group. For example, "an alkyl group" includes both an alkyl group having a substituent (a substituted alkyl group) and an alkyl group having no substituents (an unsubstituted alkyl group).

(A) Resin Increasing its Solubility in an Alkali Developer by Action of an Acid

The resin to be used in the resist composition of the invention is a resin (acid-decomposable resin) which contains a repeating unit represented by the following general formula (a1) and decomposes by action of an acid to undergo an increase in its solubility in an alkali developer.

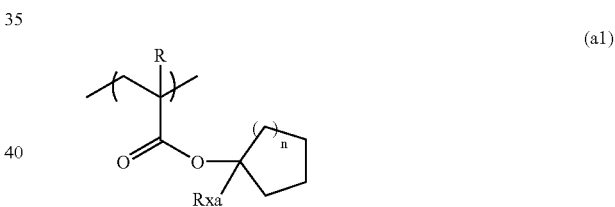
(a1)

In formula (a1), R represents a hydrogen atom or a methyl group, Rxa represents an alkyl group or a cycloalkyl group and n represents an integer of 1 to 8.

Regarding Rxa, the alkyl group may be straight or branched, and the cycloalkyl group may be monocyclic or polycyclic.

Rxa preferably represents an alkyl group containing from 1 to 4 carbon atoms.

Preferred specific examples of the repeating unit represented by formula (a1) are illustrated below.

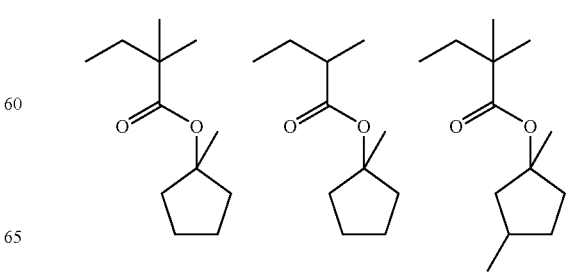

-continued

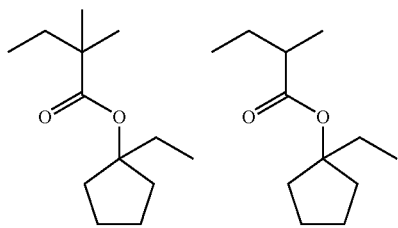

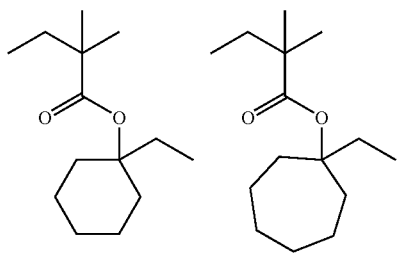

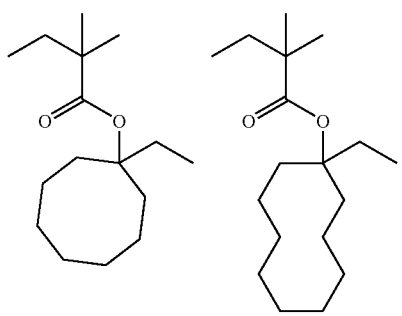

The resin A preferably further contains a repeating unit represented by the following formula (a1-1) or (a1-2).

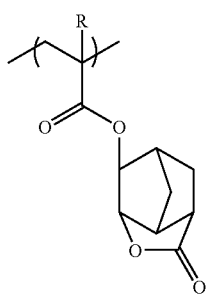
(a1-1)

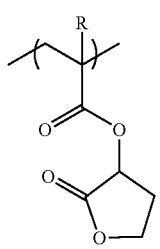
(a1-2)

In formulae (a1-1) and (a1-2), R represents a hydrogen atom or a methyl group.

It is also preferred for the resin (A) to further contain a repeating unit represented by the following formula (a2).

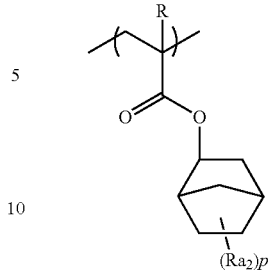
(2a)

In formula (a2), R represents a hydrogen atom or a methyl group, p represents an integer of 0 to 8, $Ra_2$ represents an alkyl group, a cyano group or a group represented by $-(CH_2)_q-C(CF_3)_2-OH$ and, when a plurality of $Ra_2$s exist, $Ra_2$s may be the same or different or may be connected to each other to form a ring, and q represents an integer of 0 to 3.

Regarding $Ra_2$, the alkyl group may be straight or branched, and contains preferably from 1 to 4 carbon atoms.

The repeating unit represented by formula (a2) is more preferably a repeating unit represented by the following formulae (a2-1) to (a2-3). R represents a hydrogen atom or a methyl group.

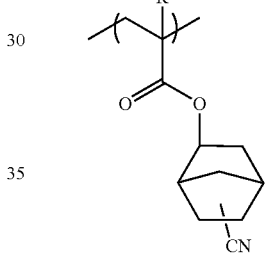
(a2-1)

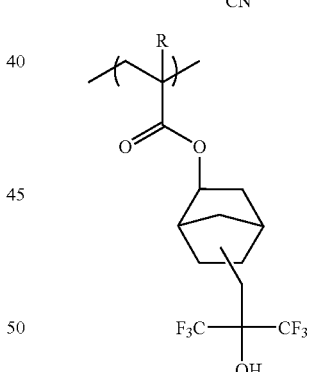
(a2-2)

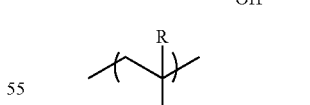

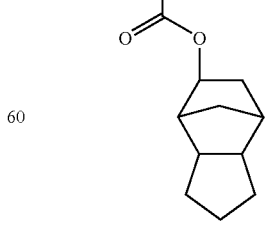
(a2-3)

In the invention, an acid-decomposable group (a group decomposable by the action of an acid) is a group substituted by a substituent formed by displacing a hydrogen atom of an alkali-soluble group, preferably a —COOH group or a —OH group, with a group releasable with an acid.

Examples of the group releasable with an acid include —C($R_{36}$)($R_{37}$)($R_{38}$), —C($R_{36}$)($R_{37}$)($OR_{39}$), and —C($R_{01}$)($R_{02}$)($OR_{39}$).

In the formulae, $R_{36}$ to $R_{39}$ each independently represents an alkyl group, a cycloalkyl group, an aryl group, an aralkyl group or an alkenyl group. $R_{36}$ and $R_{37}$, and $R_{36}$ and $R_{39}$, may be connected to each other to form a ring. $R_{01}$ to $R_{02}$ each independently represents a hydrogen atom, an alkyl group, a cycloalkyl group, an aryl group, an aralkyl group or an alkenyl group.

In the invention, the acid-decomposable group is preferably an acetal group or a tertiary ester group.

The resin of component (A) may further contain other acid-decomposable repeating unit in addition to the acid-decomposable group represented by the general formula (a1).

Specific examples of such other acid-decomposable group are illustrated below which, however, do not limit the invention in any way.

(In the following formulae, Rx represents H, $CH_3$, $CF_3$ or $CH_2OH$, and Rxa and Rxb each represents an alkyl group containing from 1 to 4 carbon atoms.)

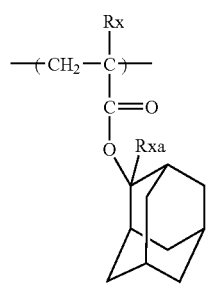

1

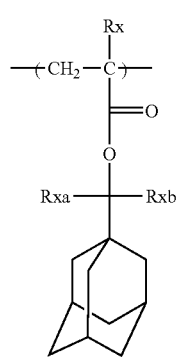

2

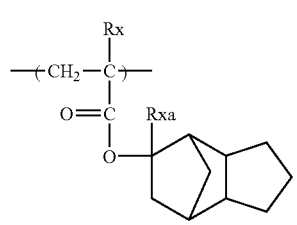

3

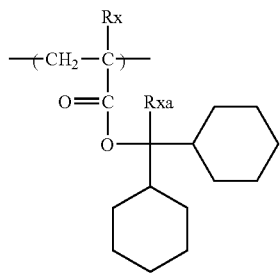

9

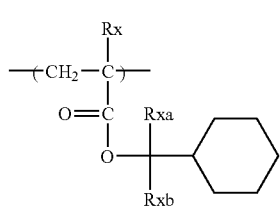

10

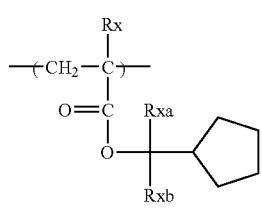

11

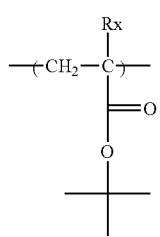

15

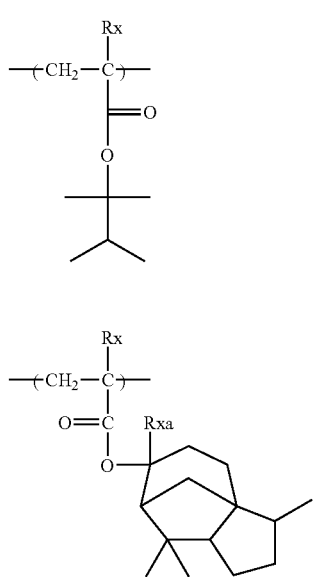

16

17

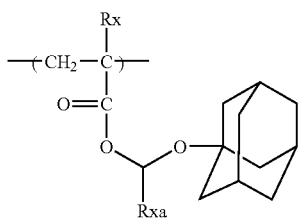

18

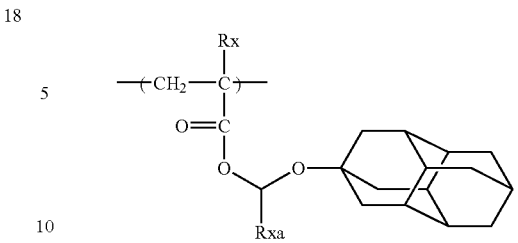

24

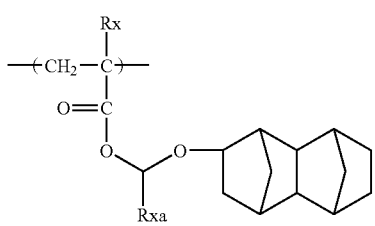

19

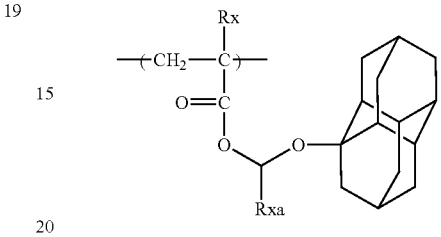

25

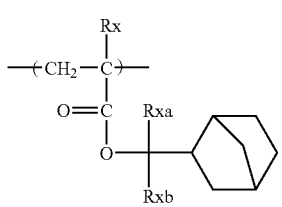

20

Of the above-illustrated specific examples, preferred other acid-decomposable repeating units are repeating units 1, 2, 10, and 11.

In the case of using a combination of the repeating unit represented by the general formula (a1) and having the acid-decomposable group and other repeating unit having an acid-decomposable group, the ratio of the repeating unit represented by the general formula (a1) and having the acid-decomposable group to the other repeating unit having an acid-decomposable group is from 90:10 to 10:90, more preferably from 80:20 to 20:80, by molar ratio.

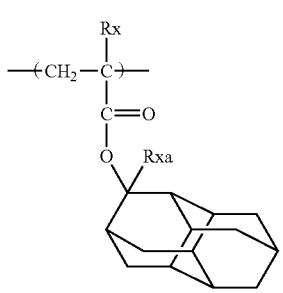

21

The content of all the repeating units having an acid-decomposable group in the resin of component (A) is preferably from 20 to 50 mol %, more preferably from 25 to 45 mol %, based on all the repeating units in the polymer.

The resin of component (A) may further contain other repeating unit.

The resin of component (A) may contain other lactone structure than that of the above formulae (a1-1) and (a1-2).

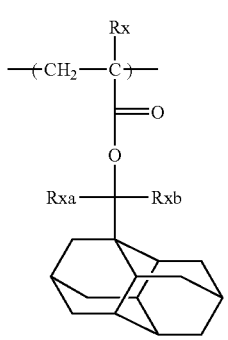

22

As the other lactone structure than that of the above formulae (a1-1) and (a1-2), any structure that has a lactone structure may be employed, but a 5- to 7-membered lactone structure is preferred. Lactone structures wherein a 5- to 7-membered lactone structure is condensed with other ring structure in the form of forming a bicyclo structure or a spiro structure are preferred. It is more preferred for the resin to contain a repeating unit having a lactone structure represented by any one of the following general formulae (LC1-2) to (LC1-16). Also, the lactone structure may be directly connected to the main chain. Preferred lactone structures are (LC1-5), (LC1-6), (LC1-13), and (LC1-14). Use of a particular lactone structure serves to remove edge roughness and development defects.

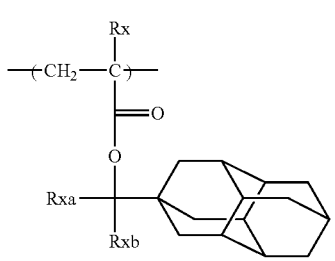

23

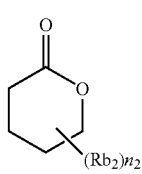

LC1-2

-continued

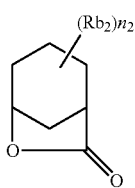
LC1-3

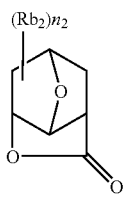
LC1-5

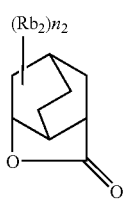
LC1-6

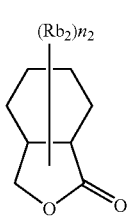
LC1-7

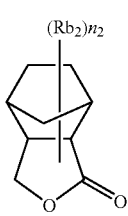
LC1-8

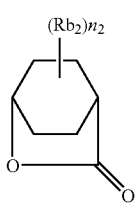
LC1-9

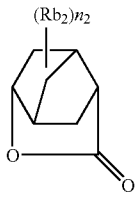
LC1-10

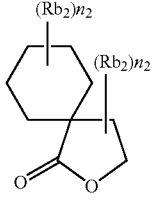
LC1-11

-continued

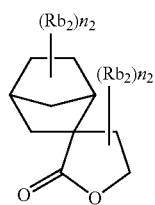
LC1-12

LC1-13

LC1-14

LC1-15

LC1-16

The lactone structure moiety may or may not have a substituent ($Rb_2$). Preferred examples of the substituent ($Rb_2$) include an alkyl group containing from 1 to 8 carbon atoms, a cycloalkyl group containing from 4 to 7 carbon atoms, an alkoxy group containing from 1 to 8 carbon atoms, an alkoxycarbonyl group containing from 1 to 8 carbon atoms, a carboxyl group, a halogen atom, a hydroxyl group, a cyano group, and an acid-decomposable group. More preferred are an alkyl group containing from 1 to 4 carbon atoms, a cyano group, and an acid-decomposable group. $n_2$ represents an integer of from 0 to 4. When $n_2$ represents 2 or more, plural $Rb_2$s may be the same or different, and plural $Rb_2$s may be connected to each other to form a ring.

As a repeating unit having the lactone structure represented by any one of the general formulae (LC1-2) to (LC1-16), there can be illustrated those repeating units which are represented by the following general formula (AI).

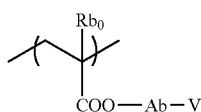

(AI)

In the general formula (AI), $R_{b0}$ represents a hydrogen atom, a halogen atom or an alkyl group containing from 1 to 4 alkyl group. Examples of substituents which an alkyl group of $R_{b0}$ may have include a hydroxyl group and a halogen atom.

Examples of a halogen atom of $R_{b0}$ include a fluorine atom, a chlorine atom, a bromine atom, and an iodine atom. $R_{b0}$ is preferably a hydrogen atom or a methyl group.

$A_b$ represents a single bond, an alkylene group, a divalent linking group having a monocyclic or polycyclic alicyclic hydrocarbon structure, an ether group, an ester group, a carbonyl group, or a divalent linking group comprising a combination of these, and preferably represents a single bond or a divalent linking group represented by $-Ab_1-CO_2-$, wherein $Ab_1$ represents a straight or branched alkylene group or a monocyclic or polycyclic cycloalkylene group, preferably a methylene group, an ethylene group, a cyclohexylene group, an adamantylene group or a norbornylene group.

V represents a group having a structure shown by any one of the general formulae (LC1-1) to (LC1-16).

Usually, optical isomers exist for the repeating units having a lactone structure, and any of the optical isomers may be used. Also, the optical isomers may be used alone or as a mixture of plural optical isomers. In the case of mainly using one optical isomer, optical isomers having an optical purity (ee) of 90 or more are preferred, with an optical purity of 95 or more being more preferred.

The content of the repeating unit having a lactone structure is preferably from 15 to 60 mol %, more preferably from 20 to 50 mol %, still more preferably from 30 to 50 mol %, based on all the repeating units in the polymer.

Specific examples of the repeating units having a lactone structure are illustrated below which, however, are not to be construed to limit the invention.

(In the following formulae, Rx represents H, $CH_3$, $CH_2OH$ or $CF_3$.)

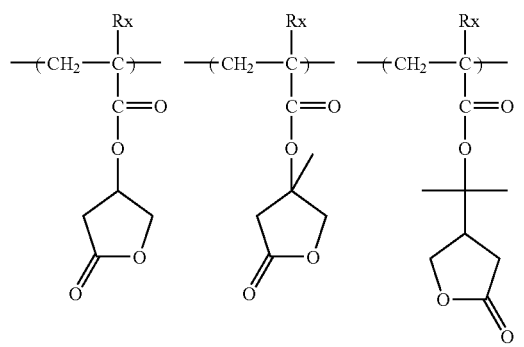

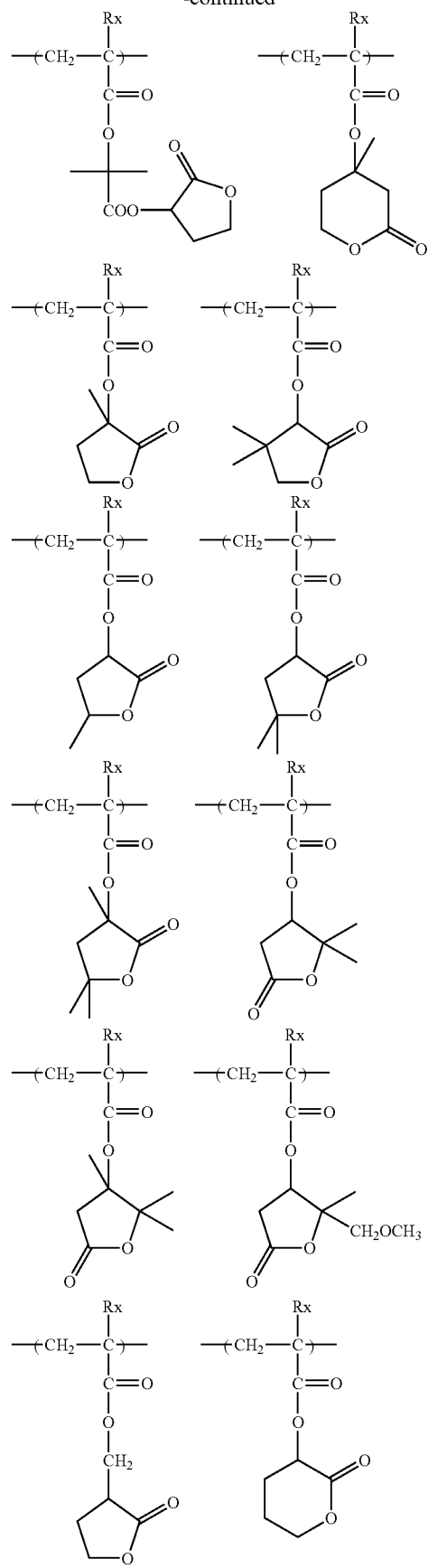

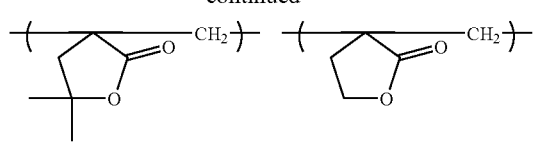
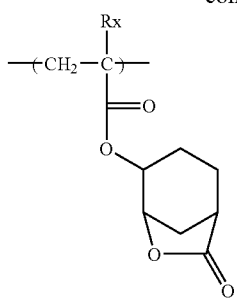
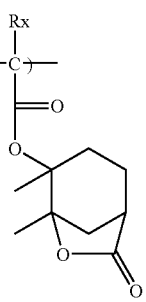
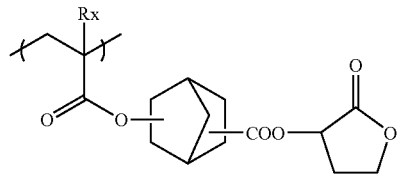
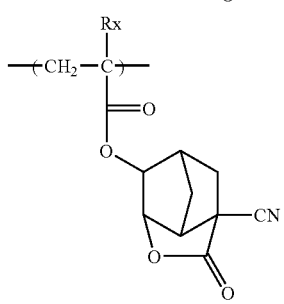
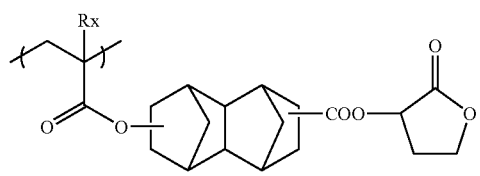
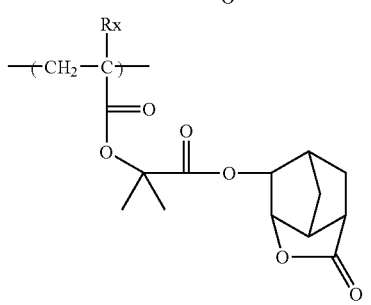
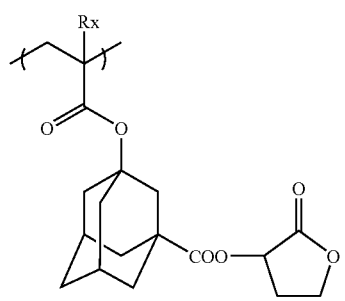
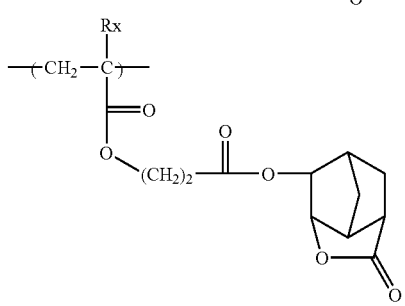
(In the following formulae, Rx represents H, CH$_3$, CH$_2$OH or CF$_3$.)
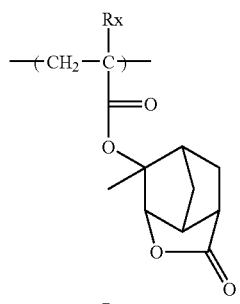
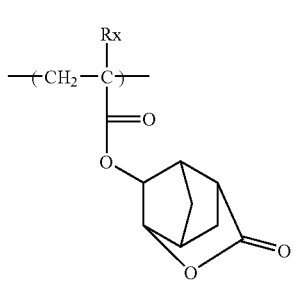
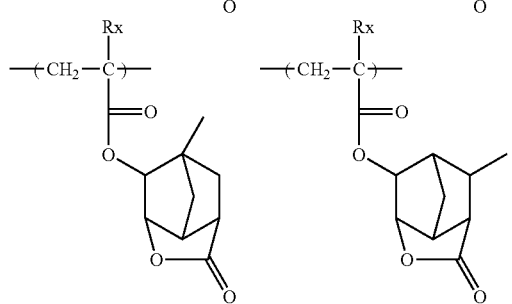
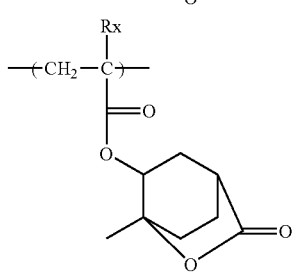

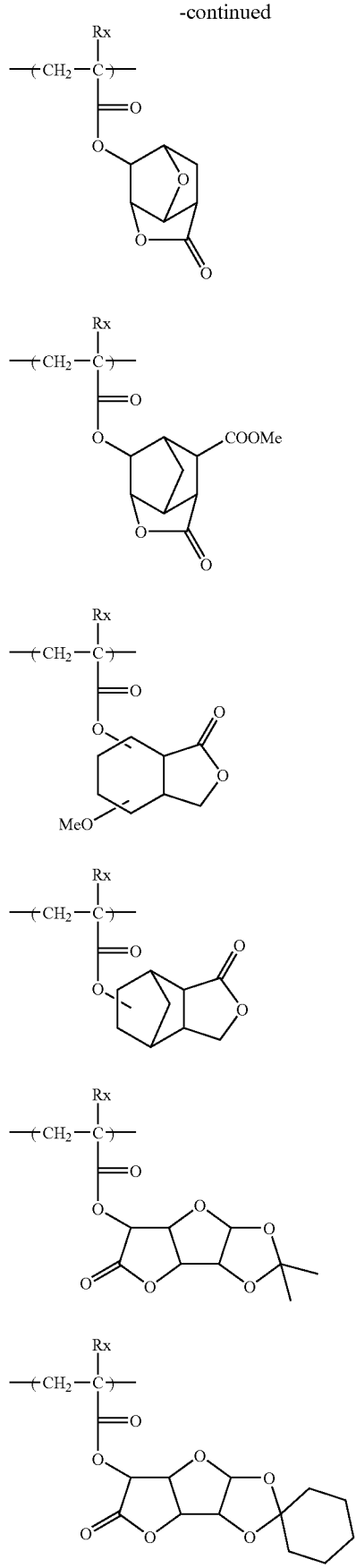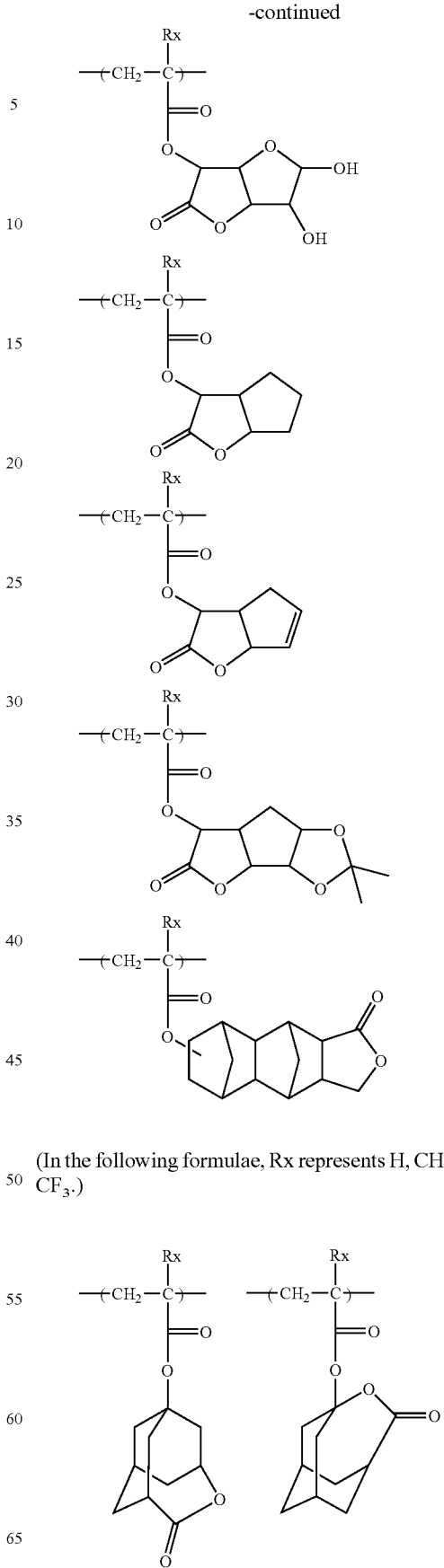
(In the following formulae, Rx represents H, CH$_3$, CH$_2$OH or CF$_3$.)

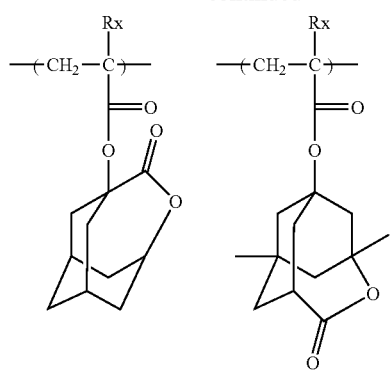
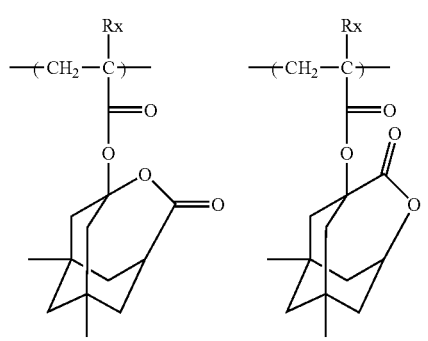
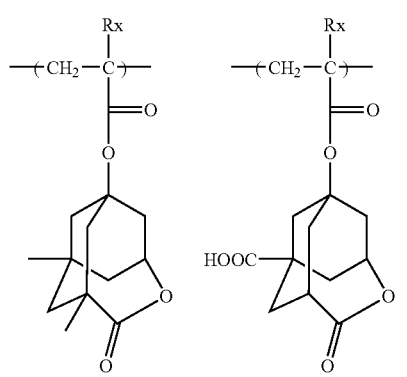
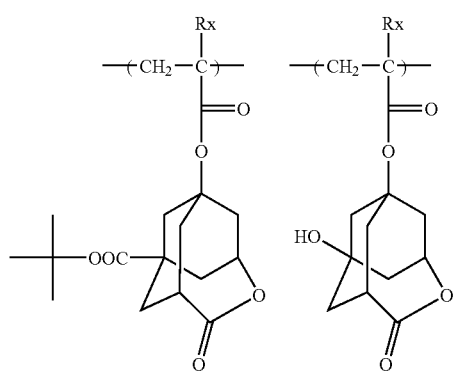
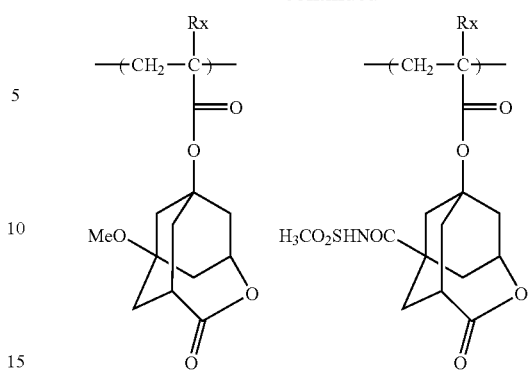
As particularly preferred repeating units having a lactone structure other than (a1-1) and (a1-2) described above, there are illustrated the following repeating units. Selection of an optimal lactone structure serves to provide good pattern profile and good pitch dependency.
(In the following formulae, Rx represents H, $CH_3$, $CH_2OH$ or $CF_3$.)
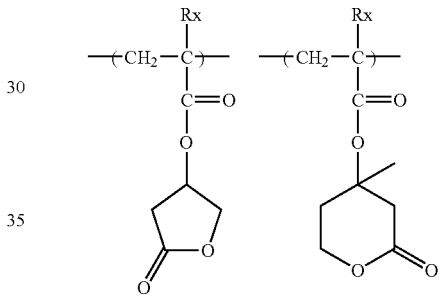
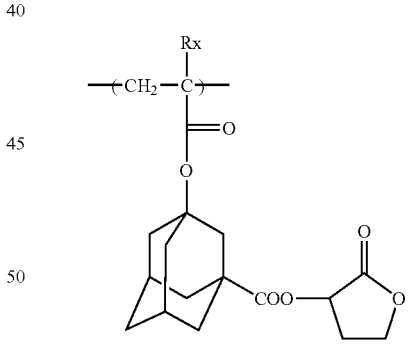
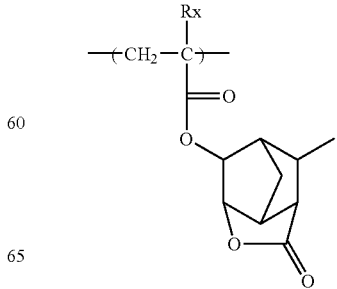

-continued

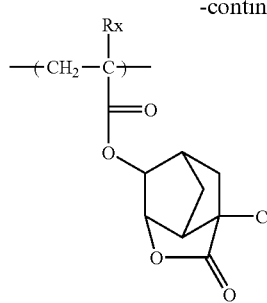
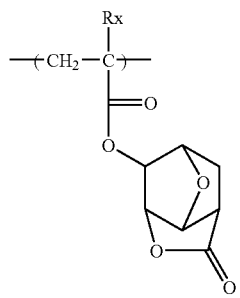
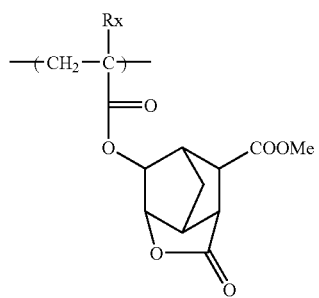
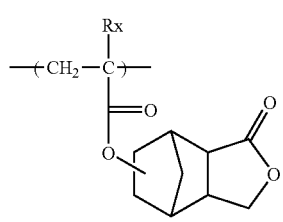
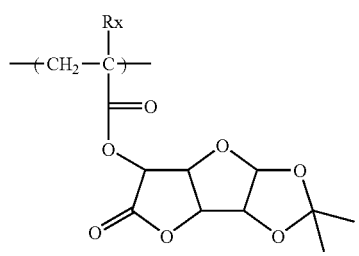
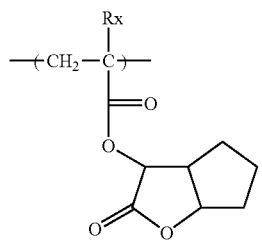

The resin of component (A) may have a repeating unit having a hydroxyl group or a cyano group.

This repeating unit serves to improve adhesion to a substrate and affinity for a developer. The repeating unit having a hydroxyl group or a cyano group is preferably a repeating unit having an alicyclic hydrocarbon structure substituted by a hydroxyl group or a cyano group. As the alicyclic hydrocarbon structure in the alicyclic hydrocarbon structure substituted by a hydroxyl group or a cyano group, an adamantyl group, a diamantyl group, and a norbornane group are preferred. As the alicyclic hydrocarbon structure substituted by a hydroxyl group or a cyano group, those partial structures are preferred which are represented by the following general formulae (VIIa) to (VIId).

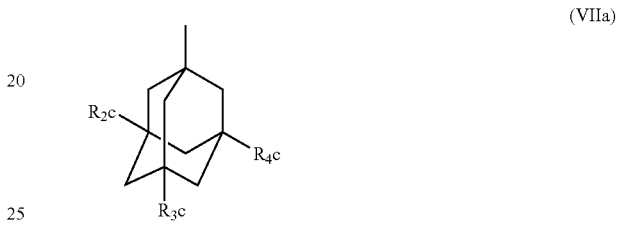
(VIIa)

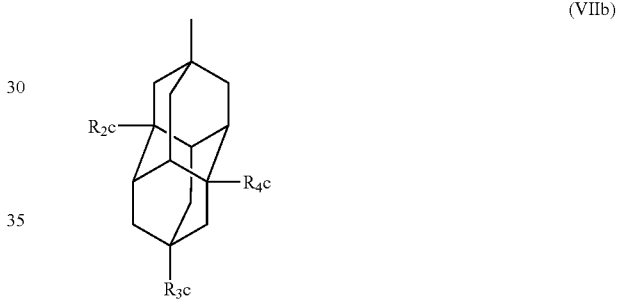
(VIIb)

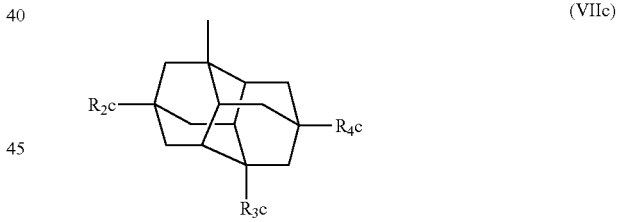
(VIIc)

(VIId)

In the general formulae (VIIa) to (VIIc), $R_2c$ to $R_4c$ each independently represents a hydrogen atom, a hydroxyl group or a cyano group, provided that at least one of $R_2c$ to $R_4c$ represents a hydroxyl group or a cyano group. Preferably, one or two of $R_2c$ to $R_4c$ are a hydroxyl group, the rest being a hydrogen atom. Still more preferably, in the general formula (VIIa), two of $R_2c$ to $R_4c$ are a hydroxyl group, the rest being a hydrogen atom.

As a repeating unit having the partial structure represented by the general formulae (VIIa) to (VIId), there can be illustrated those repeating units which are represented by the following general formulae (AIIa) to (AIId).

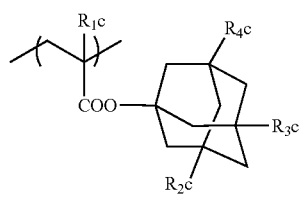
(AIIa)

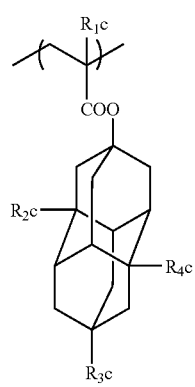
(AIIb)

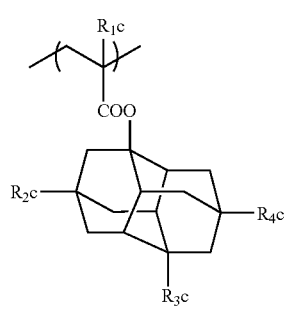
(AIIc)

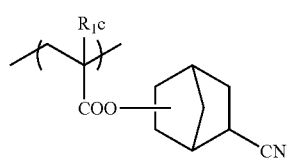
(AIId)

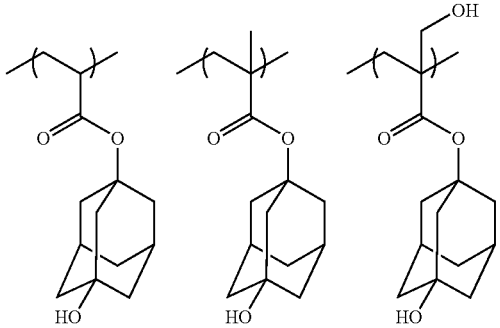

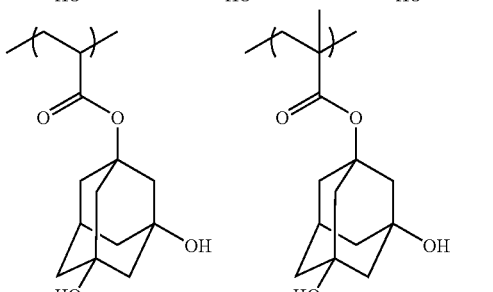

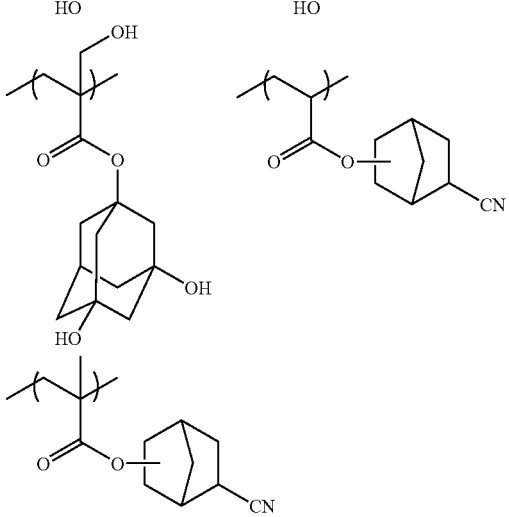

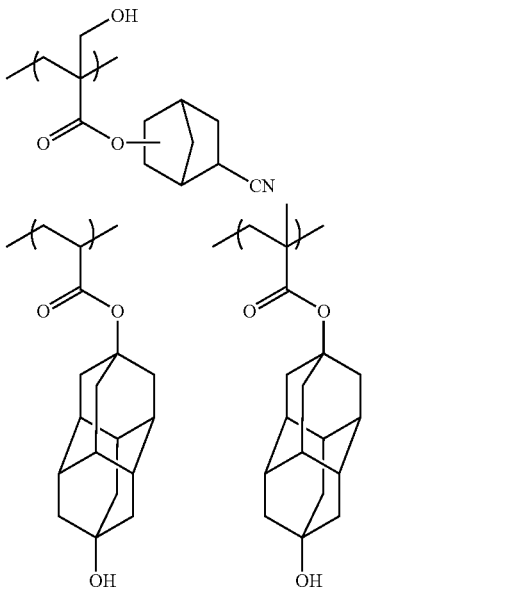

In the general formulae (AIIa) to (AIId), $R_1c$ represents a hydrogen atom, a methyl group, a trifluoromethyl group or a hydroxymethyl group. $R_2c$ to $R_4c$ are the same as $R_2c$ to $R_4c$ in the general formulae (VIIa) to (VIIc).

The content of the repeating unit having an alicyclic hydrocarbon structure substituted by a hydroxyl group or a cyano group is preferably from 5 to 40 mol %, more preferably from 5 to 30 mol %, still more preferably from 10 to 25 mol %, based on all the repeating units in the polymer.

Specific examples of the repeating unit having a hydroxyl group or a cyano group are illustrated below which, however, are not to be construed to limit the invention in any way.

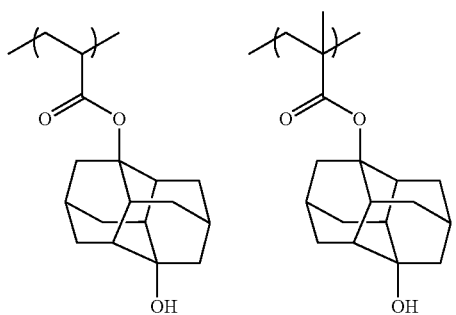

The resin of component (A) may contain a repeating unit having an alkali-soluble group. Examples of the alkali-soluble group include a carboxyl group, a sulfonamide group, an sulfonylimide group, a bisulfonylmide group, and an aliphatic alcohol substituted by an electron attractive group at the α-position thereof (e.g., a hexafluoroisopropanol group), with a repeating unit having a carboxyl group being more preferred. Owing to the presence of the repeating unit having an alkali-soluble group, the resolution can be improved when used in a contact hole. As preferred examples of the repeating unit having an alkali-soluble group, there can be illustrated any one of a repeating unit wherein an alkali-soluble group is directly attached to the main chain of a resin such as a repeating unit of acrylic acid or methacrylic acid, a repeating unit wherein an alkali-soluble group is attached to the main chain of a resin via a linking group, and a repeating unit at the terminus of a polymer chain into which an alkali-soluble group has been introduced in the course of polymerization by using a polymerization initiator or a chain transfer agent having an alkali-soluble group. The linking group may have a monocyclic or polycyclic hydrocarbon structure. A repeating unit comprising acrylic acid or methacrylic acid is particularly preferred.

The content of the repeating unit having an alkali-soluble group is preferably from 1 to 20 mol %, more preferably from 3 to 15 mol %, still more preferably from 5 to 10 mol %, based on all the repeating units in the polymer.

Specific examples of the repeating unit having an alkali-soluble group will be shown below which, however, are not to be construed to limit the invention in any way.

(In the following formulae, $R^x$ represents H, $CH_3$, $CF_3$ or $CH_2OH$.)

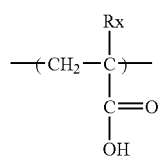
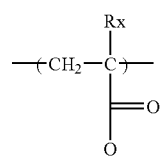
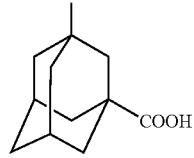

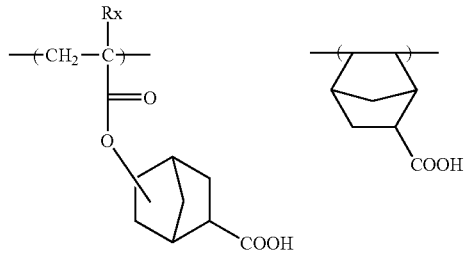
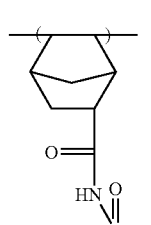
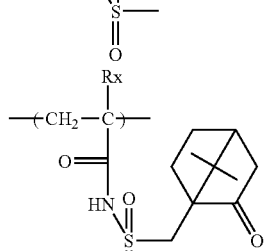
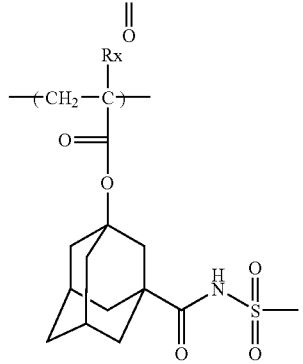
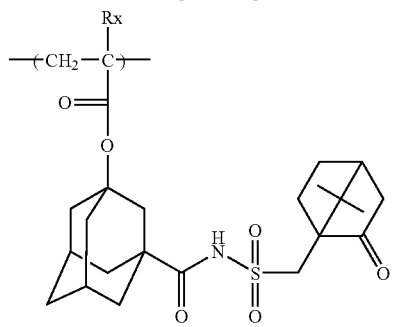
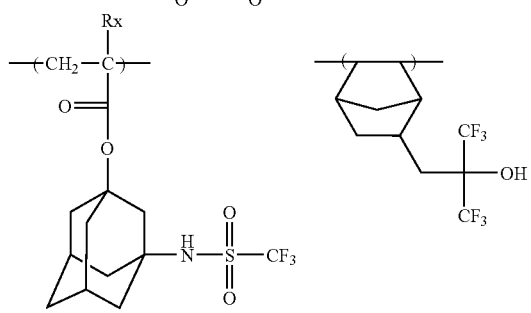
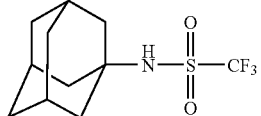

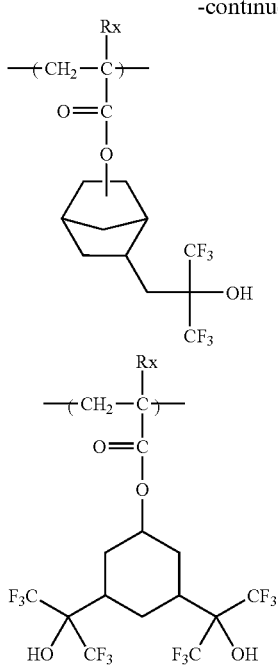

The repeating unit containing at least one group selected from among a lactone group, a hydroxyl group, a cyano group, and an alkali-soluble group is more preferably a repeating unit having at least two groups selected from among a lactone group, a hydroxyl group, a cyano group, and an alkali-soluble group, still more preferably a repeating unit having a cyano group and a lactone group and, particularly preferably, a repeating unit having a structure of the lactone structure of LCI-4 substituted by a cyano group.

The resin of component (A) may further have a repeating unit which has an alicyclic hydrocarbon structure but does not exhibit acid-decomposable properties. Thus, the elution of low-molecular components from a resist film into an immersion liquid can be prevented during immersion exposure. As examples of such a repeating unit, there can be illustrated 1-adamantyl(meth)acrylate, diamantyl(meth)acrylate, tricyclodecanyl (meth)acrylate, and cyclohexyl(meth)acrylate.

In addition to the repeating structural units described above, the resin (A) of the invention may contain various repeating structural units in order to control resistance to dry etching, suitability for a standard developer, adhesiveness to a substrate, resist profile and other characteristics generally required for resists (for example, resolution, heat resistance and sensitivity).

As examples of these repeating structural units, there can be illustrated repeating structural units corresponding to the following monomers. However, the invention is not restricted thereto.

Thus, it becomes possible to finely control characteristics required for the resin (A), in particular, (1) Solubility in a coating solvent, (2) film-forming properties (glass transition point), (3) alkali-development properties, (4) film loss (selection of a hydrophilic/hydrophobic and alkali-soluble group), (5) adhesiveness to non-exposed areas, and (6) dry etching resistance.

As examples of such monomers, there can be illustrated a compound having one addition-polymerizable unsaturated bond selected from among acrylic esters, methacrylic esters, acrylamides, methacrylamides, allyl compounds, vinyl ethers, and vinyl esters.

Further, an addition-polymerizable unsaturated compound copolymerizable with a monomer having a varying repeating structural unit described above may be copolymerized so long as it can be copolymerized with the monomer.

In the resin (A), the molar ratio of each repeating structural unit may be appropriately determined so as to control the dry etching resistance, suitability for a standard developer of the resist, adhesiveness of the resist to a substrate, the resist profile and other characteristics generally required for resists, for example, resolution, heat resistance, and sensitivity.

When the composition of the invention is to be used for ArF exposure, the resin preferably does not contain any aromatic groups in view of transparency for ArF light.

As the resin (A) to be used in the invention, one wherein all of the repeating units consist of (meth)acrylate repeating units is preferred. In this case, use can be made of any of one wherein all of the repeating units consist of methacrylate, one wherein all of the repeating units consist of acrylate, and one wherein all of the repeating units consist of acrylate/(meth)acrylate mixture, though it is preferred to use one wherein the content of acrylate repeating units is 50 mol % or less based on all the repeating units.

The resin (A) to be used in the invention can be synthesized in accordance with a conventional process (for example, radical polymerization). As examples of the synthesis process commonly employed, there can be illustrated a bulk polymerization process which comprises dissolving monomer species and an initiator in a solvent and heating to thereby conduct polymerization and a drop polymerization process which comprises dropping a solution of monomer species and an initiator to a heated solvent over 1 to 10 hours. The drop polymerization process is preferred. Examples of the reaction solvent include ethers such as tetrahydrofuran, 1,4-dioxane, and diisopropyl ether; ketones such as methyl ethyl ketone and methyl isobutyl ketone; ester solvents such as ethyl acetate; amide solvents such as dimethylformamide and dimethylacetamide; and solvents capable of dissolving the composition of the invention such as propylene glycol monomethyl ether acetate, propylene glycol monomethyl ether, and cyclohexanone, which will be described hereinafter. It is more preferred to conduct polymerization by using the same solvent as that to be used in the resist composition of the invention. Thus, generation of particles during storage can be suppressed.

The polymerization reaction is preferably conducted in an atmosphere of an inert gas such as nitrogen or argon. The polymerization is initiated by using a commercially available radical initiator (e.g., an azo series initiator or a peroxide) as a polymerization initiator. As the radical initiator, azo series initiators are preferred, and azo series initiators having an ester group, a cyano group or a carboxyl group are more preferred. Preferred examples of the initiator include azobisisobutyronitrile, azobisdimethylvaleronitrile, and dimethyl 2,2'-azobis(2-methylpropionate). If desired, the initiator may be additionally added or may be added in portions. After completion of the reaction, the reaction solution is introduced into a solvent, and thus the desired polymer is collected as a powder or a solid. The reaction concentration is from 5 to 50% by weight, preferably from 10 to 30% by weight.

The reaction temperature is usually from 10° C. to 150° C., preferably from 30° C. to 120° C., more preferably from 50° C. to 100° C.

In the resin (A), the content of a repeating unit represented by the general formula (a1) is preferably from 25 to 70 mol %, more preferably from 35 to 65 mol %, still more preferably from 40 to 60 mol %, based on all the repeating structural units.

In the resin (A), the content of a repeating unit represented by the general formulae (a1-1) to (a1-2) is preferably from 10 to 70 mol %, more preferably from 15 to 65 mol %, still more preferably from 25 to 60 mol %, based on all the repeating structural units.

In the resin (A), the content of a repeating unit represented by the general formula (a2) is preferably from 10 to 70 mol %, more preferably from 15 to 65 mol %, still more preferably from 25 to 60 mol %, based on all the repeating structural units.

The polymer or copolymer to be used in the invention has a weight-average molecular weight of preferably from 1,500 to 100,000, more preferably from 2,000 to 70,000, particularly from 3,000 to 50,000.

In the invention, the addition amount of the resin (A) to the positive resist composition is from 50 to 99.7% by weight, preferably from 70 to 99.5% by weight, based on the weight of all the solid components. Also, in addition to the resin in the invention, other resins can be used as needed. In the composition of the invention, the other resins can be blended in an amount of 70 parts by weight or less, particularly preferably 50 parts by weight or less, per 100 parts by weight of the resin (A). In addition, in the invention, the resins of component (A) may be used alone or in combination of two or more thereof.

(B) Compound Generating an Acid Upon Irradiation with an Actinic Ray or a Radiation The positive resist composition of the invention contains a compound capable of generating an acid upon being irradiated with an actinic ray or a radiation (hereinafter also referred to as "component (B) or compound (B)").

As the photo acid-generating agents, appropriate one can be selected from photo initiators for photo cationic polymerization, photo initiators for photo radical polymerization, photo decoloring agents for coloring matters, photo discoloring agents, known compounds capable of generating an acid upon being irradiated with an actinic ray or a radiation, which are used for microresist or the like, and mixtures thereof.

Examples thereof include diazonium salts, phosphonium salts, sulfonium salts, iodonium salts, imidosulfonates, oximesulfonates, diazodisulfones, disulfones and o-nitrobenzyl sulfonates.

Also, compounds wherein the above-described group or compound capable of generating an acid upon irradiation with an actinic ray or a radiation is introduced into the main chain or side chain of polymer may be used, and examples thereof include the compounds described in U.S. Pat. No. 3,849,137, German Patent 3,914,407, JP-A-63-26653, JP-A-55-164824, JP-A-62-69263, JP-A-63-146038, JP-A-63-163452, JP-A-62-153853, and JP-A-63-146029.

Further, compounds capable of generating an acid by light described in U.S. Pat. No. 3,779,778 and European Patent 126,712 may also be used.

Component (B) is preferably a compound capable of generating an acid having a fluoroalkyl chain (containing preferably from 2 to 4 carbon atoms) or generating a benzenesulfonic acid having a fluorine atom upon irradiation with an actinic ray.

Also, component (B) is preferably a triphenylsulfonium salt compound having in the cation moiety an alkyl residue (containing preferably from 1 to 15 carbon atoms) not substituted by fluorine or a cycloalkyl residue (containing preferably from 3 to 15 carbon atoms) not substituted by fluorine.

As preferred examples of the compound capable of being decomposed to generate an acid upon irradiation with an actinic ray or a radiation, those compounds can be illustrated each of which is represented by the following general formula (ZI), (ZII) or (ZIII).

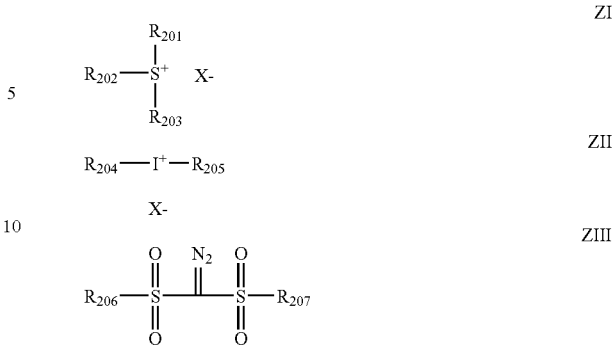

In the above general formula (ZI), $R_{201}$, $R_{202}$, and $R_{203}$ each independently represents an organic group.

$X^-$ represents a non-nucleophilic anion. Preferred examples thereof include a sulfonate anion, a carboxylate anion, a bis(alkylsulfonyl)amide anion, a tris(alkylsulfonyl) methide anion, $BF_4^-$, $PF_6^-$, and $SbF_6^-$, with an organic anion containing carbon atoms being preferred.

As more preferred organic anions, there are illustrated organic anions shown by the following formula.

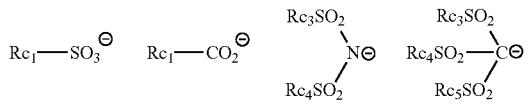

In the above formula, $Rc_1$ represents an organic group. Examples of an organic group in $Rc_1$ include those which contain from 1 to 30 carbon atoms, and preferred examples thereof include an optionally substituted alkyl group, an optionally substituted aryl group, and those wherein a plurality of these are connected to each other through a linking group such as a single bond, —O—, —$CO_2$—, —S—, —$SO_3$— or —$SO_2N(Rd_1)$—, wherein $Rd_1$ represents a hydrogen atom or an alkyl group.

$Rc_3$, $Rc_4$, and $Rc_5$ each represents an organic group. As organic groups of $Rc_3$, $Rc_4$, and $Rc_5$ there can be illustrated the same preferred organic groups of $Rb_1$, most preferably a perfluoroalkyl group containing from 1 to 4 carbon atoms.

$Rc_3$ and $Rc_4$ may be connected to each other to form a ring. Examples of a group formed by $Rc_3$ and $Rc_4$ connected to each other include an alkylene group and an arylene group, with a perfluoroalkylene group containing from 2 to 4 carbon atoms being preferred. As the organic group represented by $Rc_1$ or one of $Rc_3$ to $Rc_5$, an alkyl group substituted at 1-position by a fluorine atom or by a fluoroalkyl group, and a phenyl group substituted by a fluorine atom or a fluoroalkyl group are most preferred. Presence of a fluorine atom or a fluoroalkyl group serves to enhance acidity of an acid to be generated by irradiation with light, thus sensitivity being improved. Also, formation of a ring by $Rc_3$ and $Rc_4$ connected to each other serves to enhance acidity of an acid to be generated by irradiation with light, thus sensitivity being improved.

The organic group for $R_{201}$, $R_{202}$, and $R_{203}$ generally contains from 1 to 30 carbon atoms, preferably from 1 to 20 carbon atoms.

Two of $R_{201}$ to $R_{203}$ may be connected to each other to form a ring structure, and the ring may contain oxygen atom, sulfur atom, ester bond, amido bond or carbonyl group.

Examples of the group formed by two of $R_{201}$ to $R_{203}$ connected to each other include alkylene groups (e.g., a butylenes group and a pentylene group).

Specific examples of the organic group for $R_{201}$, $R_{202}$, and $R_{203}$ include corresponding groups in compounds (Z1-1), (Z1-2) and (Z1-3) to be described hereinafter.

Compounds having plural structures represented by the general formula (ZI) may also be used. For example, compounds having a structure wherein at least one of $R_{201}$ to $R_{203}$ of one compound represented by the general formula (ZI) is connected to at least one of $R_{201}$ to $R_{203}$ of another compound represented by the general formula (ZI) may be used.

As more preferred examples of the (ZI) component, there can be illustrated compounds (Z1-1), (Z1-2) and (Z1-3) to be described hereinafter.

Compounds (Z1-1) are arylsulfonium compounds wherein at least one of $R_{201}$ to $R_{203}$ of the general formula (ZI) is an aryl group, i.e., compounds which have an arylsulfonium as cation.

With the arylsuofonium compounds, all of $R_{201}$ to $R_{203}$ may be an aryl group, or part of $R_{201}$ to $R_{203}$ may be an aryl group, with the rest being an alkyl group or a cycloalkyl group.

Examples of the arylsulfonium compound include triarylsulfonium compounds, diarylalkylsulfonium compounds, and aryldialkylsulfonium compounds.

As the aryl group in the arylsulfonium compounds, an aryl group such as a phenyl group and a naphthyl group and a hetero aryl group such as anindole residue and a pyrrole residue are preferred, with a phenyl group and an indole residue being more preferred. In the case where the arylsuofonium compound contains two or more aryl groups, the two or more aryl groups may be the same or different.

As the alkyl group which the arylsulfonium compound has as needed, straight, branched or cyclic alkyl groups containing from 1 to 15 carbon atoms are preferred, and examples thereof include a methyl group, an ethyl group, a propyl group, a n-butyl group, a sec-butyl group, a t-butyl group, a cyclopropyl group, a cyclobutyl group, and a cyclohexyl group.

The aryl group and alkyl group of $R_{201}$ to $R_{203}$ may have a substituent such as an alkyl group (containing, for example, from 1 to 15 carbon atoms), an aryl group (containing, for example, from 6 to 14 carbon atoms), an alkoxy group (containing, for example, from 1 to 15 carbon atoms), a halogen atom, a hydroxyl group, or a phenylthio group. Preferred substituents are a straight, branched or cyclic alkyl group containing from 1 to 12 carbon atoms, and a straight, branched or cyclic alkoxy group containing from 1 to 12 carbon atoms, and the most preferred substituents are an alkyl group containing from 1 to 4 carbon atoms and an alkoxy group containing from 1 to 4 carbon atoms. The substituents may exist in one of the three groups of $R_{201}$ to $R_{203}$ or in all of the three groups. Also, in the case where $R_{201}$ to $R_{203}$ are aryl groups, the substituent preferably exists at the p-position of aryl group.

Next, compounds (Z1-2) will be explained.

Compounds (Z1-2) are compounds represented by formula (ZI) wherein $R_{201}$ to $R_{203}$ each independently represents an organic group containing no aromatic ring. The term "aromatic ring" as used herein means any of aromatic rings including aromatic rings containing one or more hetero atoms.

The organic groups containing no aromatic ring which are represented by $R_{201}$ to $R_{203}$ each contains generally from 1 to 30 carbon atoms, preferably from 1 to 20 carbon atoms.

Preferably, $R_{201}$ to $R_{203}$ each independently is an alkyl group, a 2-oxoalkyl group, an alkoxycarbonylmethyl group, an allyl group or a vinyl group. $R_{201}$ to $R_{203}$ each more preferably is a straight, branched, or cyclic 2-oxoalkyl group or an alkoxycarbonylmethyl group, and most preferably is a straight or branched 2-oxoalkyl group.

The alkyl group represented by $R_{201}$ to $R_{203}$ may be any of straight, branched and cyclic alkyl groups. Preferred examples thereof include straight or branched alkyl groups containing from 1 to 10 carbon atoms (e.g., a methyl group, an ethyl group, a propyl group, a butyl group, and a pentyl group) and cyclic alkyl groups containing from 3 to 10 carbon atoms (e.g., a cyclopentyl group, a cyclohexyl group, and a norbornyl group).

The 2-oxoalkyl groups represented by $R_{201}$ to $R_{203}$ may be any of straight, branched or cyclic. Preferred examples thereof include the alkyl groups illustrated above which each has $>C=O$ in the 2-position thereof.

Examples of the alkoxy group in the alkoxycarbonylmethyl group represented by $R_{201}$ to $R_{203}$ include alkoxy groups preferably containing from 1 to 5 carbon atoms (a methoxy group, an ethoxy group, a propoxy group, a butoxy group, and a pentoxy group).

$R_{201}$ to $R_{203}$ may further be substituted by a halogen atom, an alkoxy group (containing, for example, from 1 to 5 carbon atoms), a hydroxyl group, a cyano group, or a nitro group.

Two of $R_{201}$ to $R_{203}$ may be connected to each other to form a ring structure, and the ring may contain therein oxygen atom, sulfur atom, ester bond, amido bond or carbonyl bond. Examples of the group formed by two of $R_{201}$ to $R_{203}$ connected to each other include alkylene groups (e.g., a butylenes group and a pentylene group).

Compounds (Z1-3) are compounds represented by the following general formula (Z1-3) and are compounds having a phenacylsulfonium salt structure.

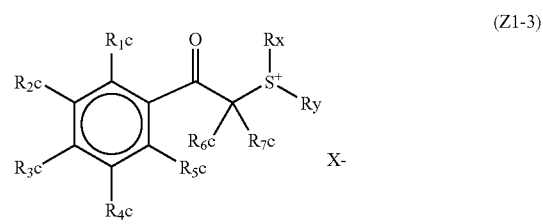

(Z1-3)

$R_{1c}$ to $R_{5c}$, each independently represents a hydrogen atom, an alkyl group, an alkoxy group or a halogen atom.

$R_{6c}$ and $R_{7c}$ each independently represents a hydrogen atom or an alkyl group.

$R_x$ and $R_y$ each independently represents an alkyl group, a 2-oxoalkyl group, an alkoxycarbonylmethyl group, an allyl group or a vinyl group.

Two or more of $R_{1c}$ to $R_{5c}$ may be connected to each other to form a ring structure, and $R_x$ and $R_y$ may be connected to each other to form a ring structure. These ring structures may contain an oxygen atom, a sulfur atom, an ester bond or an amide bond.

The alkyl group for $R_{1c}$ to $R_{5c}$ may be any of straight, branched and cyclic alkyl groups, and examples thereof include an alkyl group containing from 1 to 20 carbon atoms, preferably a straight or branched alkyl group containing from 1 to 12 carbon atoms (e.g., a methyl group, an ethyl group, a straight or branched propyl group, a straight or branched butyl group, or a straight or branched pentyl group), and a cyclic alkyl group containing from 3 to 8 carbon atoms (e.g., a cyclopentyl group or a cyclohexyl group).

The alkoxy group for $R_{1c}$ to $R_{5c}$ may be any of straight, branched and cyclic alkoxy groups, and examples thereof include an alkoxy group containing from 1 to 10 carbon atoms, preferably a straight or branched alkoxy group containing from 1 to 5 carbon atoms (e.g., a methoxy group, an ethoxy group, a straight or branched propoxy group, a straight or branched butoxy group, or a straight or branched pentoxy group), and a cyclic alkoxy group containing from 3 to 8 carbon atoms (e.g., a cyclopentyloxy group or a cyclohexyloxy group).

Preferably, any one of $R_{1c}$ to $R_{5c}$ is a straight, branched or cyclic alkyl group or a straight, branched or cyclic alkoxy group and, more preferably, the sum of the carbon atoms of R1c to R5c is from 2 to 15. Thus, dissolving properties in a solvent can be improved, and generation of particles during storage can be suppressed.

As the alkyl group for $R_x$ and $R_y$, there can be illustrated the same alkyl groups as for $R_{1c}$ to $R_{5c}$.

As the 2-oxoalkyl group, there can be illustrated those alkyl groups for $R_{1c}$ to $R_{5c}$ which have >C=O at the 2-position thereof.

The alkoxy group in the alkoxycarbonylmethyl group, there can be illustrated the same alkoxy groups for $R_{1c}$ to $R_{5c}$.

As the group formed by $R_x$ and $R_y$ connected to each other, there can be illustrated a butylene group and a pentylene group.

$R_x$ and $R_y$ each preferably represents an alkyl group containing 4 or more carbon atoms, more preferably represents an alkyl group containing 6 or more carbon atoms, and still more preferably represents an alkyl group containing 8 or more carbon atoms.

In the general formulae (ZII) and (ZIII), $R_{204}$ to $R_{207}$ each independently represents an aryl group which may have a substituent or an alkyl group which may have a substituent.

The aryl group represented by $R_{204}$ to $R_{207}$ is preferably a phenyl group or a naphthyl group, and more preferably a phenyl group.

The alkyl group represented by $R_{204}$ to $R_{207}$ may be any of straight, branched and cyclic alkyl groups, and preferred examples thereof include a straight or branched alkyl group containing from 1 to 10 carbon atoms (e.g., a methyl group, an ethyl group, a propyl group, a butyl group, and a pentyl group) and a cyclic alkyl group containing from 3 to 10 carbon atoms (e.g., a cyclopentyl group, a cyclohexyl group, and a norbornyl group).

Examples of the substituents which $R_{204}$ to $R_{207}$ may have include an alkyl group (containing, for example, from 1 to 15 carbon atoms), an aryl group (containing, for example, from 6 to 15 carbon atoms), an alkoxy group (containing, for example, from 1 to 15 carbon atoms), a halogen atom, a hydroxyl group, and a phenylthio group.

$X^-$ represents a non-nucleophilic anion, examples of which are the same as those of the non-nucleophilic anion $X^-$ in the general formula (I).

As preferred examples of the compounds which may be used together and which are decomposable upon irradiation with an actinic ray or a radiation to generate an acid, there can further be illustrated compounds represented by the following general formulae (ZIV), (ZV), and (ZVI).

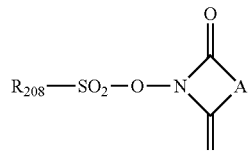
(ZIV)

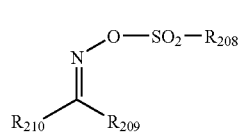
(ZV)

(ZVI)

In the general formulae (ZIV) to (ZVI), $Ar_3$ and $Ar_4$ each independently represents an aryl group.

$R_{208}$ represents an alkyl group or a substituted or unsubstituted aryl group.

$R_{209}$ and $R_{210}$ each independently represents an alkyl or aryl group, or an electron attractive group. $R_{209}$ is preferably an aryl group.

$R_{210}$ is preferably an electron attractive group, more preferably a cyano group or a fluoroalkyl group.

A represents an alkylene group, an alkenylene group or an arylene group.

Of the compounds which are decomposable upon irradiation with an actinic ray or a radiation to generate an acid, compounds represented by the general formulae (ZI) to (ZIII) are more preferred.

Of the compounds which are decomposable upon irradiation with an actinic ray or a radiation to generate an acid, particularly preferred examples are illustrated below.

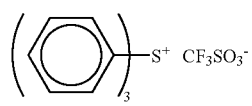
(z1)

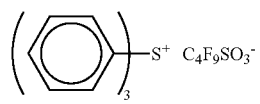
(z2)

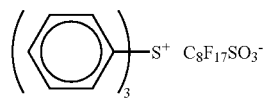
(z3)

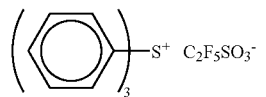
(z4)

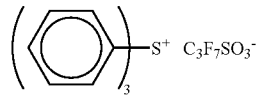
(z5)

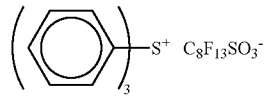
(z6)

-continued
(z7) 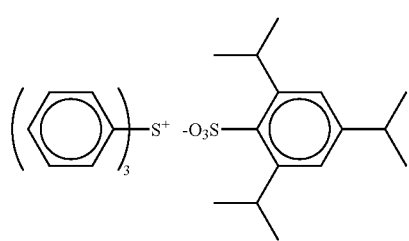
(z8) 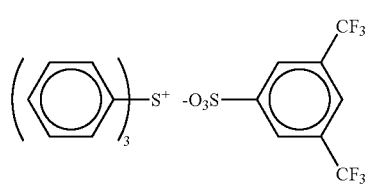
(z9) 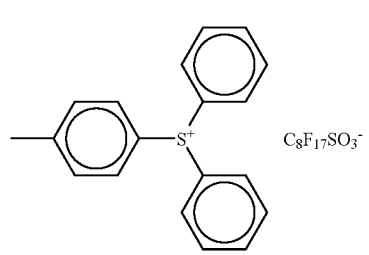
(z10) 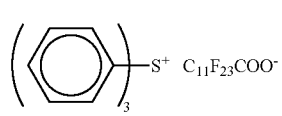
(z11) 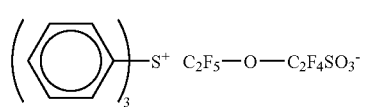
(z12) 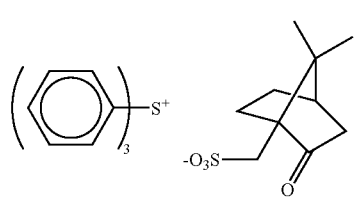
(z13) 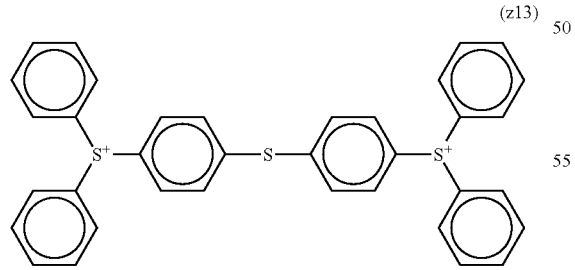
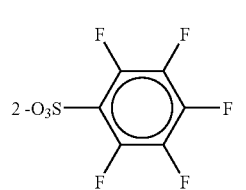
-continued
(z14) 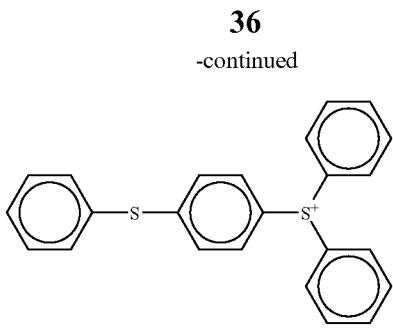
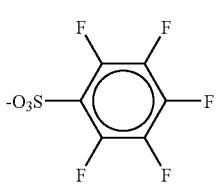
(z15) 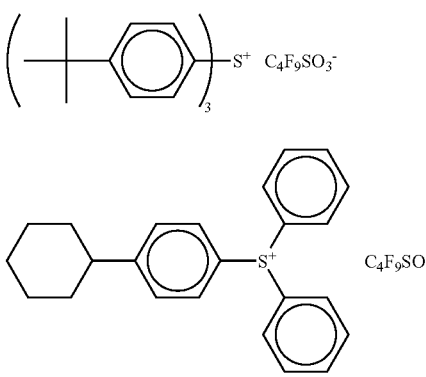
(z16) 
(z17) 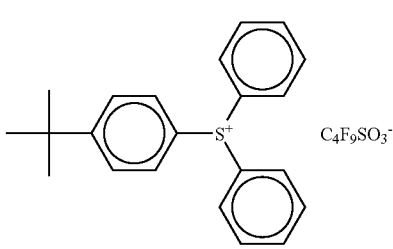
(z18) 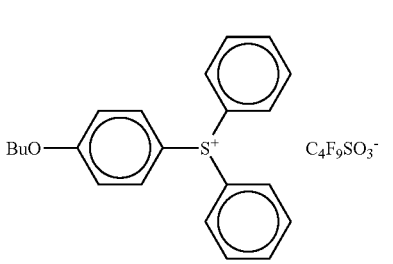
(z19) 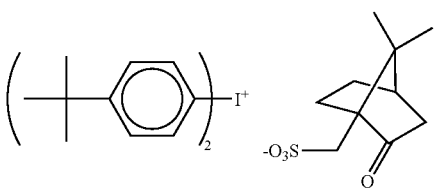
(z20) 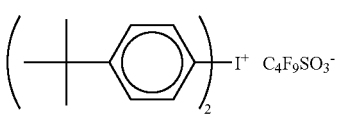

(z21) 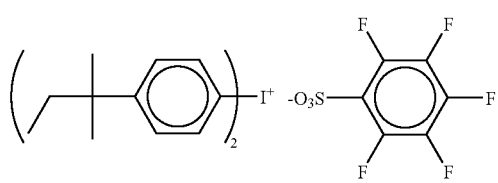
(z22) 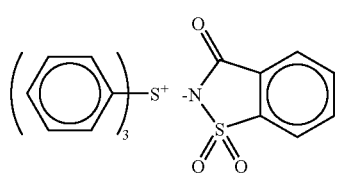
(z23) 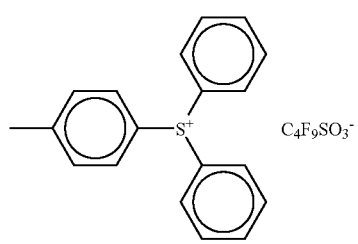
(z24) 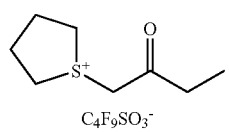
(z25) 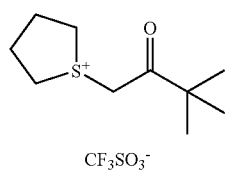
(z26) 
(z27) 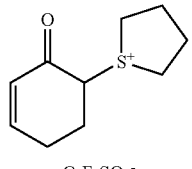
(z28) 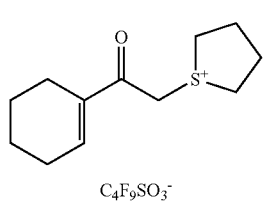
(z29) 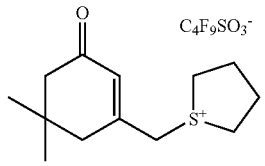
(z30) 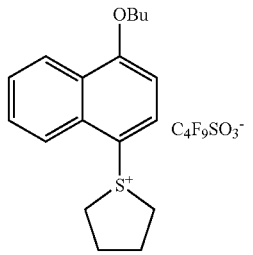
(z31) 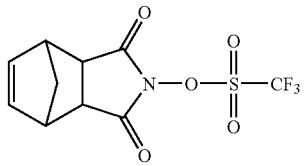
(z32) 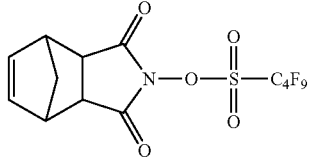
(z33) 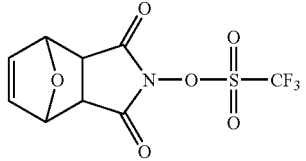
(z34) 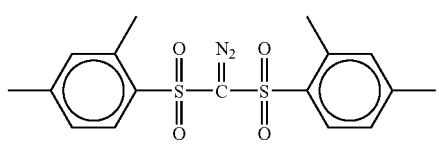
(z35) 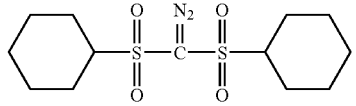
(z36) 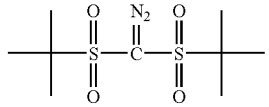
(z37) 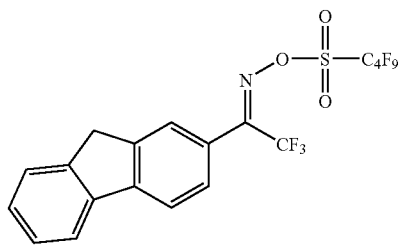

-continued
(z38)
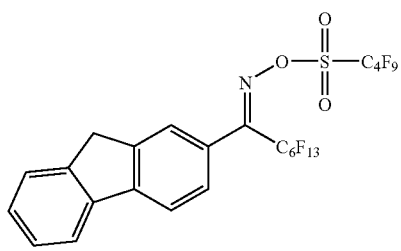
(z39)
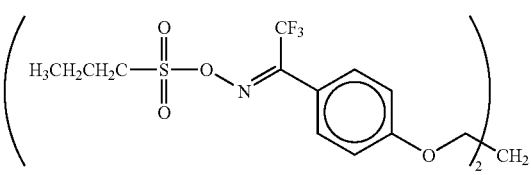
(z40)
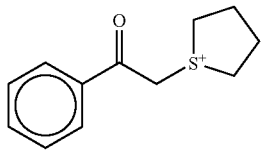
(z41)
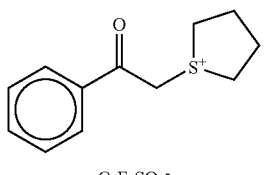
CF$_3$SO$_3^-$
(z42)
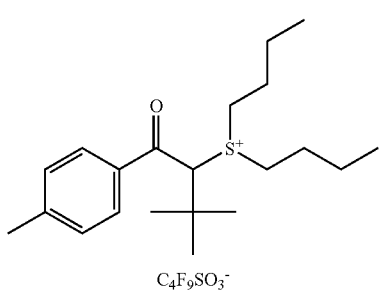
C$_4$F$_9$SO$_3^-$
(z43)
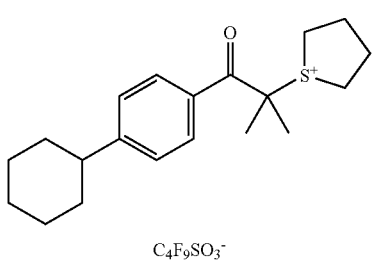
C$_4$F$_9$SO$_3^-$
(z44)
-continued
(z45)
(z46)
(z47)
(z48)
(z49)
(z50)
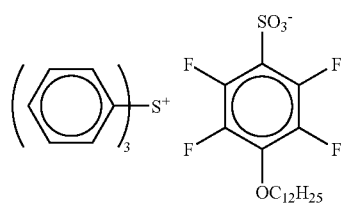
(z51)
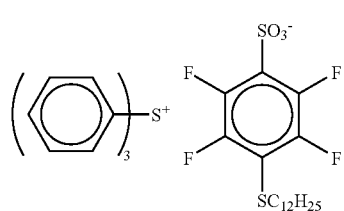

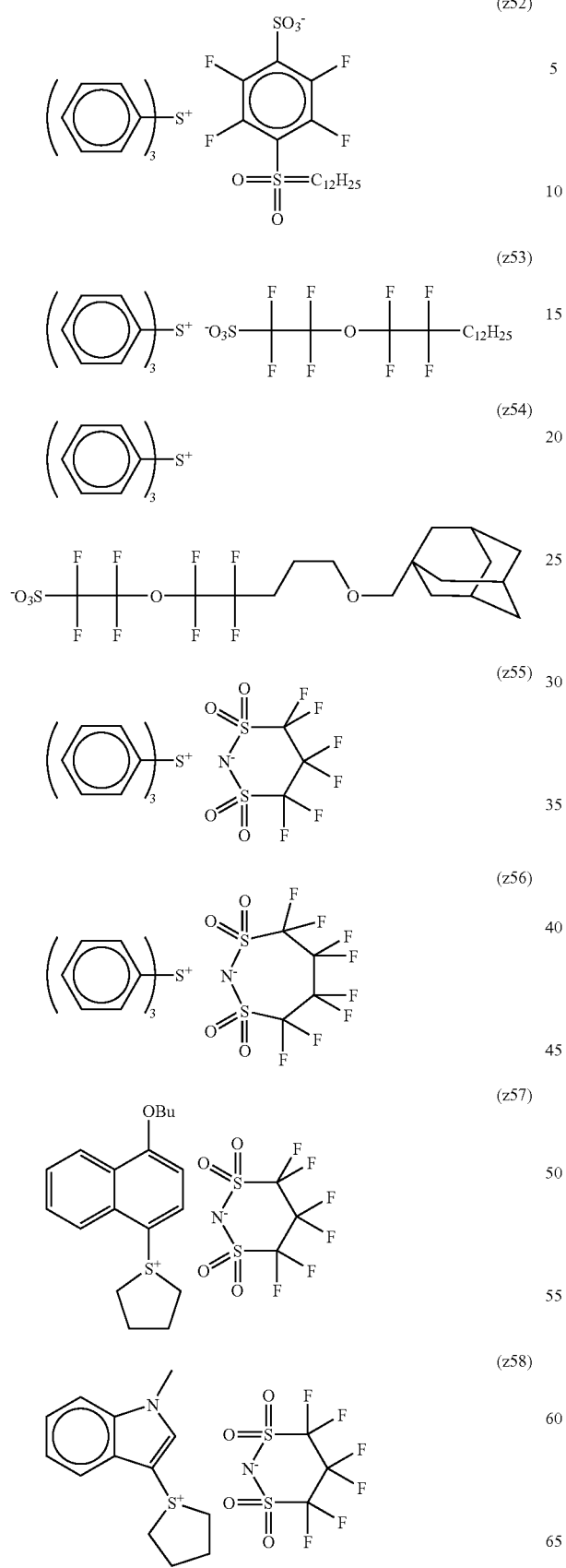
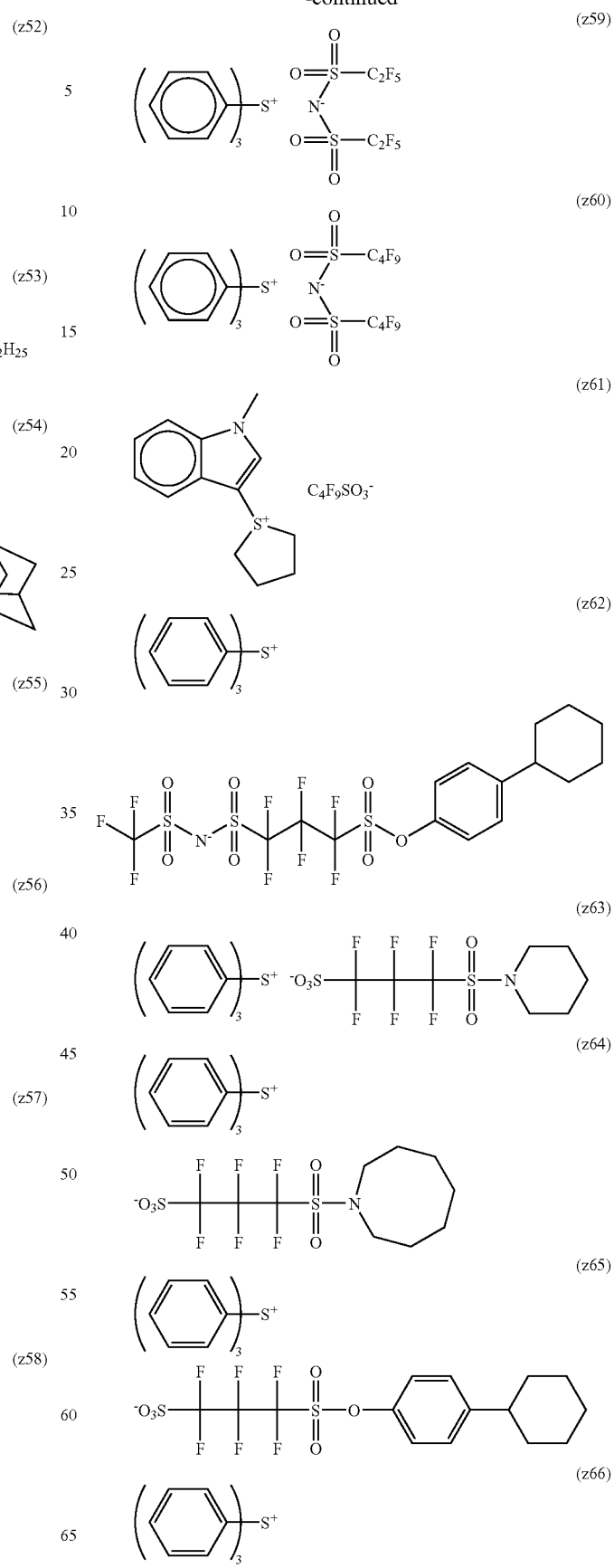

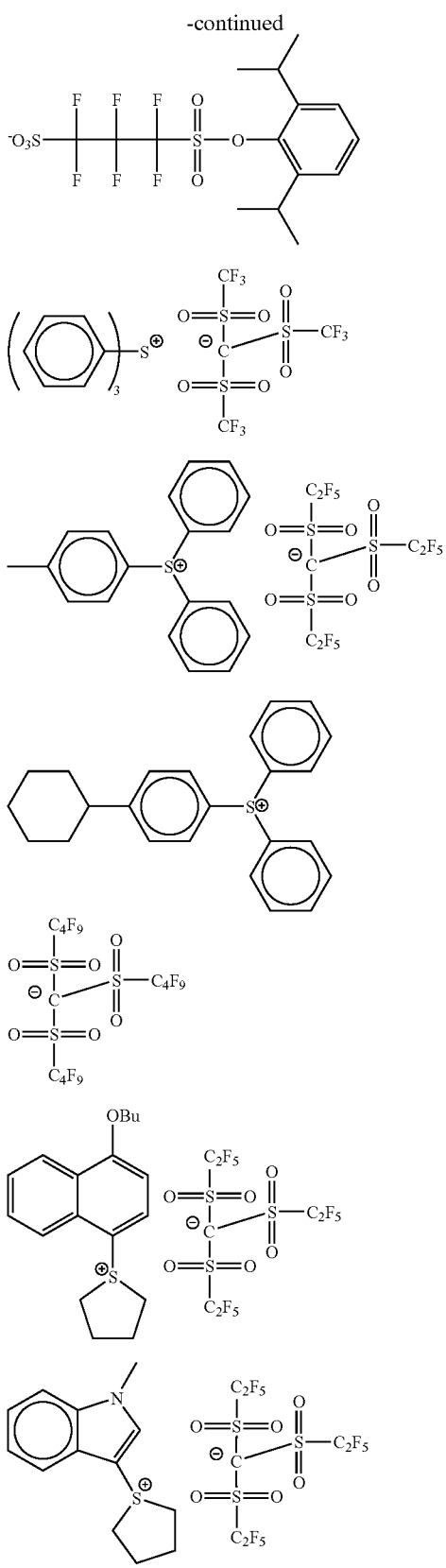

combination which generates two organic acids different from each other by 2 or more in the number of the total atoms excluding hydrogen atom. The content of the acid-generating agent in the composition is preferably from 0.1 to 20% by weight, more preferably from 0.5 to 10% by weight, still more preferably from 1 to 7% by weight, based on the weight of all the solid components of the resist composition.

(C) Fluorine- and/or Silicon Atom-Containing Resin

The resist composition of the invention contains a resin (also referred to as resin (C)) which contains fluorine atoms and/or silicon atoms and contains at least one group selected from the group consisting of the following (x) to (z):

(x) an alkali-soluble group;

(y) a group that decomposes by action of an alkali developer to undergo an increase in a solubility of the resin (C) in an alkali developer; and (z) a group that decomposes by action of an acid.

As the alkali-soluble group (x), there are illustrated a phenolic hydroxyl group, a carboxylic acid group, a fluorinated alcohol group, a sulfonic acid group, a sulfonamido group, a sulfonylimido group, an (alkylsulfonyl)(alkylcarbonyl)methylene group, an (alkylsulfonyl)(alkylcarbonyl)imido group, a bis(alkylcarbonyl)methylene group, a bis(alkylcarbonyl)imido group, a bis(alkylsulfonyl)methylene group, a bis(alkylsuolfonyl)imido group, a tris(alkylcarbonyl)methylene group, and a tris(alkylsuofonyl)methylene group.

Preferred alkali-soluble groups include a fluorinated alcohol group (preferably hexafluoroisopropanol), a sulfonimido group, and a bis(carbonyl)methylene group.

As preferred examples of the repeating unit having an alkali-soluble group (x), there can be illustrated any one of a repeating unit wherein an alkali-soluble group is directly attached to the main chain of a resin such as a repeating unit of acrylic acid or methacrylic acid, a repeating unit wherein an alkali-soluble group is attached to the main chain of a resin via a linking group, and a repeating unit at the terminus of a polymer chain into which an alkali-soluble group has been introduced in the course of polymerization by using a polymerization initiator or a chain transfer agent having an alkali-soluble group.

The content of the repeating unit having an alkali-soluble group (x) is preferably from 1 to 50 mol %, more preferably from 3 to 35 mol %, still more preferably from 5 to 20 mol %, based on all the repeating units in the polymer.

Specific examples of the repeating unit having an alkali-soluble group (x) will be illustrated below. In the following formulae, Rx represents H, $CH_3$, $CF_3$ or $CH_2OH$.

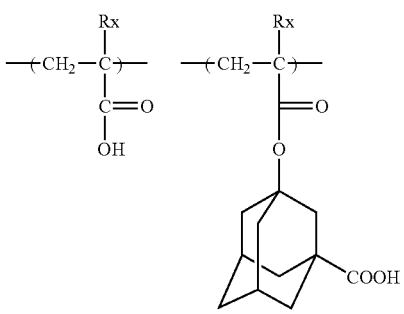

The acid-generating agents may be used alone or in combination of two or more thereof. In the case of using two or more of the agents in combination, it is preferred to select a

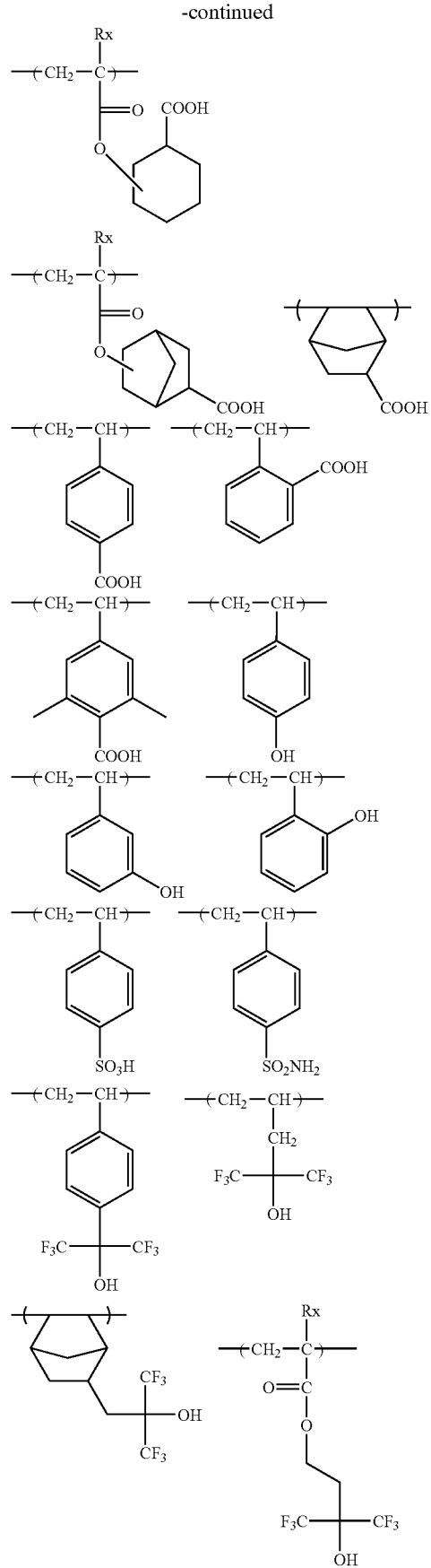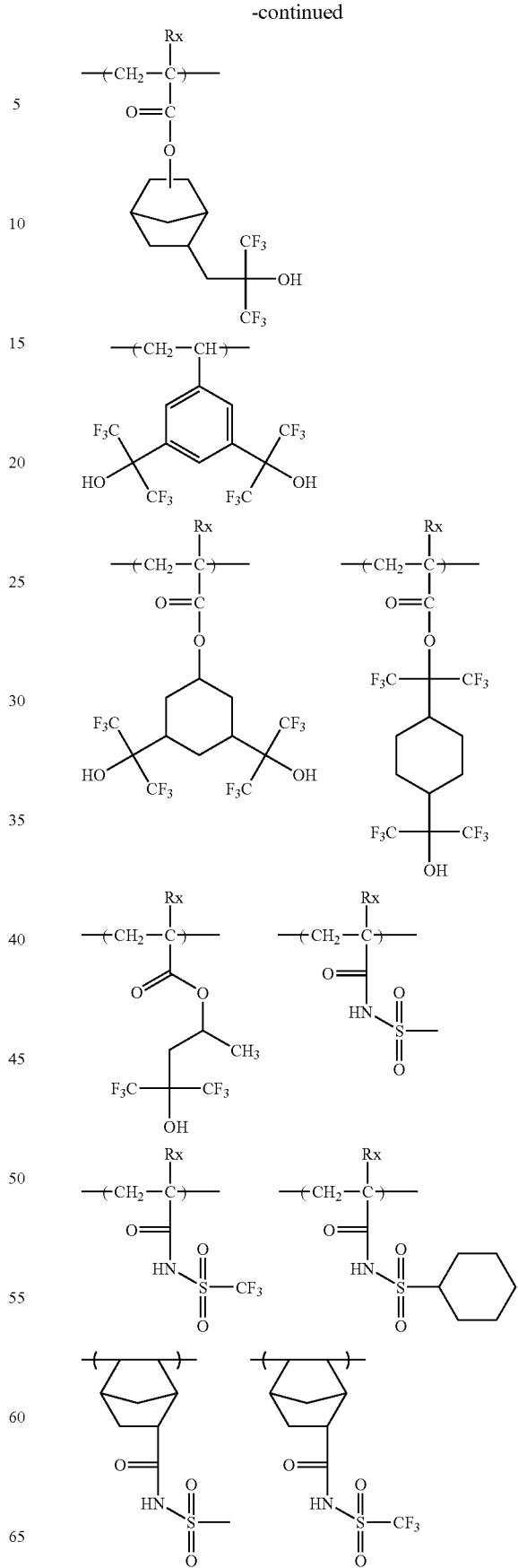

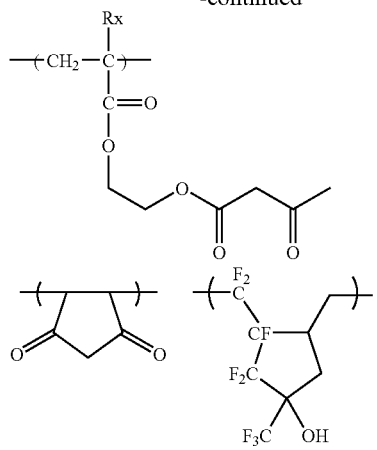

As the group (y) capable that decomposes by the action of an alkali developer to undergo an increase in solubility of the resin (C) in an alkali developer, there are illustrated, for example, a lactone structure-having group, an acid anhydride and an acid imide, with a lactone group being preferred.

As preferred examples of the repeating unit having a group (y) undergoing an increase in an alkali developer, there can be illustrated either of a repeating unit wherein an alkali-soluble group is attached via a linking group to the main chain of a resin such as a repeating unit of acrylic acid ester or methacrylic acid ester, and a repeating unit to be introduced at the terminus of a polymer chain by using, in the course of polymerization, a polymerization initiator or a chain transfer agent having the group (y) undergoing an increase in an alkali developer.

The content of the repeating unit having the group (y) undergoing an increase in an alkali developer is preferably from 1 to 40 mol %, more preferably from 3 to 30 mol %, still more preferably from 5 to 15 mol %, based on all the repeating units in the polymer.

As specific examples of the repeating unit having the group (y) undergoing an increase in an alkali developer, there can be illustrated the following lactone structures and structures represented by the general formula (VIII).

The resin (C) of the invention preferably has a group having a lactone ring. As a group having a lactone ring, any group that has a lactone ring can be used, but a group having a 5- to 7-membered lactone structure is preferred. Those wherein a 5- to 7-membered lactone structure is condenced with other ring structure in the form of a bicyclo structure or a spiro structure are preferred. More preferred are the groups having a lactone structure represented by any one of the following general formulae (LC1-1) to (LC1-16). The lactone group-having group may directly be attached to the main chain. Preferred lactone structures are (LC1-1), (LC1-4), (LC1-5), (LC1-6), (LC1-13), and (LC1-14).

LC1-1

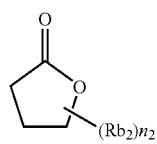

LC1-2

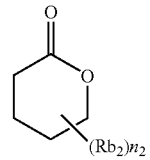

LC1-3

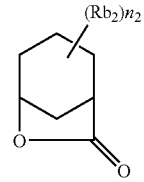

LC1-4

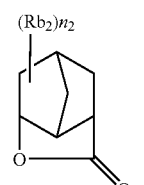

LC1-5

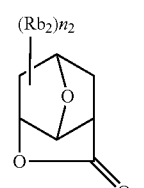

LC1-6

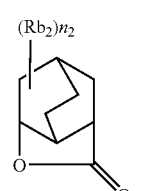

LC1-7

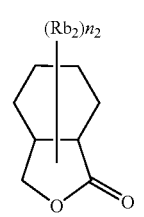

LC1-8

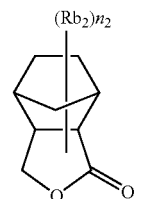

LC1-9

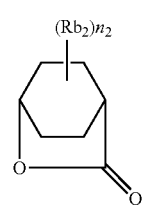

LC1-10

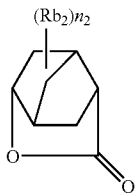

LC1-11

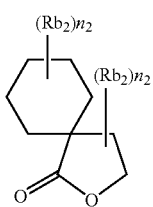

LC1-12

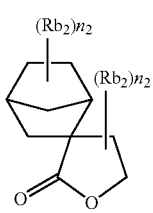

LC1-13

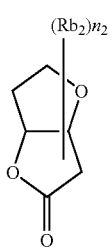

LC1-14

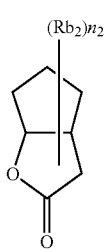

LC1-15

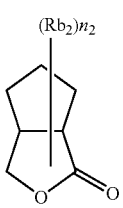

LC1-16

The lactone structure moiety may or may not have a substituent ($Rb_2$). Preferred examples of the substituent ($Rb_2$) include an alkyl group containing from 1 to 8 carbon atoms, a cycloalkyl group containing from 4 to 7 carbon atoms, an alkoxy group containing from 1 to 8 carbon atoms, an alkoxycarbonyl group containing from 1 to 8 carbon atoms, a carboxyl group, a halogen atom, a hydroxyl group, a cyano group, and an acid-decomposable group. $n_2$ represents an integer of from 0 to 4. When $n_2$ represents 2 or more, plural $Rb_2$s may be the same or different, or plural $Rb_2$s may be connected to each other to form a ring.

As a repeating unit having a group having a lactone structure represented by any one of (LC1-1) to (LC1-16), there can be illustrated a repeating unit represented by the foregoing general formula (IIAB1) or (IIAB2) wherein at least one of $R_{13}'$ to $R_{16}'$ has a group represented by any one of the general formula (LC1-1) to (LC1-16) (for example, $R_5$ in —$COOR_5$ represents a group represented by any one of the general formulae (LC1-1) to (LC1-16)), and a repeating unit represented by the following general formula (AI).

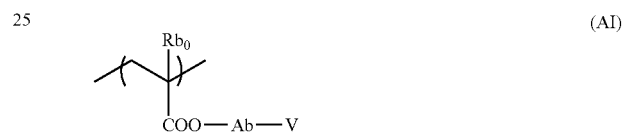

(AI)

In the general formula (AI), $R_{b0}$ represents a hydrogen atom, a halogen atom or an alkyl group containing from 1 to 4 alkyl group. Examples of substituents which an alkyl group of $R_{b0}$ may have include a hydroxyl group and a halogen atom.

Examples of a halogen atom of $R_{b0}$ include a fluorine atom, a chlorine atom, a bromine atom, and an iodine atom. $R_{b0}$ is preferably a hydrogen atom or a methyl group.

$A_b$ represents a single bond, an alkylene group, a divalent linking group having a monocyclic or polycyclic alicyclic hydrocarbon structure, an ether group, an ester group, a carbonyl group, or a divalent linking group comprising a combination of these, and preferably represents a single bond or a divalent linking group represented by -$Ab_1$-$CO_2$—.

$Ab_1$ represents a straight or branched alkylene group or a monocyclic or polycyclic cycloalkylene group, preferably a methylene group, an ethylene group, a cyclohexylene group, an adamantylene group or a norbornylene group.

V represents a group having a structure shown by any one of the general formulae (LC1-1) to (LC1-16).

Usually, optical isomers exist for the repeating units having a lactone structure, and any of the optical isomers may be used. Also, the optical isomers may be used alone or as a mixture of plural optical isomers. In the case of mainly using one optical isomer, optical isomers having an optical purity (ee) of 90 or more are preferred, with an optical purity of 95 or more being more preferred.

Specific examples of the repeating units having a lactone structure are illustrated below which, however, are not to be construed to limit the invention.

(In the following formulae, Rx represents H, $CH_3$, $CH_2OH$ or $CF_3$.)

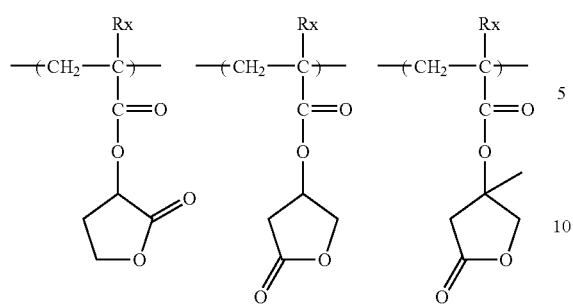
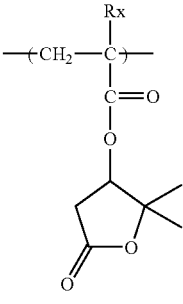
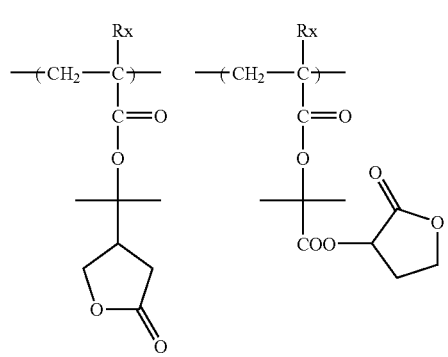
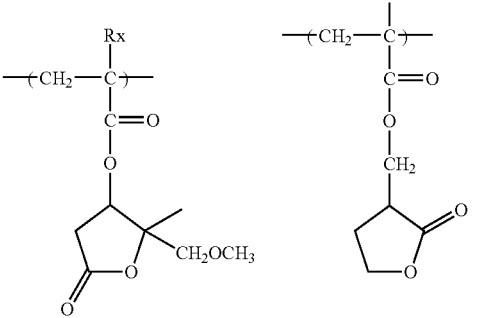
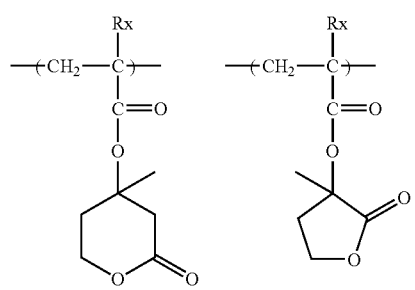
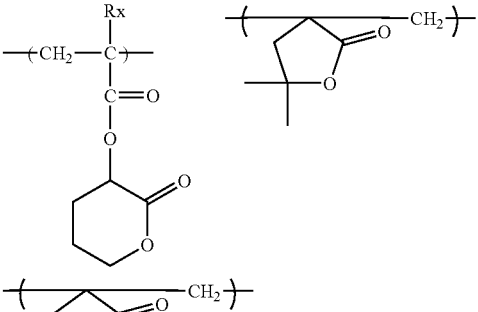
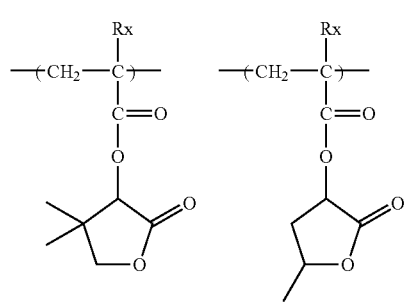
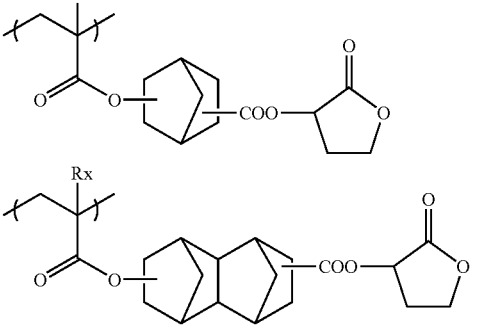
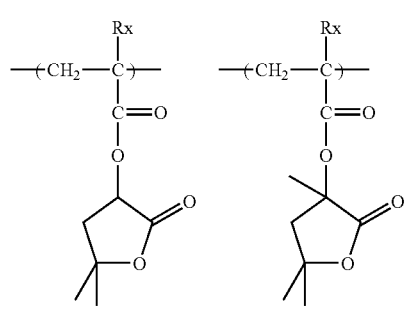
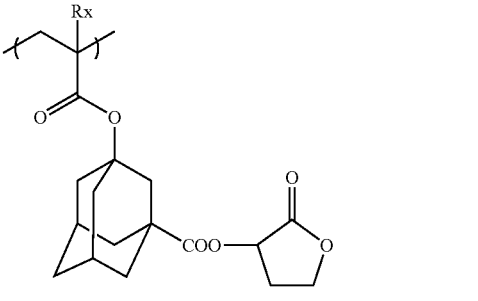
(In the following formulae, Rx represents H, CH$_3$, CH$_2$OH or CF$_3$.)

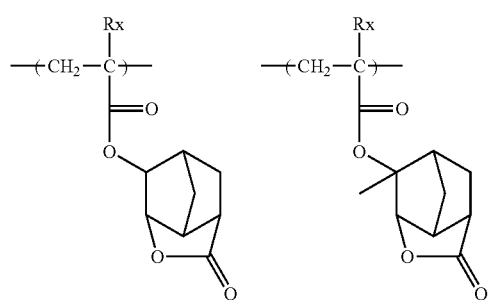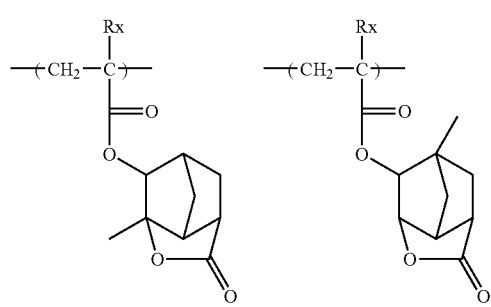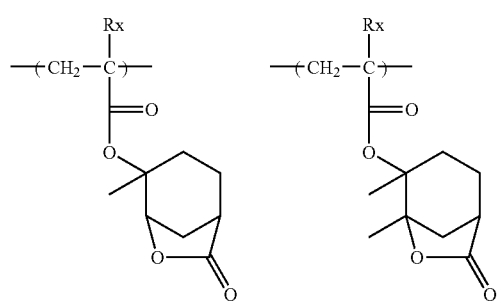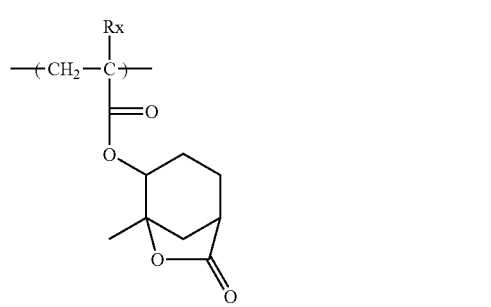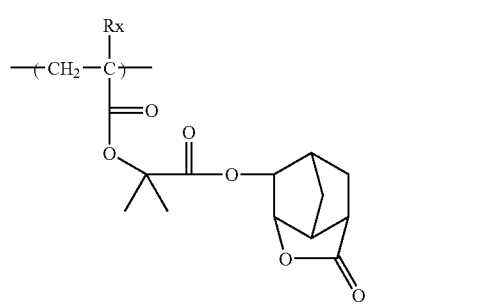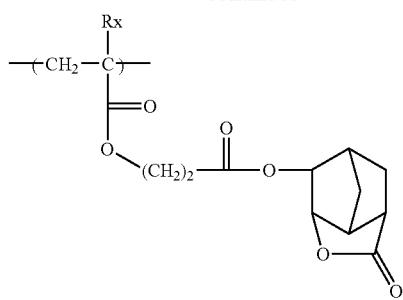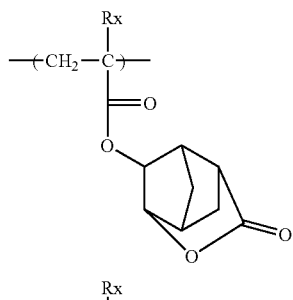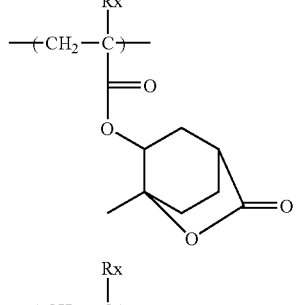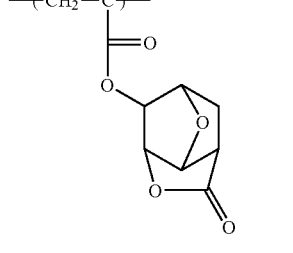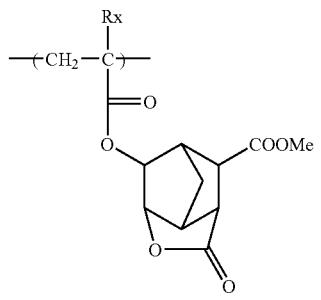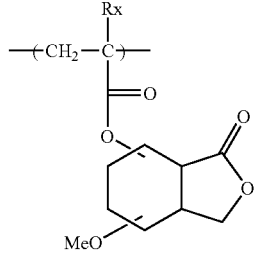

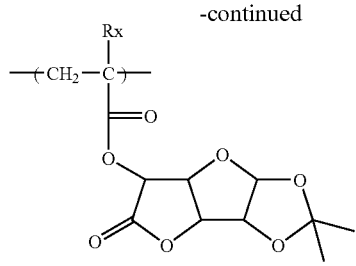
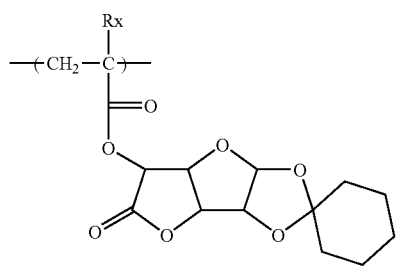
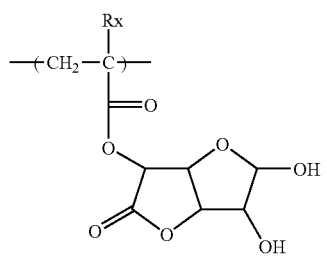
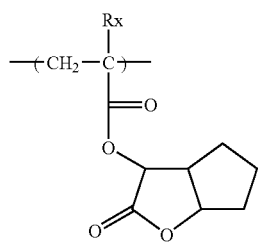
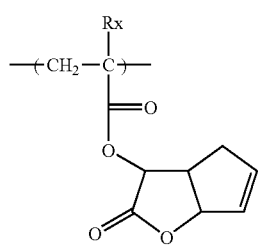
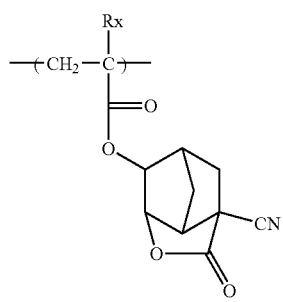
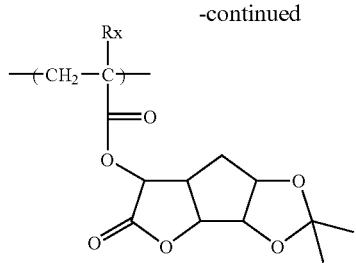
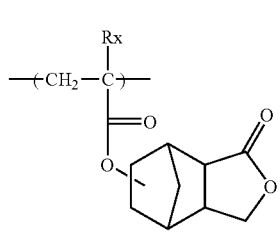
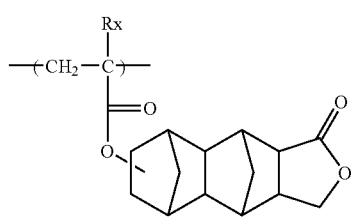
(In the following formulae, Rx represents H, $CH_3$, $CH_2OH$ or $CF_3$.)
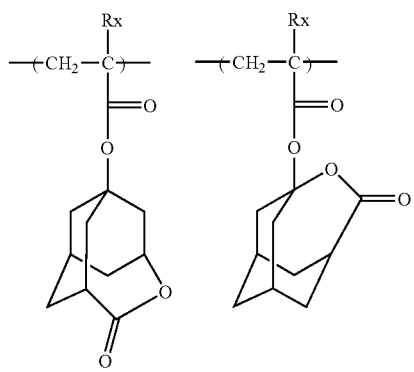
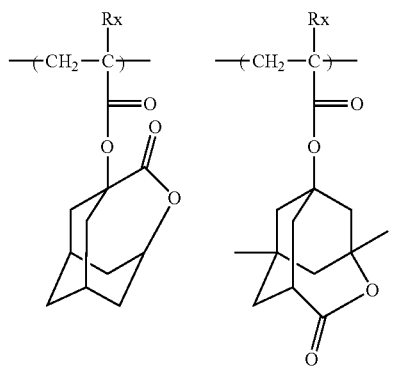

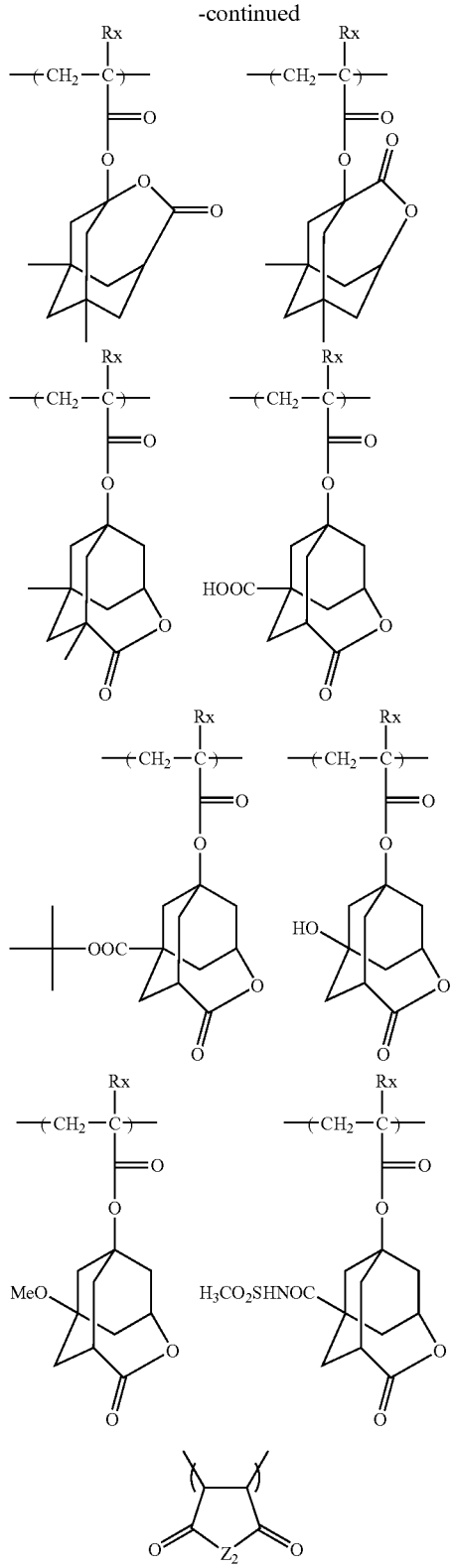

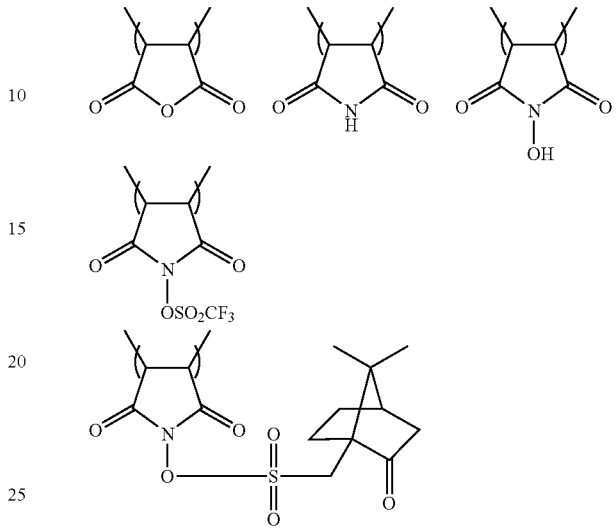

In the general formula (VIII), $Z_2$ represents —O— or —N($R_{41}$)—. $R_{41}$ represents a hydrogen atom, a hydroxyl group, an alkyl group or —OSO$_2$—$R_{42}$. $R_{42}$ represents an alkyl group, a cycloalkyl group or a camphor residue. An alkyl group represented by $R_{41}$ or $R_{42}$ may be substituted by a halogen atom (preferably a fluorine atom).

As a repeating unit represented by the general formula (VIII), there can be illustrated the following specific examples which, however, are not to be construed to limit the invention in any way.

As the group (z) decomposable by the action of an acid (an acid-degradable group or an acid-decomposable group is a group substituted by a substituent formed by displacing a hydrogen atom of an alkali-soluble group, preferably a —COOH group or a —OH group, with a group releasable with an acid.

Examples of the group releasable with an acid include —C($R_{36}$)($R_{37}$)($R_{38}$), —C($R_{36}$)($R_{37}$)(O$R_{39}$), and —C($R_{01}$)($R_{02}$)(O$R_{39}$).

In the formulae, $R_{36}$ to $R_{39}$ each independently represents an alkyl group, a cycloalkyl group, an aryl group, an aralkyl group or an alkenyl group. $R_{36}$ and $R_{37}$, and $R_{36}$ and $R_{39}$, may be connected to each other to form a ring.

$R_{01}$ to $R_{02}$ each independently represents a hydrogen atom, an alkyl group, a cycloalkyl group, an aryl group, an aralkyl group or an alkenyl group.

In the invention, the acid-decomposable group is preferably an acetal group or a tertiary ester group.

The content of a repeating unit having the group (z) that decomposes by action of an acid in the resin (C) is preferably from 1 to 80 mol %, more preferably from 10 to 80 mol %, still more preferably from 20 to 60 mol %, based on all the repeating units in the polymer.

Examples of the repeating unit repeating unit having the group (z) that decomposes by action of an acid in the resin (C) could be the same as those of the acid-decomposable repeating unit on the resin (A).

The resin (C) added to the resin composition of the invention is localized over a light-sensitive film surface layer. Thus, when the immersion medium is water, a receding contact angle of the light-sensitive film surface is improved so that the followability of immersion water may be improved. As the resin (C), any resin can be used as long as it can improve a receding contact angle over the film surface. However, the resin preferably contains at least one of a fluorine atom and a silicon atom. The receding contact angle of a light-sensitive film is preferably from 600 to 90°, more preferably 70° or more.

The amount of the resin (C) to be added can be properly controlled so that the receding contact angle of a light-sensitive film may fall within the foregoing range. The amount of the resin is preferably from 0.1 to 10% by weight, more preferably from 0.1 to 5% by weight, based on the weight of the total solid components of the light-sensitive composition.

The resin (C) is localized in the interface as described above. However, as is different from a surfactant, it does not necessarily have a hydrophilic group within the molecule and is not required to contribute to uniform mixing of polar/nonpolar materials.

The resin (C) is preferably an alkali-soluble resin having a fluorine atom-containing alkyl group containing from 1 to 4 carbon atoms, a fluorine atom-containing cycloalkyl group, or a fluorine atom-containing aryl group.

The resin (C) preferably has an alcoholic hydroxyl group wherein the alcohol moiety thereof is a fluorinated alcohol.

The resin (C) is preferably at least one of resin (C1) which has at least either of fluorine atom and silicon atom and has an alicyclic structure and resin (C2) which has a repeating unit having at least either of fluorine atom and silicon atom in the side chain thereof and a repeating unit which has an unsubstituted alkyl group in the side chain thereof.

The resin (C) is preferably a hydrophobic resin (HR). The hydrophobic resin (HR) can also preferably be used as a top coat.

A fluorine atom or a silicon atom in the resin (HR) may be present either in the main chain or in the side chain by substitution.

The resin (HR) is preferably soluble in an alkali developer.

The term "hydrophobic resin" as used herein means a resin which, when added to a light-sensitive film, contributes to improvement of the contact angle of the light-sensitive film surface for water.

The hydrophobic resin may be any resin that can improve, when added, the receding contact angle of the surface. However, the resin preferably contains at least either of a fluorine atom and a silicon atom. Upon application of immersion exposure, the advancing contact angle of the light-sensitive film is adjusted to preferably from 70° to 120°, more preferably from 75° to 100°. Also, the receding contact angle is adjusted to preferably from 60° to 100°, more preferably from 70° to 90°.

The amount of the hydrophobic resin (HR) to be added can be properly controlled so that the receding contact angle of the light-sensitive resist film may fall within the foregoing range, and is preferably from 0.1 to 10% by weight, more preferably from 0.1 to 5% by weight, based on the weight of the total solid components of the light-sensitive composition.

Since it is preferred to contribute to improvement of the receding contact angle by adding the resin in a less amount, the glass transition point (Tg) of the resin is preferably in the range of from 50° C. to 200° C.

Also, the resin is preferably solid at an ordinary temperature (25° C.).

The advancing contact angle and the receding contact angle are respectively an advancing contact angle and a receding contact angle measured by forming a 36-μL water droplet on a positive resist composition formed on a silicon wafer using a syringe, pushing out or drawing it at a rate of 6 μL/sec, and measuring the contact angle while pushing out or drawing after being stabilized.

Many of the hydrophobic resin are localized in the interface. However, as is different from a surfactant (E), it does not necessarily have a hydrophilic group within the molecule and is not required to contribute to uniform mixing of polar/nonpolar materials.

Also, the term "alkali-soluble" as used herein means that, if a hydrophobic resin film can be dissolved in a 2.38% by weight of tetramethylammonium hydroxide aqueous solution at 23° C. in a thickness of 50 nm or more in terms of an integral dissolution amount for 30 seconds from initiation of development, the property of the resin is "alkali-soluble". In order to acquire the property of being soluble in an alkali developer, the light-sensitive resin is required to have an alkali-soluble group in the developing step.

Such alkali-soluble group may previously exist in the resin, may be generated by the action of an acid during the steps of exposure to development, or may be generated by the reaction with an alkali developer.

The hydrophobic resin (HR) is preferably a resin wherein its partial structure containing a fluorine atom is an alkyl group having a fluorine atom, a cycloalkyl group having a fluorine atom or an aryl group having a fluorine atom.

The alkyl group having a fluorine atom (containing preferably from 1 to 10 carbon atoms, more preferably from 1 to 4 carbon atoms) is a straight or branched alkyl group wherein at least one hydrogen atom is replaced by a fluorine atom, and may further have other substituents.

The cycloalkyl group having a fluorine atom is a monocyclic or polycyclic alkyl group wherein at least one hydrogen atom is replaced by a fluorine atom, and may further have other substituents.

Examples of the aryl group having a fluorine atom include aryl groups such as a phenyl group and a naphthyl group wherein at least one hydrogen atom is replaced by a fluorine atom. The aryl group may further have other substituents.

As the alkyl group having a fluorine atom, the cycloalkyl group having a fluorine atom, or the aryl group having a fluorine atom, preferred ones are those which are represented by the following general formulae which, however, are not to be construed to limit the invention in any way.

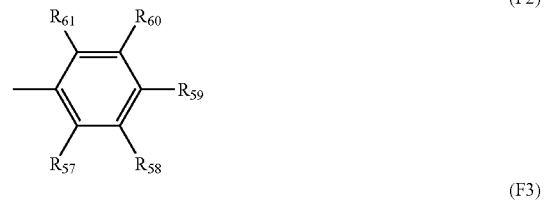

In the general formulae (F2) to (F4), $R_{57}$ to $R_{68}$ each independently represents a hydrogen atom, a fluorine atom or an alkyl group, provided that at least one of $R_{57}$ to $R_{61}$, $R_{62}$ to $R_{64}$, and $R_{65}$ to $R_{68}$ represents a fluorine atom or an alkyl group (containing preferably from 1 to 4 carbon atoms) wherein at least one hydrogen atom is replaced by a fluorine atom. It is preferred that all of $R_{57}$ to $R_{61}$ and all of $R_{65}$ to $R_{67}$ are fluorine atoms. $R_{62}$, $R_{63}$, and $R_{68}$ each is preferably an alkyl group (containing preferably from 1 to 4 carbon atoms) wherein at least one hydrogen atom is replaced by a fluorine atom, more preferably a perfluoroalkyl group containing from 1 to 4 carbon atoms. $R_{62}$ and $R_{63}$ may be connected to each other to form a ring.

Specific examples of the group represented by the general formula (F2) include a p-fluorophenyl group, a pentafluorophenyl group, and a 3,5-di(trifluoromethyl)phenyl group.

Specific examples of the group represented by the general formula (F3) include a trifluoromethyl group, a pentafluoropropyl group, a pentafluoroethyl group, a heptafluorobutyl group, a hexafluoroisopropyl group, a heptafluoroisopropyl group, a hexafluoro(2-methyl)isopropyl group, a nonafluorobutyl group, an octafluoroisobutyl group, a nonafluorohexyl group, a nonafluoro-t-butyl group, a perfluoroisopentyl group, a perfluorooctyl group, a perfluoro(trimethyl)hexyl group, a 2,2,3,3-tetrafluorocyclobutyl group, and a perfluorocyclohexyl group. Of these, a hexafluoroisopropyl group, a heptafluoroisopropyl group, a hexafluoro(2-methyl)isopropyl group, an octafluoroisopropyl group, a nonafluoro-t-butyl group, and a perfluoroisopentyl group are preferred, with a hexafluoroisopropyl group and a heptafluoroisopropyl group being more preferred.

Specific examples of the group represented by the general formula (F4) include —C(CF$_3$)$_2$OH, —C(C$_2$F$_5$)$_2$OH, —C(CF$_3$)(CH$_3$)OH, and —CH(CF$_3$)OH, with —C(CF$_3$)$_2$OH being preferred.

Specific examples of a repeating unit containing a group represented by any one of the general formulae (F2) to (F4) will be shown hereinafter. In the following formulae, $X_1$ represents a hydrogen atom, —CH$_3$, —F or —CF$_3$, and $X_2$ represents —F or CF$_3$.

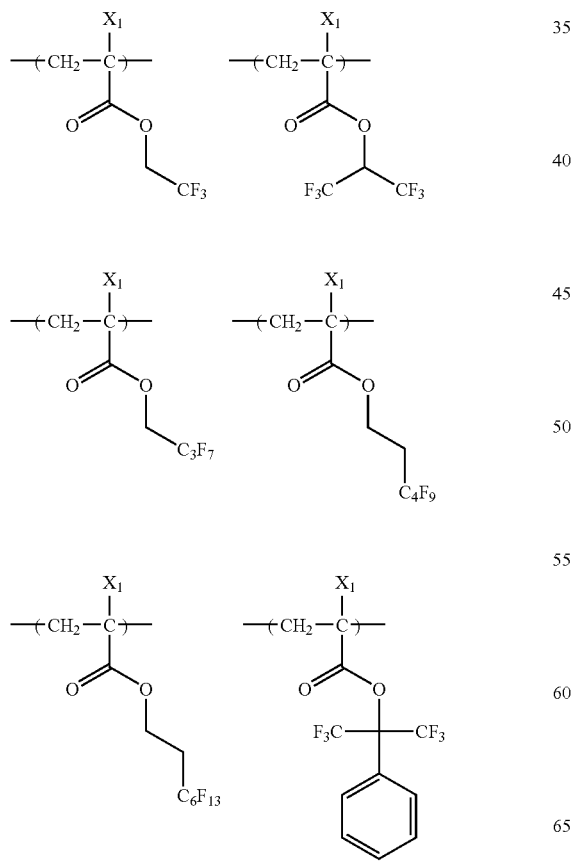

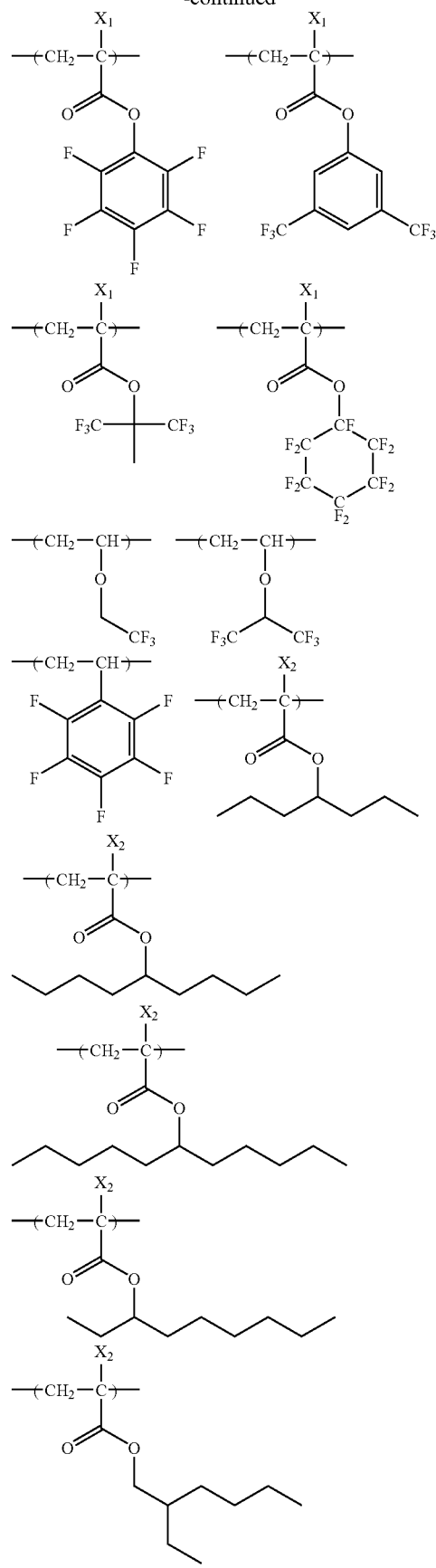

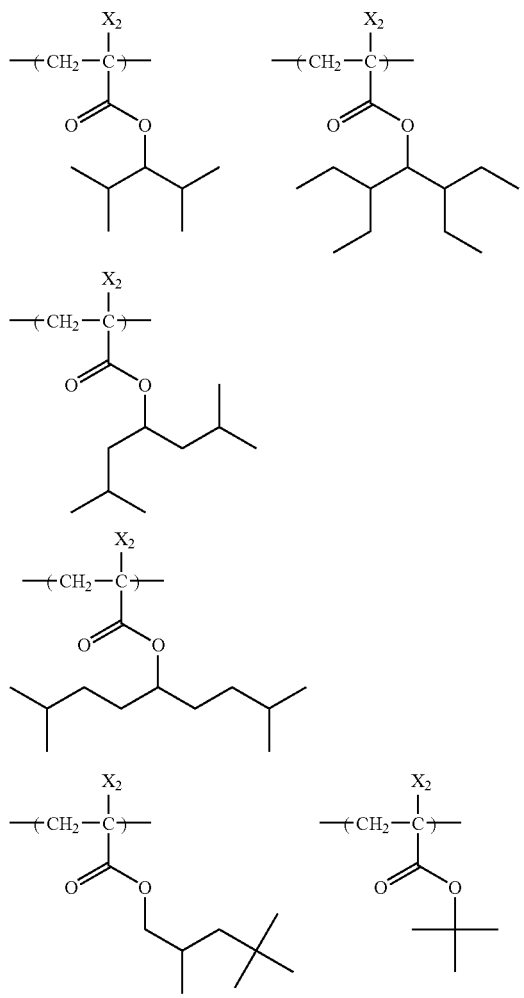

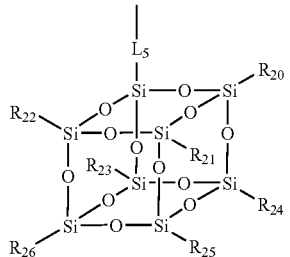

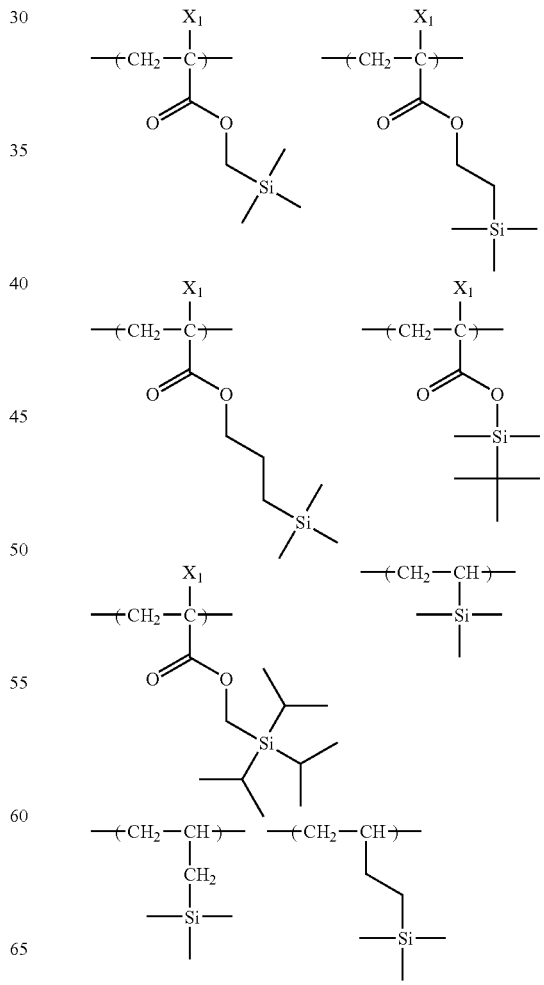

The hydrophobic resin (HR) is preferably a resin having, as a partial structure having at least one silicon atom, an alkylsilyl structure (preferably trialkylsilyl group) or a cyclic siloxane structure.

Specific examples of the alkylsilyl structure or the cyclic siloxane structure include those groups which are represented by the following formulae (CS-1) to (CS-3).

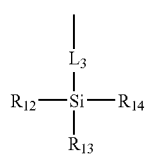
(CS-1)

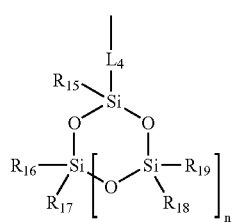
(CS-2)

In the formulae (CS-1) to (CS-3), $R_{12}$ to $R_{26}$ each independently represents a straight or branched alkyl group (containing preferably from 1 to 20 carbon atoms) or a cycloalkyl group (containing preferably from 3 to 20 carbon atoms).

$L_3$ to $L_5$ each represents a single bond or a divalent linking group. As the divalent linking group, there are illustrated ones selected from the group consisting of an alkylene group, a phenyl group, an ether group, a thioether group, a carbonyl group, an ester group, an amido group, a urethane group, and a urea group, and combinations of two or more thereof.

n represents an integer of 1 to 5.

Specific examples thereof are shown below. In the following formulae, X represents a hydrogen atom, —$CH_3$, —F or —$CF_3$.

-continued

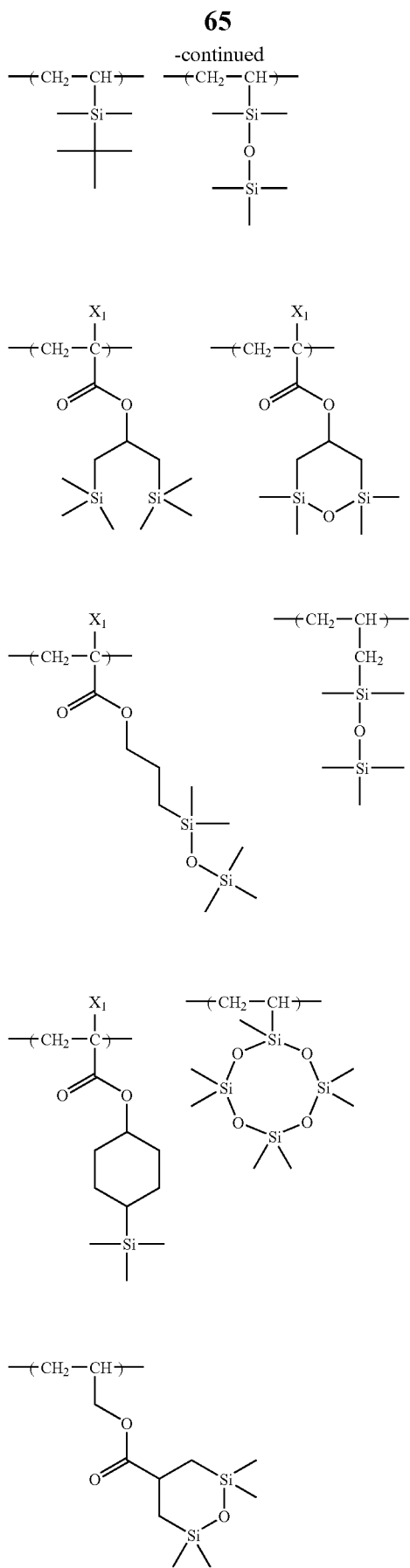

-continued

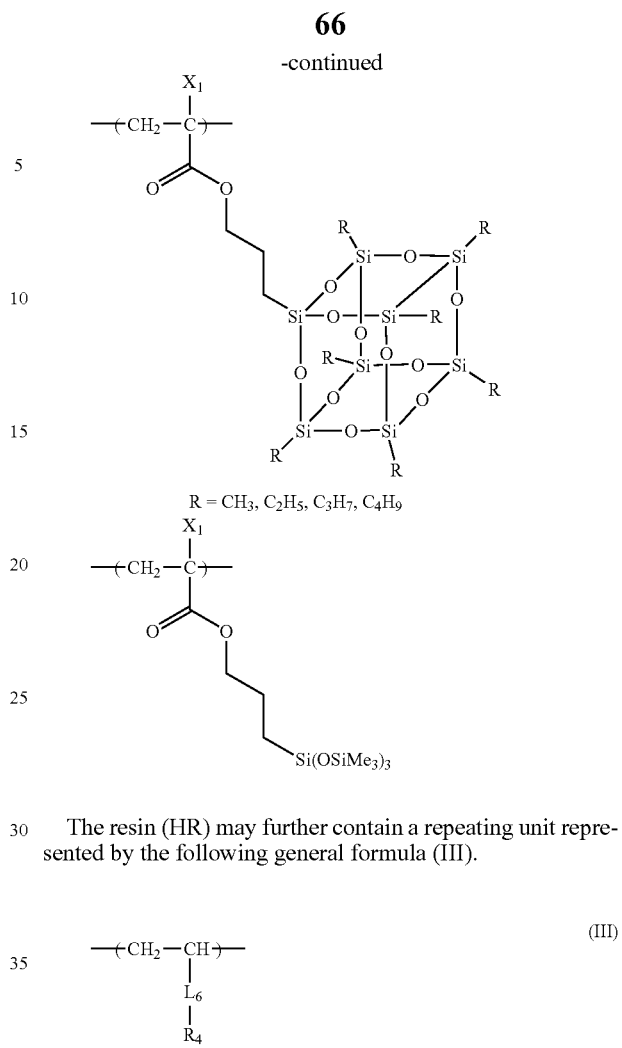

The resin (HR) may further contain a repeating unit represented by the following general formula (III).

$$-\!\!\!\left(\!\mathrm{CH_2\!-\!CH}\!\right)\!\!\!-\quad\quad\quad\quad\quad(\mathrm{III})$$
$$\underset{R_4}{\overset{L_6}{|}}$$

In the general formula (III), $R_4$ represents an alkyl group, a cycloalkyl group, an alkenyl group or a cycloalkenyl group.

$L_6$ represents a single bond or a divalent linking group.

The alkyl group of $R_4$ in the general formula (III) is preferably a straight or branched alkyl group containing from 3 to 20 carbon atoms.

The cycloalkyl group is preferably a cycloalkyl group containing from 3 to 20 carbon atoms.

The alkenyl group is preferably an alkenyl group containing from 3 to 20 carbon atoms.

The cycloalkenyl group is preferably a cycloalkenyl group containing from 3 to 20 carbon atoms.

The divalent linking group of $L_6$ is preferably an alkylene group (containing preferably from 1 to 5 carbon atoms) or an oxy group.

When the resin (HR) contains a fluorine atom, the content of the fluorine atom is preferably from 5 to 80% by weight, more preferably from 10 to 80% by weight based on the molecular weight of the resin (HR). A repeating unit containing a fluorine atom is contained in the resin (HR) in an amount of preferably from 10 to 100% by weight, more preferably from 30 to 100% by weight.

The weight-average molecular weight of the resin (HR) in terms of a standard polystyrene is preferably from 1,000 to 100,000, more preferably from 1,000 to 50,000, still more preferably from 2,000 to 15,000.

As is the same with the acid-decomposable resin (A), it is naturally preferred for the resin (HR) to contain impurities such as metals in minimum amounts, and the content of residual monomers and oligomer components be preferably from 0 to 10% by weight, more preferably from 0 to 5% by weight, still more preferably from 0 to 1% by weight. Thus, there can be obtained a resist free of foreign matters in the solution and suffering no change with time of sensitivity. In addition, in view of resolution, resist shape, side wall of resist pattern, and roughness, the molecular weight distribution (Mw/Mn; also referred to as "degree of dispersion") is preferably in the range of from 1 to 5, more preferably from 1 to 3, still more preferably from 1 to 2.

As the resin (HR), various commercially available products can be used or those synthesized in a conventional manner (for example, by radical polymerization) can be used. For example, as a general synthesizing process, there are illustrated a one-shot polymerization process of conducting polymerization by dissolving a monomer species and an initiator in a solvent and heating the resulting solution, and a dropwise polymerization process of dropwise adding a solution of a monomer species and an initiator to a heated solvent over a period of from 1 to 10 hours, with the dropwise polymerization process being preferred. Examples of the reaction solvent include ethers such as tetrahydrofuran, 1,4-dioxane, and diisopropyl ether; ketones such as methyl ethyl ketone and methyl isobutyl ketone; ester solvents such as ethyl acetate; amide solvents such as dimethylformamide and dimethylacetamide; and solvents capable of dissolving the composition of the invention such as propylene glycol monomethyl ether acetate, propylene glycol monomethyl ether, and cyclohexanone, which will be described hereinafter. It is more preferred to conduct polymerization by using the same solvent as that to be used in the resist composition of the invention. Thus, generation of particles during storage can be suppressed.

The polymerization reaction is preferably conducted in an atmosphere of an inert gas such as nitrogen or argon. The polymerization is initiated by using a commercially available radical initiator (e.g., an azo series initiator or a peroxide) as a polymerization initiator. As the radical initiator, azo series initiators are preferred, and azo series initiators having an ester group, a cyano group or a carboxyl group are preferred. Preferred examples of the initiator include azobisisobutyronitrile, azobisdimethylvaleronitrile, and dimethyl 2,2'-azobis (2-methylpropionate). The reaction concentration is from 5 to 50% by weight, preferably from 30 to 50% by weight. The reaction temperature is usually from 10° C. to 150° C., preferably from 30° C. to 120° C., more preferably from 60 to 100° C.

After completion of the reaction, the reaction mixture is allowed to cool to room temperature, followed by purification. As the purifying method, there can be employed common methods such as a liquid-liquid extraction method of removing residual monomers and oligomer components by a combination of washing with water and use of an appropriate solvent, a purifying method in a solution state such as ultrafiltration of removing components having a molecular weight equal to or less than a particular molecular weight by extraction, a re-precipitating method of removing residual monomers and the like by dropwise adding the resin solution to a poor solvent to thereby coagulate the resin in the poor solvent, and a purifying method in a solid state by washing a resin slurry obtained by filtration with a poor solvent. For example, the resin is precipitated as solid by bringing the reaction solution into contact with a solvent (poor solvent) in which the resin is scarcely soluble or insoluble, in an amount by volume 10 times as much as the amount by volume of the reaction solution or less than that, preferably in a 10- to 5-fold amount by volume.

As a solvent (solvent for precipitation or re-precipitation) to be used upon precipitation or re-precipitation of the polymer product from the polymer solution, poor solvents for the polymer may be used. An appropriate solvent can be selected from among hydrocarbons, halogenated hydrocarbons, nitro compounds, ethers, ketones, esters, carbonates, alcohols, carboxylic acids, water, and mixed solvents containing these solvents according to the kind of the polymer. Of these, solvents containing at least an alcohol (particularly, methanol) or water are preferred as the solvents for precipitation or re-precipitation.

The amount of the solvents for precipitation or re-precipitation to be used can properly be selected in consideration of efficiency or yield but, in general, is from 100 to 10,000 parts by weight, preferably from 200 to 2,000 parts by weight, more preferably from 300 to 1,000 parts by weight, per 100 parts by weight of the polymer solution.

The temperature to be employed upon precipitation or re-precipitation can properly be selected in consideration of efficiency or operability but, usually, is from about 0 to about 50° C., preferably around room temperature (for example, from about 20 to about 35° C.). The precipitation or re-precipitation procedure can be conducted in a known manner such as a batchwise manner or a continuous manner using a conventional mixing vessel such as a stirring tank.

The precipitated or re-precipitated polymer is usually subjected to conventional solid-liquid separation such as filtration or centrifugation, and then dried to use. Filtration is conducted by using a solvent-resistant filter medium preferably under pressure.

Drying is conducted under ordinary pressure or reduced pressure (preferably under reduced pressure) at a temperature of from about 30 to about 100° C., preferably from about 30 to about 50° C.

Additionally, it is also possible to once precipitate and separate the resin, and then again dissolve in a solvent and bring the solution into contact with a solvent in which the resin is scarcely soluble or insoluble. That is, the reaction solution may be subjected, after completion of the radical polymerization reaction, to a method including a step (Step a) of bringing the reaction solution into contact with a solvent in which the resin is scarcely soluble or insoluble to thereby precipitate the resin, a step (Step b) of separating the resin from the solution, a step (Step c) of again dissolving the separated resin to prepare a resin solution A, a step (Step d) of bringing the resin solution A into contact with a solvent in which the resin is scarcely soluble or insoluble to thereby precipitate the resin in an amount by volume less than 10 times the amount by volume of the resin solution A (preferably in an amount by volume less than 5 times) to thereby precipitate the resin solid, and a step (Step e) of separating the precipitated resin.

Specific examples of the resin (C) will be shown below. Also, mol ratios of repeating units in individual resins (corresponding to individual repeating units in the order of from left to right), weight-average molecular weights, and degrees of dispersion are shown in the following table.

(HR-1) 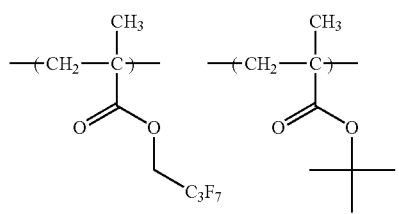
(HR-2) 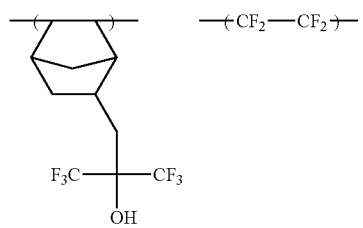
(HR-3) 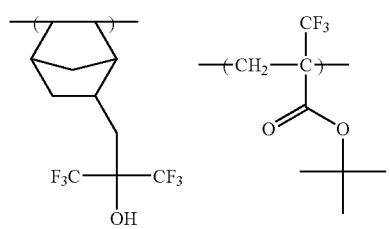
(HR-4) 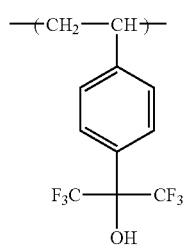
(HR-5) 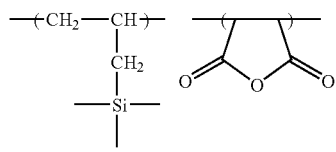
(HR-6) 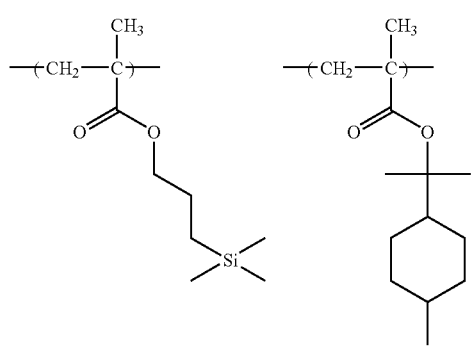
(HR-7) 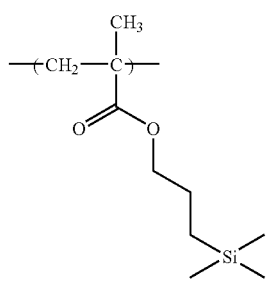
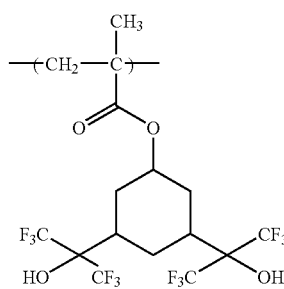
(HR-8) 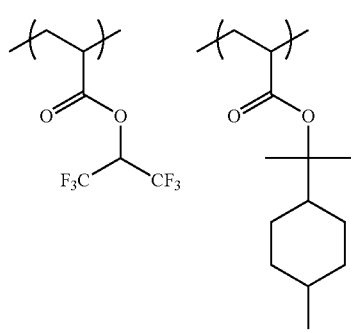
(HR-9) 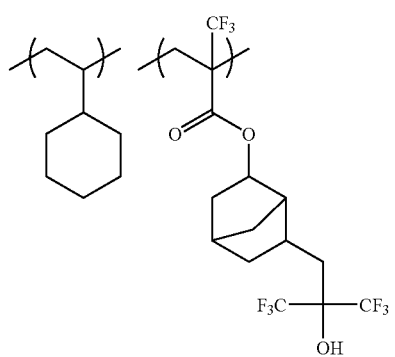
(HR-10) 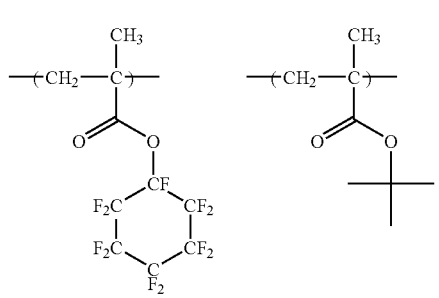

(HR-11) 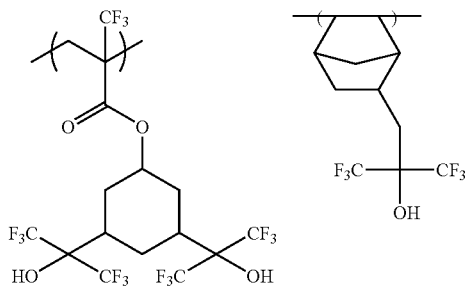
(HR-12) 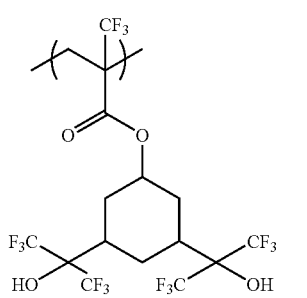 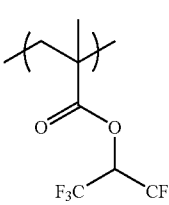
(HR-13) 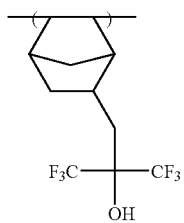
(HR-14) 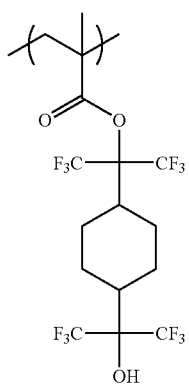
(HR-15) 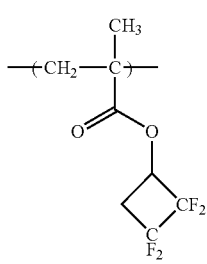
(HR-16) 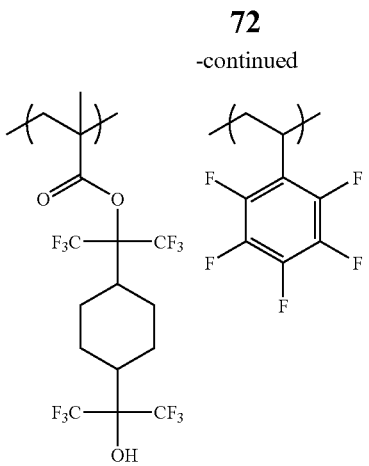
(HR-17) 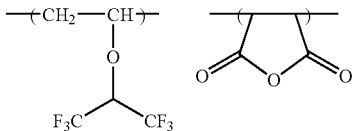
(HR-18) 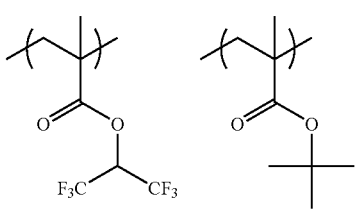
(HR-19) 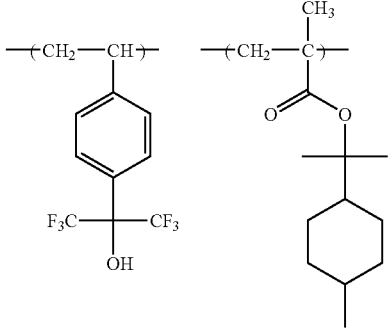
(HR-20) 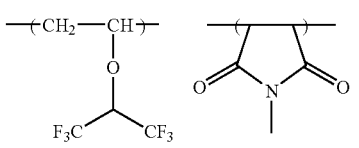 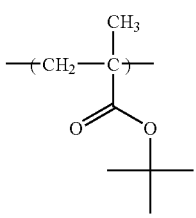

-continued
(HR-21)
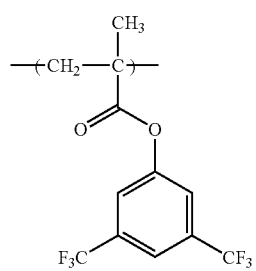
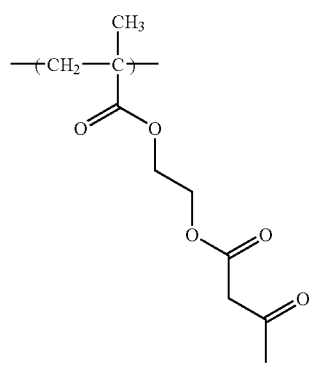
(HR-22)
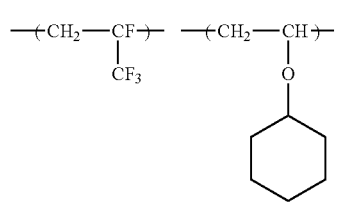
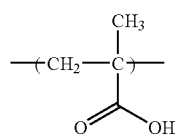
(HR-23)
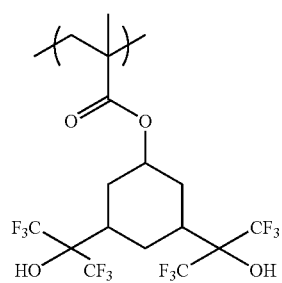
(HR-24)
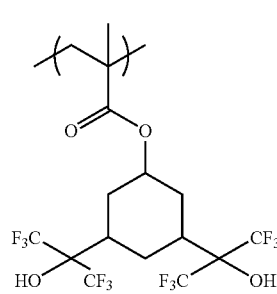
(HR-25)
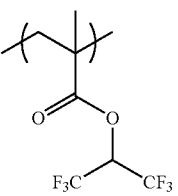 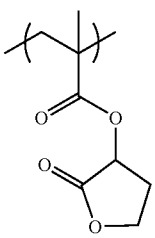
(HR-26)
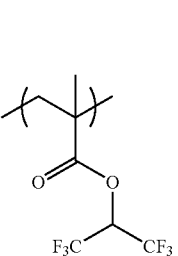 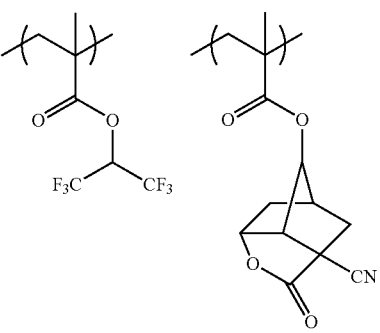
(HR-27)
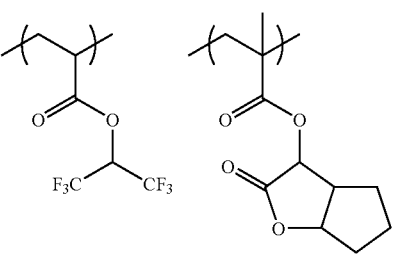
(HR-28)
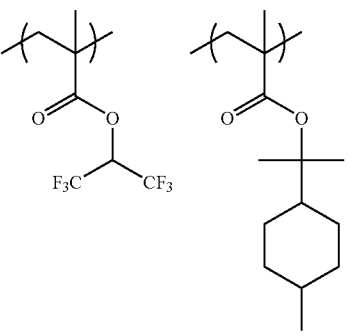
(HR-29)
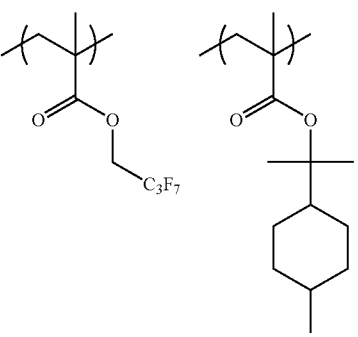

(HR-30)
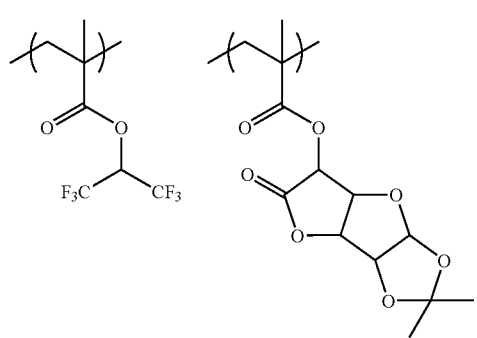
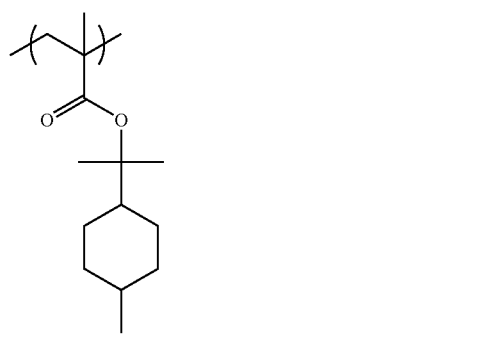
(HR-31)
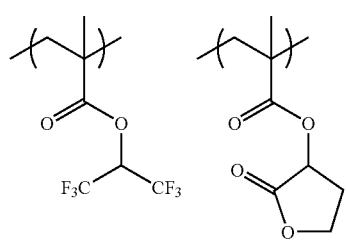
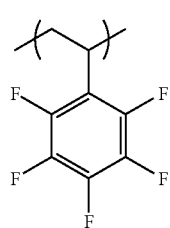
(HR-32)
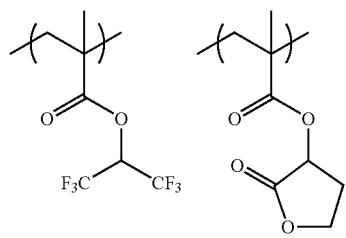
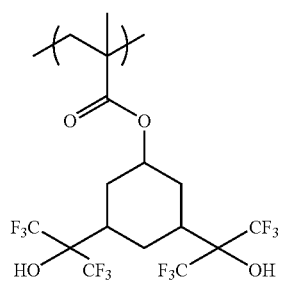
(HR-33)
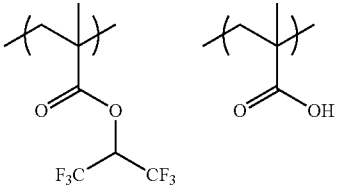
(HR-34)
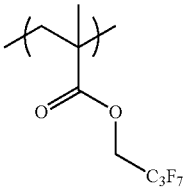
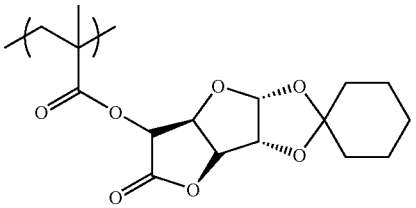
(HR-35)
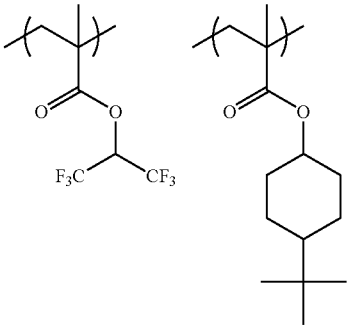
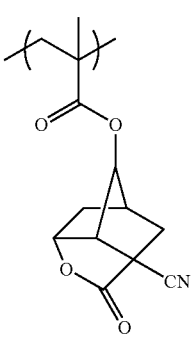
(HR-36)
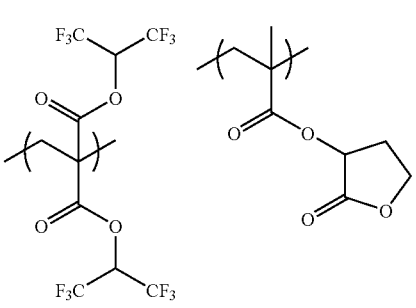

-continued
(HR-37) 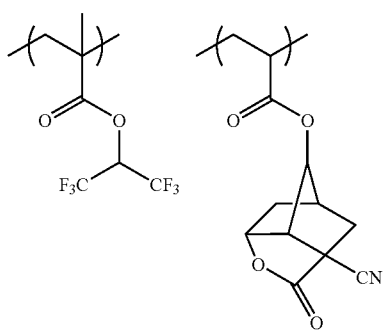
(HR-38) 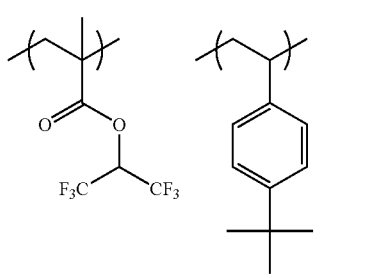
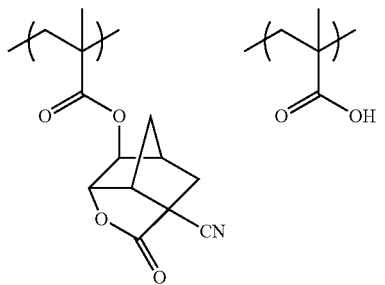
(HR-39) 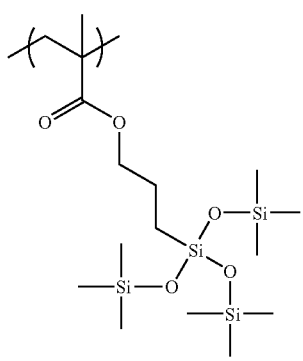
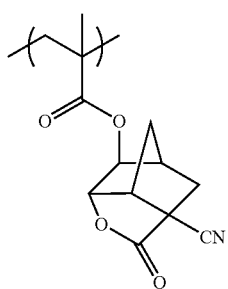
-continued
(HR-40) 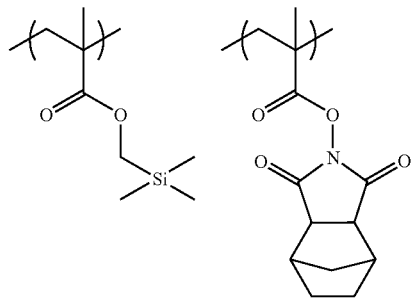
(HR-41) 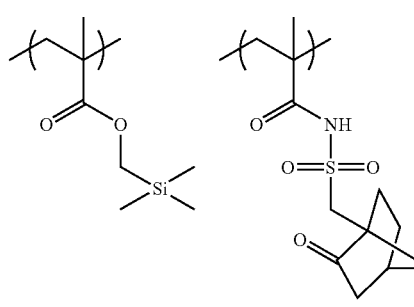
(HR-42)
(HR-43)
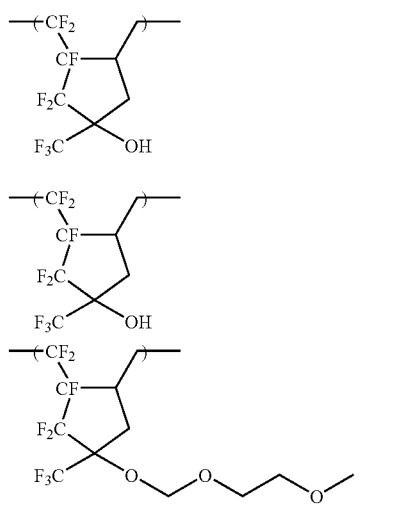
TABLE 1
| Resin | Composition | Mw | Mw/Mn |
|---|---|---|---|
| HR-1 | 50/50 | 8800 | 2.1 |
| HR-2 | 50/50 | 5300 | 1.9 |
| HR-3 | 50/50 | 6200 | 1.9 |
| HR-4 | 100 | 12000 | 2.0 |
| HR-5 | 50/50 | 5800 | 1.9 |
| HR-6 | 40/60 | 13000 | 2.2 |
| HR-7 | 60/40 | 9800 | 2.2 |
| HR-8 | 50/50 | 8000 | 2.0 |
| HR-9 | 50/50 | 10900 | 1.9 |
| HR-10 | 50/50 | 6900 | 1.9 |
| HR-11 | 60/40 | 8800 | 1.5 |
| HR-12 | 68/32 | 11000 | 1.7 |
| HR-13 | 100 | 8000 | 1.4 |
| HR-14 | 100 | 8500 | 1.4 |
| HR-15 | 80/20 | 13000 | 2.1 |
| HR-16 | 70/30 | 18000 | 2.3 |
| HR-17 | 50/50 | 5200 | 1.9 |
| HR-18 | 50/50 | 10200 | 2.2 |
| HR-19 | 60/40 | 7200 | 2.2 |

TABLE 1-continued

| Resin | Composition | Mw | Mw/Mn |
|---|---|---|---|
| HR-20 | 32/32/36 | 5600 | 2.0 |
| HR-21 | 30/30/40 | 9600 | 1.6 |
| HR-22 | 40/40/20 | 12000 | 2.0 |
| HR-23 | 100 | 6800 | 1.6 |
| HR-24 | 50/50 | 7900 | 1.9 |
| HR-25 | 40/30/30 | 5600 | 2.1 |
| HR-26 | 50/50 | 6800 | 1.7 |
| HR-27 | 50/50 | 5900 | 1.6 |
| HR-28 | 49/51 | 6200 | 1.8 |
| HR-29 | 50/50 | 8000 | 1.9 |
| HR-30 | 30/40/30 | 9600 | 2.3 |
| HR-31 | 30/40/30 | 9200 | 2.0 |
| HR-32 | 40/29/31 | 3200 | 2.1 |
| HR-33 | 90/10 | 6500 | 2.2 |
| HR-34 | 50/50 | 7900 | 1.9 |
| HR-35 | 20/30/50 | 10800 | 1.6 |
| HR-36 | 50/50 | 2200 | 1.9 |
| HR-37 | 50/50 | 5900 | 2.1 |
| HR-38 | 40/20/30/10 | 14000 | 2.2 |
| HR-39 | 50/50 | 5500 | 1.8 |
| HR-40 | 50/50 | 10600 | 1.9 |
| HR-41 | 50/50 | 8600 | 2.3 |
| HR-42 | 100 | 6900 | 2.5 |
| HR-43 | 50/50 | 9900 | 2.3 |

It is also possible to provide, between the resist film made of the resist composition of the invention and an immersion liquid, a film (hereinafter also referred to as "topcoat") scarcely soluble in the immersion liquid so as to prevent the resist film formed from the resist composition of the invention from directly contacting with the immersion liquid. The topcoat is required to have coating adaptability for the upper part of the resist, transparency to radiation of, particularly 193 nm, and scarce solubility for the immersion liquid. The topcoat preferably is not mixable with the resist and, further, is preferably capable of being uniformly coated on the upper layer of the resist.

In view of transparency to 193-nm light, the topcoat preferably comprises a polymer not rich in the content of aromatic components. Specific examples thereof include hydrocarbon polymers, acrylic ester polymers, polymethacrylic acid, polyacrylic acid, polyvinyl ether, silicon-containing polymers, and fluorine-containing polymers. The foregoing hydrophobic resins (HR) are also preferred as resins for the topcoat. From the standpoint that, when impurities are dissolved out of the topcoat into the immersion liquid, the impurities can stain the optical lens, the amount of residual monomers of the polymer contained in the topcoat is preferably minimized.

Upon delamination of the topcoat, a developer may be used or, alternatively, a release agent may be used. As the release agent, a solvent scarcely permeating into the resist film is preferred. In the point that the releasing procedure can be conducted simultaneously with development processing procedure of the resist film, it is preferred to release the topcoat with an alkali developer. In view of releasing with an alkali developer, the topcoat is preferably acidic but, in view of non-intermixing properties with the resist film, the topcoat may be neutral or alkaline.

A smaller difference in refractive index between the topcoat and the immersion liquid serves to more improve resolution. In the case of using an ArF excimer laser (wavelength: 193 nm) and using water as an immersion liquid, the topcoat for ArF immersion exposure preferably has a refractive index approximate to the refractive index of the immersion liquid. In view of allowing the refractive index of the topcoat to approximate to that of the immersion liquid, presence of fluorine atom in the topcoat is preferred. Also, in view of transparency and refractive index, the topcoat preferably has a smaller thickness.

The topcoat is preferably unmixable with the resist film and, further, unmixable with the immersion liquid. From this viewpoint, when the immersion liquid is water, the solvent to be used for the topcoat is preferably a water-insoluble medium scarcely soluble in the solvent used for the resist composition. Further, when the immersion liquid is an organic solvent, the topcoat may be water-soluble or water-insoluble.

(D) Solvent

The resist composition of the invention to be used is prepared by dissolving the above-described components in a predetermined solvent. Examples of the solvent include an organic solvent such as alkylene glycol monoalkyl ether carboxylate, alkylene glycol monoalkyl ether, alkyl lactate, alkyl alkoxypropionate, cyclic lactone containing from 4 to 10 carbon atoms, monoketone compound containing from 4 to 10 carbon atoms which may contain a ring, alkylene carbonate, alkyl alkoxyacetate and alkyl pyruvate.

Preferred examples of the alkylene glycol monoalkyl ether carboxylate include propylene glycol monomethyl ether acetate, propylene glycol monoethyl ether acetate, propylene glycol monopropyl ether acetate, propylene glycol monobutyl ether acetate, propylene glycol monomethyl ether propionate, propylene glycol monoethyl ether propionate, ethylene glycol monomethyl ether acetate, and ethylene glycol monoethyl ether acetate.

Preferred examples of the alkylene glycol monoalkyl ether include propylene glycol monomethyl ether, propylene glycol monoethyl ether, propylene glycol monopropyl ether, propylene glycol monobutyl ether, ethylene glycol monomethyl ether, and ethylene glycol monoethyl ether.

Preferred examples of the alkyl lactate include methyl lactate, ethyl lactate, propyl lactate, and butyl lactate.

Preferred examples of the alkyl alkoxypropionate include ethyl 3-ethoxypropionate, methyl 3-methoxypropionate, methyl 3-ethoxypropionate, and ethyl 3-methoxypropionate.

Preferred examples of the cyclic lactone containing from 4 to 10 carbon atoms include β-propiolactone, β-butyrolactone, γ-butyrolactone, α-methyl-γ-butyrolactone, β-methyl-γ-butyrolactone, γ-valerolactone, γ-caprolactone, 7-octanoic lactone, and α-hydroxy-γ-butyrolactone.

Preferred examples of the monoketone compound containing from 4 to 10 carbon atoms which may contain a ring include 2-butanone, 3-methylbutanone, pinacolone, 2-pentanone, 3-pentanone, 3-methyl-2-pentanone, 4-methyl-2-pentanone, 2-methyl-3-pentanone, 4,4-dimethyl-2-pentanone, 2,4-dimethyl-3-pentanone, 2,2,4,4-tetramethyl-3-pentanone, 2-hexanone, 3-hexanone, 5-methyl-3-hexanone, 2-heptanone, 3-heptanone, 4-heptanone, 2-methyl-3-heptanone, 5-methyl-3-heptanone, 2,6-dimethyl-4-heptanone, 2-octanone, 3-octanone, 2-nonanone, 3-nonanone, 5-nonanone, 2-decanone, 3-decanone, 4-decanone, 5-hexen-2-one, 3-penten-2-one, cyclopentanone, 2-methylcyclopentanone, 3-methylcyclopentanone, 2,2-dimethylcyclopentanone, 2,4,4-trimethylcyclopentanone, cyclohexanone, 3-methylcyclohexanone, 4-methylcyclohexanone, 4-ethylcyclohexanone, 2,2-dimethylcyclohexanone, 2,6-dimethylcyclohexanone, 2,2,6-trimethylcyclohexanone, cycloheptanone, 2-methylcycloheptanone, and 3-methylcycloheptanone.

Preferred examples of the alkylene carbonate include propylene carbonate, vinylene carbonate, ethylene carbonate, and butylene carbonate.

Preferred examples of the alkyl alkoxyacetate include 2-methoxyethyl acetate, 2-ethoxyethyl acetate, 2-(2-ethoxyethoxy)ethyl acetate, 3-methoxy-3-methylbutyl acetate, and 1-methoxy-2-propyl acetate.

Preferred examples of the alkyl pyruvate include methyl pyruvate, ethyl pyruvate, and propyl pyruvate.

The solvent which can be preferably used includes a solvent having a boiling point of 130° C. or more at ordinary temperature and atmospheric pressure, and specific examples thereof include cyclopentanone, γ-butyrolactone, cyclohexanone, ethyl lactate, ethylene glycol monoethyl ether acetate, propylene glycol monomethyl ether acetate, ethyl 3-ethoxypropionate, ethyl pyruvate, 2-ethoxyethyl acetate, 2-(2-ethoxyethoxy)ethyl acetate, and propylene carbonate.

In the present invention, these solvents may be used alone or in combination of two or more thereof.

In the invention, a mixed solvent prepared by mixing a solvent containing a hydroxyl group in its structure with a solvent not containing a hydroxyl group in its structure may be used.

Examples of the solvent containing a hydroxyl group include ethylene glycol, ethylene glycol monomethyl ether, ethylene glycol monoethyl ether, propylene glycol, propylene glycol monomethyl ether, propylene glycol monoethyl ether, and ethyl lactate. Of these, propylene glycol monomethyl ether and ethyl lactate are preferred.

Examples of the solvent not containing a hydroxyl group include propylene glycol monomethyl ether acetate, ethyl ethoxypropionate, 2-heptanone, γ-butyrolactone, cyclohexanone, butyl acetate, N-methylpyrrolidone, N,N-dimethylacetamide, and dimethylsulfoxide. Of these, propylene glycol monomethyl ether acetate, ethyl ethoxypropionate, 2-heptanone, γ-butyrolactone, cyclohexanone, and butyl acetate are particularly preferred, and propylene glycol monomethyl ether acetate, ethyl ethoxypropionate, and 2-heptanone are most preferred.

In the invention, a mixed solvent composed of two or more solvents and containing propylene glycol monomethyl ether acetate is preferred.

Further, a mixed solvent composed of two or more solvents and containing ethyl lactate and propylene glycol monomethyl ether acetate is more preferred.

The mixing ratio (by weight) of the solvent containing a hydroxyl group and the solvent not containing a hydroxyl group is from 1/99 to 99/1, preferably from 10/90 to 90/10, more preferably from 20/80 to 60/40. A mixed solvent in which the solvent not containing a hydroxyl group is contained in an amount of 50% by weight or more is particularly preferred in view of coating uniformity.

(E) Basic Compound

The positive resist composition of the invention preferably contains a basic compound (E) for the purpose of reducing change in performance with time elapsed from exposure to heating.

As preferred examples of the basic compound, there can be illustrated compounds having a structure represented by one of the following general formulae (A) to (E).

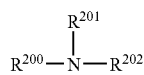

(A)

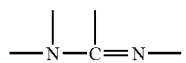

(B)

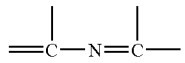

(C)

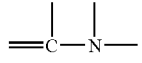

(D)

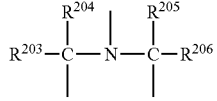

(E)

In formulae (A) to (E), $R^{200}$, $R^{201}$ and $R^{202}$, which may be the same or different, each represents a hydrogen atom, an alkyl group containing from 1 to 20 carbon atoms, a cycloalkyl group containing from 3 to 20 carbon atoms, or an aryl group containing from 6 to 20 carbon atoms, and $R^{201}$ and $R^{202}$ may be connected to each other to form a ring.

The alkyl group may be unsubstituted or may be an alkyl group having a substituent, and the alkyl group having a substituent is preferably an aminoalkyl group containing from 1 to 20 carbon atoms, a hydroxyalkyl group containing from 1 to 20 carbon atoms, or a cyanoalkyl group containing from 1 to 20 carbon atoms.

$R^{203}$, $R^{204}$, $R^{205}$ and $R^{206}$, which may be the same or different, each represents an alkyl group containing from 1 to 20 carbon atoms.

The alkyl group in these formulae (A) to (E) is more preferably unsubstituted.

Examples of the basic compound include substituted or unsubstituted primary, secondary or tertiary aliphatic amines, aromatic amines, heterocyclic amines, amide derivatives, imide derivatives, and nitrogen-containing compounds having a cyano group. Of these, aliphatic amines, aromatic amines, and heterocyclic amines are preferred. The substituent which may be had is preferably an amino group, an alkyl group, an alkoxyl group, an acyl group, an acyloxy group, an aryl group, an aryloxy group, a nitro group, a cyano group, an ester group or a lactone group.

These basic compounds are used alone, or two or more species thereof are used in combination.

In the resist composition of the invention, the basic compound (E) is preferably a triethanolamine compound.

The amount of the basic compound to be used is usually from 0.001 to 10% by weight, preferably from 0.01 to 5% by weight, based on the weight of the solid components of the positive resist composition.

The ratio of the acid generator to the basic compound used in the composition is preferably from 2.5 to 300 in terms of acid generator/basic compound (by mol). That is, the molar ratio is preferably 2.5 or more in view of sensitivity and resolution, and preferably 300 or less from the standpoint of suppressing the reduction in resolution due to thickening of the resist pattern in aging after exposure until heat treatment. The acid generator/basic compound (by mol) is more preferably from 5.0 to 200, still more preferably from 7.0 to 150.

(F) Surfactant

The positive resist composition of the invention preferably further contains a surfactant, more preferably any one fluorine-containing and/or silicon-containing surfactant (a fluorine-containing surfactant, a silicon-containing surfactant or a surfactant containing both a fluorine atom and a silicon atom) or two or more species thereof.

When the positive resist composition of the invention contains the surfactant, a resist pattern with good sensitivity, resolution, and adhesion as well as less development defects can be obtained upon use of an exposure light source of 250 nm or less, particularly 220 nm or less.

Examples of the fluorine-containing and/or silicon-containing surfactant include surfactants described in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, JP-A-2002-277862, and U.S. Pat. Nos. 5,405,720, 5,360,692, 5,529,881, 5,296,330, 5,436,098, 5,576,143, 5,294,511, and 5,824,451. It is also possible to use the following commercially available surfactants as such.

Examples of the commercially available surfactant which can be used include a fluorine-containing surfactant and a silicon-containing surfactant, such as EFtop EF301 and EF303 (manufactured by Shin-Akita Kasei K.K.); Florad FC430, 431, and 4430 (manufactured by Sumitomo 3M Inc.); Megafac F171, F173, F176, F189, F113, F110, F177, F120, and R08 (manufactured by Dainippon Ink & Chemicals, Inc.); Surflon S-382, SC101, 102, 103, 104, 105, and 106 (manufactured by Asahi Glass Co., Ltd.); Troysol S-366 (manufactured by Troy Chemical); GF-300 and GF-150 (manufactured by Toagosei Chemical Industry Co., Ltd.); Surflon S-393 (manufactured by Seimi Chemical Co., Ltd.); EFtop EF121, EF122A, EF122B, RF122C, EF125M, EF135M, EF351, 352, EF801, EF802, and EF601 (manufactured by JEMCO Inc.); PF636, PF656, PF6320, and PF6520 (manufactured by OMNIVA); and FTX-204D, 208G, 218G, 230G, 204D, 208D, 212D, 218, and 222D (manufactured by NEOS Co., Ltd.). In addition, polysiloxane polymer KP-341 (manufactured by Shin-Etsu Chemical Co., Ltd.) may also be used as the silicon-containing surfactant.

Other than those known surfactants as described above, a surfactant using a polymer having a fluoro-aliphatic group derived from a fluoro-aliphatic compound which is produced by a telomerization process (also called a telomer process) or an oligomerization process (also called an oligomer process), may be used. The fluoro-aliphatic compound can be synthesized by the method described in JP-A-2002-90991.

The polymer having a fluoro-aliphatic group is preferably a copolymer of a fluoro-aliphatic group-containing monomer with a (poly(oxyalkylene)) acrylate and/or a (poly(oxyalkylene)) methacrylate, and the polymer may have an irregular distribution or may be a block copolymer. Examples of the poly(oxyalkylene) group include a poly(oxyethylene) group, a poly(oxypropylene) group, and a poly(oxybutylene) group. This group may also be a unit having alkylenes differing in the chain length within the same chain, such as block-linked poly(oxyethylene, oxypropylene, and oxyethylene) and block-linked poly(oxyethylene and oxypropylene). Furthermore, the copolymer of a fluoro-aliphatic group-containing monomer and a (poly(oxyalkylene)) acrylate (or methacrylate) is not limited only to a binary copolymer but may also be a ternary or greater copolymer obtained by simultaneously copolymerizing two or more different fluoro-aliphatic group-containing monomers or two or more different (poly(oxyalkylene)) acrylates (or methacrylates).

Examples thereof include, as the commercially available surfactant, Megafac F178, F-470, F-473, F-475, F-476, and F-472 (manufactured by Dainippon Ink & Chemicals, Inc.) and further include a copolymer of an acrylate (or methacrylate) having a $C_6F_{13}$ group with a (poly(oxyalkylene)) acrylate (or methacrylate), and a copolymer of an acrylate (or methacrylate) having a $C_3F_7$ group with a (poly(oxyethylene)) acrylate (or methacrylate) and a (poly(oxypropylene)) acrylate (or methacrylate).

In the present invention, a surfactant other than the fluorine-containing and/or silicon-containing surfactant may also be used. Specific examples thereof include a nonionic surfactant such as polyoxyethylene alkyl ethers (e.g., polyoxyethylene lauryl ether, polyoxyethylene stearyl ether, polyoxyethylene cetyl ether, and polyoxyethylene oleyl ether), polyoxyethylene alkylallyl ethers (e.g., polyoxyethylene octylphenol ether and polyoxyethylene nonylphenol ether), polyoxyethylene-polyoxypropylene block copolymers, sorbitan fatty acid esters (e.g., sorbitan monolaurate, sorbitan monopalmitate, sorbitan monostearate, sorbitan monooleate, sorbitan trioleate, and sorbitan tristearate), and polyoxyethylene sorbitan fatty acid esters (e.g., polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate).

These surfactants may be used alone, or several species thereof may be used in combination.

The amount of the surfactant to be used is preferably from 0.01 to 10% by weight, more preferably from 0.1 to 5% by weight, based on the entire amount of the positive resist composition (excluding the solvent).

These surfactants may be added alone, or several species thereof may be added in combination.

The amount of the surfactant to be used is preferably from 0.0001 to 2% by weight, more preferably from 0.001 to 1% by weight, based on the entire amount of the positive resist composition (excluding the solvent).

(G) Alkali-Soluble Resin

The positive resist composition of the invention may further contain a water-insoluble and alkali developer-soluble resin (G) not containing an acid-decomposable group. This resin serves to improve sensitivity.

In the invention, novolak resins having a molecular weight of from about 1,000 to about 20,000, and polyhydroxystyrene derivatives having a molecular weight of from about 3,000 to about 50,000 can be used as such alkali-soluble resin. However, since these resins largely absorb light of 250 nm or less, it is preferred to partly hydrogenate them before use or to use in an amount of 30% by weight or less based on the amount of the entire resins.

In addition, resins containing a carboxyl group as an alkali-soluble group can be used as well.

The resins containing a carboxyl group preferably have a monocyclic or polycyclic hydrocarbon group in order to improve dry etching resistance. Specifically, there can be illustrated a copolymer of a methacrylic ester having an alicyclic hydrocarbon structure not showing acid-decomposable properties with (meth)acrylic acid, and a resin of (meth) acrylic ester of an alicyclic hydrocarbon group having a terminal carboxyl group.

(H) Onium Carboxylates

The positive resist composition for use in the invention may contain (H) an onium carboxylate. Examples of the onium carboxylate include a sulfonium carboxylate, an iodonium carboxylate, and an ammonium carboxylate. In particular, the onium carboxylate (H) is preferably an iodonium salt or a sulfonium salt. Further, in the onium carboxylate (H) for use in the invention, the carboxylate residue preferably contains neither an aromatic group nor a carbon-carbon double bond. The anion moiety is particularly preferably a linear, branched, monocyclic or polycyclic alkyl carboxylate anion containing from 1 to 30 carbon atoms, more preferably a carboxylate anion wherein the alkyl group is partially or entirely substituted by fluorine. The alkyl chain may contain an oxygen atom. Thus, the transparency to light of 220 nm or less is ensured, the sensitivity and resolving power are enhanced, and the pitch dependency and the exposure margin are improved.

Examples of the fluorine-substituted carboxylate anion include fluoroacetate anion, difluoroacetate anion, trifluoroacetate anion, pentafluoropropionate anion, heptafluorobutyrate anion, nonafluoropentanoate anion, perfluorododecanoate anion, perfluorotridecanoate anion, perfluorocyclohexanecarboxylate anion, and 2,2-bistrifluoromethylpropionate anion.

These onium carboxylates (H) can be synthesized by reacting a sulfonium, iodonium or ammonium hydroxide and a carboxylic acid with silver oxide in an appropriate solvent.

The content of the onium carboxylate (H) in the composition is suitably from 0.1 to 20% by weight, preferably from 0.5 to 10% by weight, more preferably from 1 to 7% by weight, based on the content of all the solid components of the composition.

Other Additives

The positive resist composition of the invention may further contain, as needed, a dye, a plasticizer, a photosensitizer, a light absorbent, and a compound (for example, a phenol compound having a molecular weight of 1,000 or less, or an alicyclic or aliphatic compound having a carboxyl group) which accelerates dissolution in a developer.

The phenol compound having a molecular weight of 1,000 or less can be easily synthesized by one skilled in the art according to the process described, for example, in JP-A-4-122938, JP-A-2-28531, U.S. Pat. No. 4,916,210, and European Patent 219294.

Specific examples of the carboxyl group-containing alicyclic or aliphatic compound include, but are not limited to, a carboxylic acid derivative having a steroid structure, such as cholic acid, deoxycholic acid, and lithocholic acid, an adamantane carboxylic acid derivative, an adamantane dicarboxylic acid, a cyclohexanecarboxylic acid, and a cyclohexanedicarboxylic acid.

[Physical Properties of Resist Composition]

In view of improving resolving power, the positive resist composition of the invention is used in a film thickness of preferably from 30 to 250 nm, more preferably from 30 to 200 nm. Such film thickness can be realized by adjusting the concentration of solid components in the composition within an appropriate range to impart an appropriate viscosity to the positive resist composition, thereby improving coating properties and film-forming properties.

The concentration of all the solid components in the positive resist composition is generally from 1 to 10% by weight, more preferably from 1 to 8% by weight, still more preferably from 1.0 to 7.0% by weight.

[Pattern-Forming Method]

The positive resist composition of the invention is used by dissolving the above-described components in a predetermined organic solvent, preferably a mixed solvent descried hereinbefore and, after filtering through a filter, coating the obtained solution on a predetermines support as follows. The filter to be used for the filtration is preferably a polytetrafluoroethylene-, polyethylene- or nylon-made filter of 0.1 μm or less, more preferably 0.05 μm or less, still more preferably 0.03 μm or less.

For example, the positive resist composition is coated on a substrate (e.g., silicon/silicon dioxide-coated substrate) as those used in the production of precision integrated circuit devices by an appropriate coating method such as spinner or coater, and desired to form a light-sensitive film.

The light-sensitive film is irradiated with an actinic ray or a radiation through a predetermined mask and, preferably after baking (heating), developed and rinsed. Thus, there can be obtained a good pattern.

Examples of an actinic ray or a radiation include infrared light, visible light, ultraviolet light, deep ultraviolet light, X-ray, and electron beams, and preferred examples are deep ultraviolet light having a wavelength of 250 nm or less, more preferably 220 nm or less (specifically, KrF excimer laser (248 nm), ArF excimer laser (193 nm), and excimer laser (157 nm)), X-ray, and electron beams, with a light of from 1 nm to 200 nm in wavelength, in particular, ArF excimer laser, $F_2$ excimer laser, EUV (13 nm), and electron beams being still more preferred.

In the developing step, an alkali developer is used in the following manner. As the alkali developer for the resist composition, an alkaline aqueous solution of an inorganic alkali such as sodium hydroxide, potassium hydroxide, sodium carbonate, sodium silicate, sodium metasilicate, or aqueous ammonia; a primary amine such as ethylamine or n-propylamine; a secondary amine such as diethylamine or di-n-butylamine; a tertiary amine such as triethylamine or methyldiethylamine; an alcoholamine such as dimethylethanolamine or triethanolamine; a quaternary ammonium salt such as tetreamethylammonium hydroxide or tetraethylammonium hydroxide; or a cyclic amine such as pyrrole or piperidine can be used.

Further, an alcohol and a surfactant may be added each in an appropriate amount to the alkali developer before use.

The alkali concentration of the alkali developer is usually from 0.1 to 20% by weight.

The pH of the alkali developer is usually from 10.0 to 15.0.

Further, an alcohol and a surfactant may be added to use each in an appropriate amount to the above-described alkaline aqueous solution.

As a rinsing solution, pure water is used, and a surfactant may be added to use in an appropriate amount.

In addition, treatment with an ultracritical fluid may be conducted after development processing or after rinsing treatment to remove the developer or the rinsing solution adhering onto the pattern.

Upon irradiation with an actinic ray or a radiation, the space between the resist film and the lens may be filled with a liquid (immersion medium) having a higher refractive index than that of the air to conduct exposure (immersion exposure). Such immersion exposure can enhance resolving power. As an immersion medium to be used, any liquid can be used that has a higher refractive index than that of the air, with pure water being preferred. Also, in order to avoid direct contact between the immersion medium and the light-sensitive film upon immersion exposure, an overcoat layer may further be provided on the light-sensitive film, whereby dissolution of the composition from the light-sensitive film to the immersion medium can be suppressed, thus development defects being reduced.

The immersion liquid to be used upon immersion exposure will be described below.

The immersion liquid preferably has a temperature coefficient of refractive index as small as possible so as to be transparent to the exposure wavelength and to hold the distortion of optical image reflected on the resist to the minimum. In particular, when the exposure light source is an ArF excimer laser (wavelength: 193 nm), it is preferred to use water in view of easiness of availability and easy handling property, in addition to the above-mentioned points.

Also, in order to improve refractive index, a medium having a refractive index of 1.5 or more may be used. This medium may be an aqueous solution or an organic solvent.

When water is used as an immersion liquid, in order to reduce the surface tension of water and to increase the surface activity, a trace amount of additive (a liquid) that does not dissolve the resist layer on a wafer and exerts a negligible influence on the optical coating of the lower surface of a lens may be added. As such an additive, aliphatic alcohols having a refractive index almost equal to the refractive index of water is preferred, specifically methyl alcohol, ethyl alcohol, and isopropyl alcohol are exemplified. By adding an alcohol having a refractive index almost equal to that of water, even if the alcohol component in water is evaporated and the concentration of the content is changed, change in refractive index of the liquid as a whole can be made extremely small. On the other hand, when substances opaque to the light of 193 nm or impurities largely different from water in refractive index are mixed, these substances bring about the distortion of the optical image projected on the resist. Accordingly water to be used is preferably distilled water. Further, pure water filtered through an ion exchange filter may be used.

The electric resistance of water is preferably 18.3 MΩcm or higher, and TOC (concentration of organic material) is preferably 20 ppb or lower. Further, it is preferred that water has been subjected to deaeration treatment.

Also, it is possible to enhance lithography performance by enhancing the refractive index of the immersion liquid. From this standpoint, it may be possible to add an additive capable of enhancing the refractive index to water or to use heavy water ($D_2O$) in place of water.

Example 1

The invention will be described in more detail hereinafter by reference to Examples which, however, are not to be construed to limit the invention in any way.

Synthesis Example

Synthesis of Resin A 8.2 g of cyclohexanone is placed in a three-neck flask in a stream of nitrogen, and is heated to 80° C. To this is dropwise added over 6 hours a solution of 8.9 g of norbornanelactone methacrylate, 2.4 g of 3-hydroxyadamantan-1-yl methacrylate, 9.1 g of 1-ethylcyclopentyl methacrylate, and 8 mol % (based on the monomers) of an initiator V-60 (manufactured by Wako Pure Chemical Industries, Ltd.) in 73 g of cyclohexanone. After completion of the dropwise addition, reaction is further conducted at 80° C. for 2 hours. After allowing the reaction solution to cool, this solution is dropwise added over 20 minutes to a mixed solution of 900 ml of methanol/100 ml of water, and a powdery product precipitated is collected by filtration and dried to obtain 16.7 g of a resin (A1). The thus-obtained resin has a weight-average molecular weight of 9,300 in terms of standard polystyrene and has a degree of dispersion (Mw/Mn) of 1.71.

Resins (A2) to (A16) are synthesized in the same manner. The weight-average molecular weight is adjusted by changing the amount of the initiator.

Synthesis Example

Preparation of Resin (C)

Heptafluyorobutyl methacrylate and t-butyl methacrylate are placed in a proportion of 50/50 (molar ratio), and are dissolved in cyclohexanone to prepare 450 g of a solution having a solid component concentration of 22%. To this solution is added 5 mol % of a polymerization initiator V-601 (manufactured by Wako Pure Chemical Industries, Ltd.), and the resulting solution is dropwise added to 50 mL of cyclohexanone heated to 80° C. over 2 hours in an atmosphere of nitrogen. After completion of the dropwise addition, the reaction solution is stirred for 2 hours to obtain a reaction solution (HR-1). After completion of the reaction, the reaction solution (HR-1) is cooled to room temperature, and is precipitated in a 10-fold amount of methanol. The thus-precipitated white powder is collected by filtration to recover an end product of resin (HR-1).

The polymer composition ratio determined from $^1$H-NMR is 50/50 (molar ratio). The weight-average molecular weight in terms of polystyrene determined by measurement of GPC is 8,800, with the degree of dispersion being 2.1.

Other various resins (C) are prepared in the similar manner.

<Preparation of Resist>

Components shown in the following Table 2 are dissolved in a solvent to prepare solutions each having a concentration of solid components of 7% by weight. Each of the solutions is filtered through a 0,1-μm polyethylene filter to prepare positive resist solutions. The thus-prepared positive resist compositions are evaluated according to the following methods. The results are shown in the following table.

Additionally, in each component in the table, the ratio given when plural components are used is by weight.

<Exposure Evaluation: Watermark>

An organic anti-reflection film ARC29A (manufactured by Nissan Chemical Industries, Ltd.) is coated on a silicon wafer, and is baked at 205° C. for 60 seconds to form a 78-nm thick anti-reflection film. Each of the prepared positive resist compositions is coated thereon and baked at 110° C. for 60 seconds to form a 150-nm thick resist film. Each of the thus-obtained wafers is patternwise exposed using an ArF excimer laser immersion scanner (NA0.85; scan speed: 500 mm/s). As an immersion liquid, ultra-pure water is used. Then, after heating at 110° C. for 60 seconds, the exposed wafer is developed for 30 seconds in an aqueous solution of tetramethylammonium hydroxide (2.38% by weight), rinsed with pure water, and spin-dried to obtain a resist pattern. Thereafter, defect distribution on the wafer is detected using KLA2360 (manufactured by KLA), and the shape of the defect is observed using SEMVion (manufactured by AMAT).

A circular defect as shown in FIG. 1 of from about 1 μm to about 5 μm is taken as a watermark defect, and the number of them on a 300-mm wafer is counted. This indication is required to be 50 or less, preferably 30 or less, more preferably 20 or less, still more preferably 5 or less.

<Exposure Evaluation: Film Reduction Margin>

An organic anti-reflection film ARC29A (manufactured by Nissan Chemical Industries, Ltd.) is coated on a silicon wafer, and is baked at 205° C. for 60 seconds to form a 78-nm thick anti-reflection film. Each of the prepared positive resist compositions is coated thereon and baked at 110° C. for 60 seconds to form a 150-nm thick resist film. Each of the thus-obtained wafers is patternwise exposed using an ArF excimer laser immersion scanner (NA0.85; scan speed: 500 mm/s). As an immersion liquid, ultra-pure water is used. Then, after heating at 110° C. for 60 seconds, the exposed wafer is developed for 30 seconds in an aqueous solution of tetramethylammonium hydroxide (2.38% by weight), rinsed with pure water, and spin-dried to obtain a resist pattern. In this occasion, an exposure amount ($E_o$) at which a 75 nm L/S (line-and-space) pattern is resolved 1:1 and an excess exposure amount ($E_{LOSS}$) at which the film starts to dissolve and, as a result, rectangularity of the top shape of the pattern starts to be damaged are measured, and the film reduction margin (over-exposure margin) is calculated according to the following formula.

Film reduction margin (%)=$\{(E_{LOSS}-E_o)/E_o \times 100$

This indication is required to be 3% or more, preferably 4% or more.

TABLE 2

| | Resin (A) (2g) (Formulation Ratio (mol %)) | Acid Generator (mg) | Resin (C) (mg) | Solvents (ratio by weight) | Basic Compound (mg) | Surfactant (mg) | Water Mark Defect (Number) | Film Reduction Margin (%) |
|---|---|---|---|---|---|---|---|---|
| Example 1 | A1 (50/40/10) | Z2/Z62 (20/100) | HR-9 (8) | SL-2/SL-3 (70/30) | N-6 (5) | W-1 (3) | 13 | 6 |
| Example 2 | A2 (40/50/10) | Z2 (80) | HR-1 (4) | SL-2/SL-4/SL-5 (50/45/5) | N-7 (10) | W-5 (4) | 11 | 5 |
| Example 3 | A3 (50/40/10) | Z55/Z65 (20/100) | HR-6 (10) | SL-2/SL-3 (50/50) | N-3 (8) | W-4 (4) | 1 | 5 |
| Example 4 | A4 (60/30/10) | Z44/Z65 (25/80) | HR-7 (14) | SL-2/SL-4 (60/40) | N-7 (7) | W-1 (4) | 1 | 6 |
| Example 5 | A5 (50/10/40) | Z59 (100) | HR-18 (14) | SL-1/SL-2 (60/40) | N-4 (6) | W-3 (4) | 3 | 6 |
| Example 6 | A6 (40/20/40) | Z44/Z65 (50/50) | HR-10 (9) | SL-2/SL-4 (60/40) | N-5 (9) | W-1 (3) | 2 | 5 |
| Example 7 | A7 (40/20/30/10) | Z55/Z47 (30/80) | HR-5 (6) | SL-2/SL-3 (60/40) | N-1 (6) | W-2 (4) | 2 | 6 |
| Example 8 | A8 (40/10/40/10) | Z51 (100) | HR-26 (5) | SL-2/SL-4/SL-6 (50/45/5) | N-7 (9) | — | 5 | 5 |
| Example 9 | A9 (40/10/40/10) | Z55/Z51 (20/80) | HR-23 (3) | SL-2/SL-4 (50/50) | N-2 (4) | W-1 (4) | 4 | 6 |
| Example 10 | A10 (50/20/30) | Z55 (100) | HR-12 (18) | SL-2/SL-3 (50/50) | N-7 (6) | W-6 (5) | 32 | 4 |
| Example 11 | A1 (50/40/10) | Z2 (80) | HR-34 (8) | SL-2/SL-4 (70/30) | N-7 (7) | W-6 (4) | 0 | 6 |
| Example 12 | A2 (40/50/10) | Z16 (90) | HR-13 (14) | SL-2/SL-3/SL-4 (60/20/20) | N-7 (6) | W-6 (4) | 12 | 6 |
| Example 13 | A3 (50/40/10) | Z55/Z51 (40/60) | HR-11 (14) | SL-2/SL-4 (80/20) | N-4 (8) | W-6 (6) | 6 | 5 |
| Example 14 | A4 (60/30/10) | Z55/Z65 (40/60) | HR-41 (9) | SL-2/SL-3 (50/50) | N-7 (9) | W-6 (7) | 3 | 5 |
| Example 15 | A5 (50/10/40) | Z62 (120) | HR-14 (8) | SL-2/SL-3/SL-4 (60/20/20) | N-7 (8) | W-1 (4) | 2 | 6 |
| Example 16 | A6 (40/20/40) | Z55/Z64 (20/80) | HR-27 (9) | SL-1/SL-2 (60/40) | N-7 (5) | W-6 (8) | 2 | 4 |
| Example 17 | A7 (40/20/30/10) | Z55 (80) | HR-35 (6) | SL-2/SL-3 (50/50) | N-7 (6) | W-1 (4) | 5 | 5 |
| Example 18 | A8 (40/10/40/10) | Z55/Z57 (60/40) | HR-42 (10) | SL-2/SL-4 (80/20) | N-3 (10) | W-1 (3) | 4 | 6 |
| Example 19 | A9 (40/10/40/10) | Z65/Z29 (100/10) | HR-20 (9) | SL-2/SL-3 (60/40) | N-7 (7) | W-6 (9) | 1 | 5 |
| Example 20 | A10 (50/20/30) | Z51 (100) | HR-25 (11) | SL-2/SL-4 (80/20) | N-6 (7) | W-6 (9) | 34 | 5 |
| Example 21 | A11 (50/40/10) | Z2/Z62 (20/100) | HR-42 (10) | SL-2/SL-4 (80/20) | N-7 (6) | W-1 (3) | 14 | 6 |
| Example 22 | A12 (40/40/10) | Z2/Z62 (20/100) | HR-23 (3) | SL-1/SL-2 (60/40) | N-7 (5) | W-2 (4) | 17 | 5 |
| Example 23 | A13 (40/50/10) | Z55/Z64 (20/80) | HR-7 (14) | SL-2/SL-4 (70/30) | N-4 (8) | W-6 (8) | 24 | 6 |
| Example 24 | A14 (40/40/10) | Z55 (100) | HR-35 (6) | SL-2/SL-4 (80/20) | N-7 (6) | W-4 (4) | 27 | 3 |
| Example 25 | A12' (40/40/20) | Z2/Z62 (20/100) | HR-23 (3) | SL-1/SL-2 (60/40) | N-7 (5) | W-2 (4) | 17 | 5 |
| Example 26 | A14' (40/40/20) | Z55 (100) | HR-35 (6) | SL-2/SL-4 (80/20) | N-7 (6) | W-4 (4) | 27 | 3 |
| Comparative Example 1 | A1 (50/40/10) | Z66 (100) | — | SL-2/SL-4 (80/20) | N-6 (7) | W-1 (2) | 87 | 2 |
| Comparative Example 2 | A3 (50/40/10) | Z65/Z29 (100/10) | — | SL-2/SL-3 (50/50) | N-7 (5) | W-1 (4) | 76 | 2 |
| Comparative Example 3 | A4 (60/30/10) | Z47 (110) | — | SL-2/SL-3 (80/20) | N-1 (6) | W-1 (3) | 78 | 1 |
| Comparative Example 4 | A15 (40/40/20) | Z55 (80) | HR-25 (11) | SL-2/SL-3 (60/40) | N-3 (10) | W-4 (4) | >100 | 2 |
| Comparative Example 5 | A16 (50/40/10) | Z44/Z65 (50/50) | HR-42 (10) | SL-1/SL-2 (60/40) | N-7 (6) | W-6 (9) | >100 | 1 |

TABLE 2-continued
Meanings of symbols in Table 2 are as shown below.
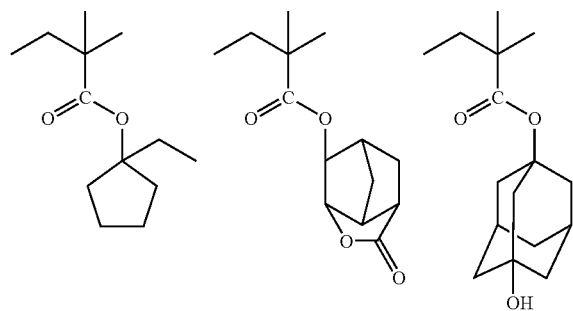
(A1) Mw = 9300, Mw/Mn = 1.71
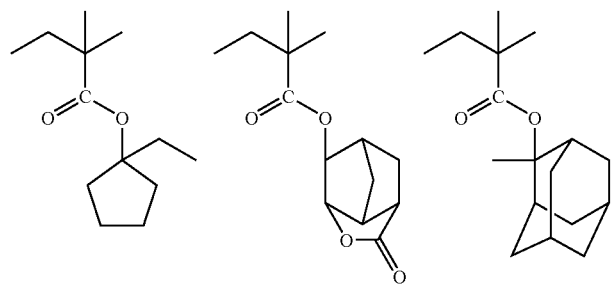
(A2) Mw = 8700, Mw/Mn = 1.75
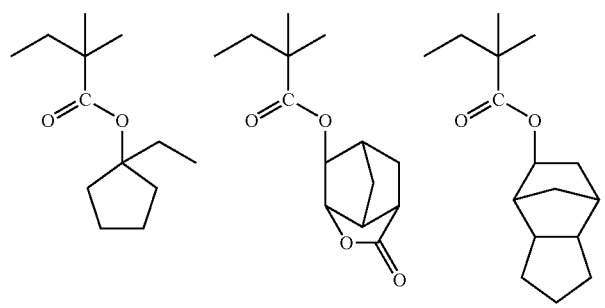
(A3) Mw = 7300, Mw/Mn = 1.74
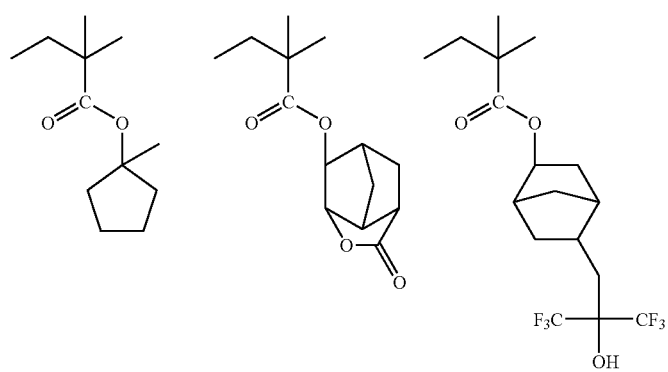
(A4) Mw = 10500, Mw/Mn = 1.73

TABLE 2-continued
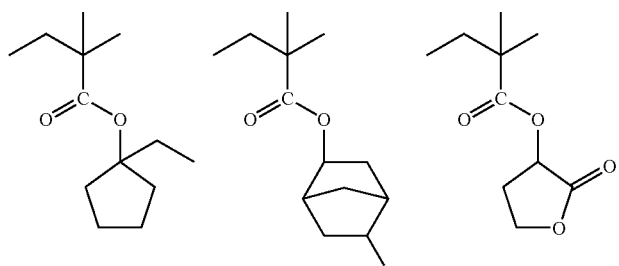
(A5) Mw = 8900, Mw/Mn = 1.81
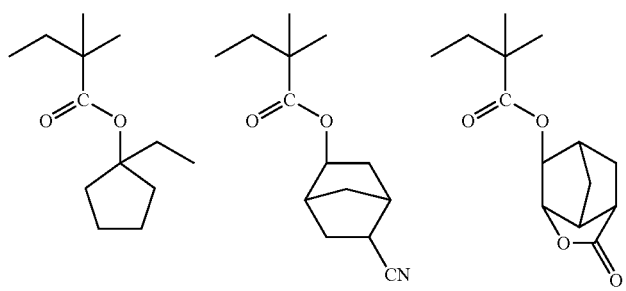
(A6) Mw = 7600, Mw/Mn = 1.79
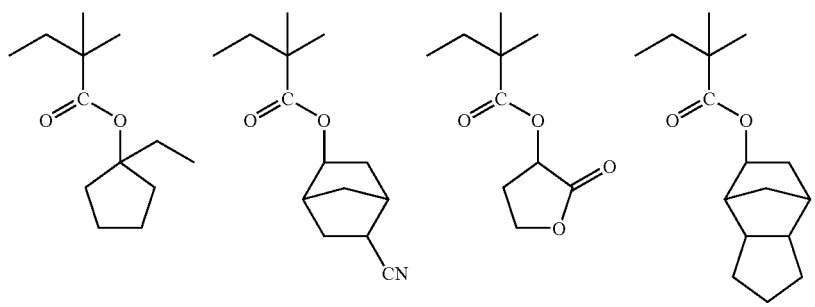
(A7) Mw = 9600, Mw/Mn = 1.82
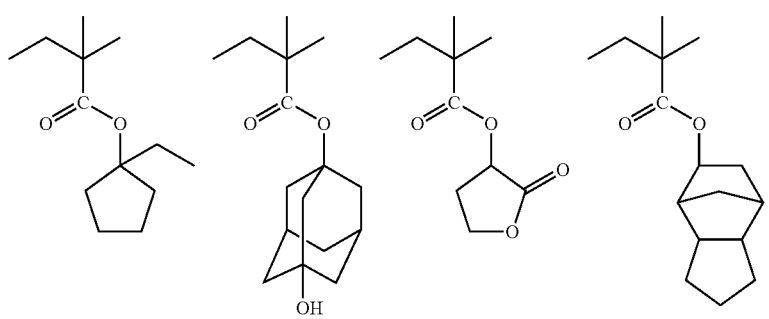
(A8) Mw = 7300, Mw/Mn = 1.75
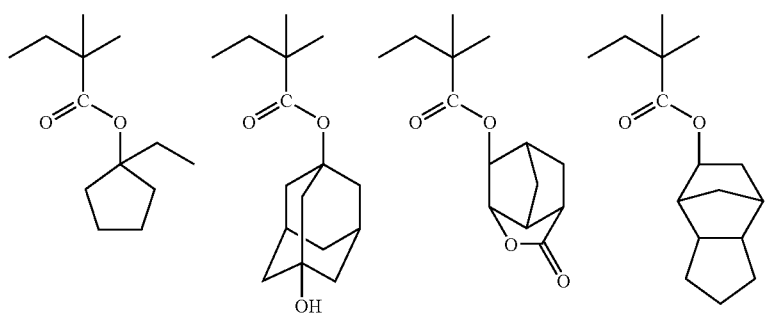
(A9) Mw = 8500, Mw/Mn = 1.76

TABLE 2-continued
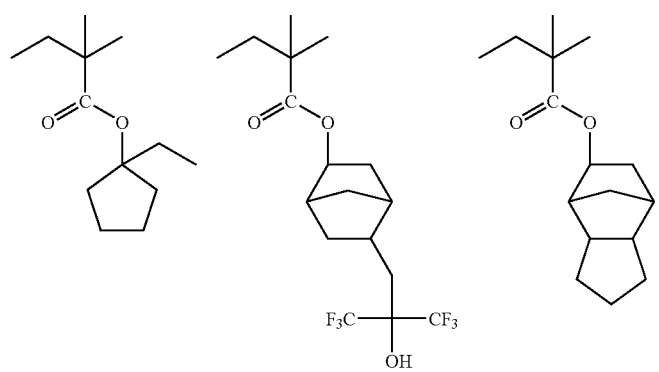
(A10) Mw = 10300, Mw/Mn = 1.77
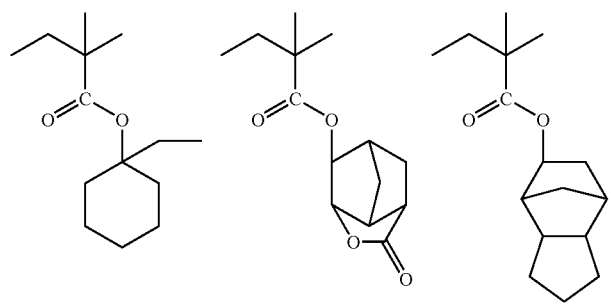
(A11) Mw = 7800, Mw/Mn = 1.72
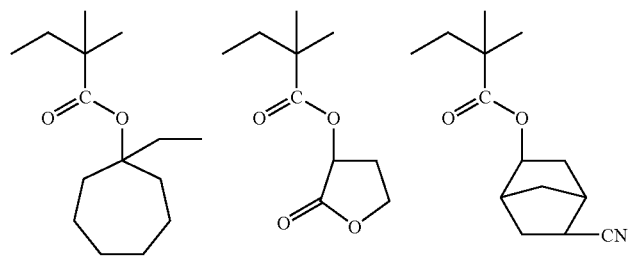
(A12) Mw = 8400, Mw/Mn = 1.75 (A12) Mw = 8400, Mw/Mn = 1.75
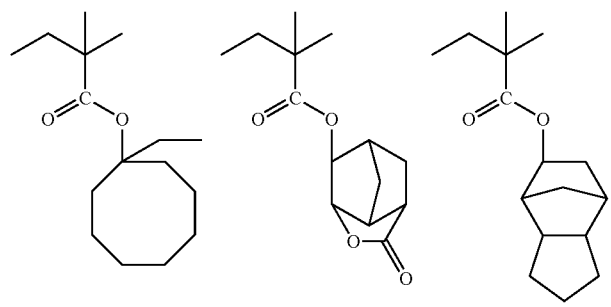
(A13) Mw = 7300, Mw/Mn = 1.69

TABLE 2-continued

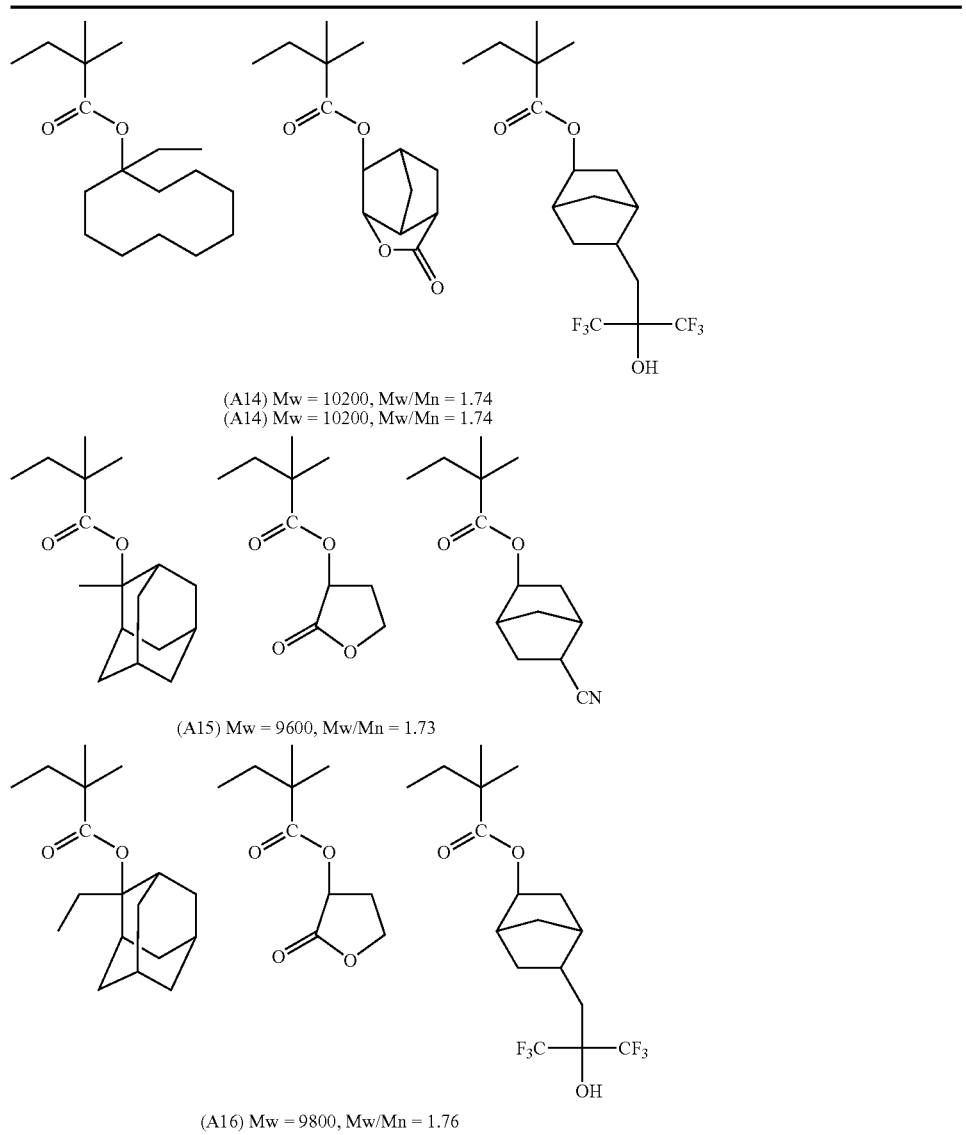

(A14) Mw = 10200, Mw/Mn = 1.74
(A14) Mw = 10200, Mw/Mn = 1.74

(A15) Mw = 9600, Mw/Mn = 1.73

(A16) Mw = 9800, Mw/Mn = 1.76

The acid generators correspond to those which have been illustrated hereinbefore.
N-1: N,N-Dibutylaniline
N-2: N,N-Dihexylaniline
N-3: 2,6-Diisoproylaniline
N-4: Tri-n-octylamine
N-5: N,N-Dihydroxyethylaniline
N-6: 2,4,5-Triphenylimidazole N-7: Triethanolamine
W-1: Megafac F176 (manufactured by Dainippon Ink & Chemicals, Inc.) (fluorine-containing series)
W-2: Megafac R08 (manufactured by Dainippon Ink & Chemicals, Inc.) (fluorine- and silicon-containing series)
W-3: Polysiloxane polymer KP-341 (manufactured by Shin-Etsu Chemical Co., Ltd.) (silicon-containing series)
W-4: Troysol S-366 (manufactured by Troy Chemical)
W-5: PF656 (manufactured by OMNOVA; fluorine-containing series)
W-6: PF6320 (manufactured by OMNOVA; fluorine-containing series)
SL-1: Cyclohexanone
SL-2: Propylene glycol monomethyl ether acetate
SL-3: Ethyl lactate
SL-4: Propylene glycol monomethyl ether
SL-5: γ-Butyrolactone
SL-6: Propylene carbonate A positive resist composition capable of suppressing generation of water mark upon immersion exposure and a pattern-forming method using the composition are provided by the invention. Further the positive resist composition of the invention can reduce film reduction upon immersion exposure.

The entire disclosure of each and every foreign patent application from which the benefit of foreign priority has been claimed in the present application is incorporated herein by reference, as if fully set forth.

What is claimed is:
1. A positive working pattern-forming method comprising:
   (1) providing a positive resist composition comprising:
      (A) a resin that has a repeating unit represented by general formula (a1) and increases its solubility in an alkali developer by action of an acid;

(B) a compound which generates an acid upon irradiation with an actinic ray or a radiation; and
(C) a resin that has at least one of a flourine atom and a silicon atom and has a group (z) that decomposes by action of an acid; and
(D) a solvent;

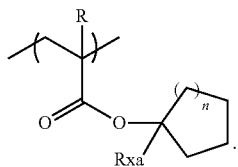
(a1)

2. The positive working pattern-forming method of claim 1, wherein the resin (A) further comprises a repeating unit represented by formula (a1-1) or (a1-2):

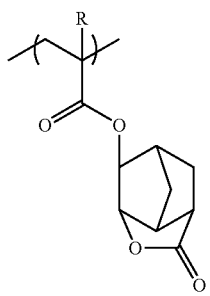
(a1-1)

(a1-2)

wherein R represents a hydrogen atom or a methyl group.

3. The positive working pattern-forming method of claim 1, wherein the resin (A) further comprises a repeating unit represented by formula (a2):

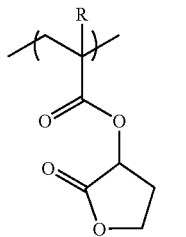
(a2)

wherein R represents a hydrogen atom or a methyl group, p represents an integer of 0 to 8, $Ra_2$ represents an alkyl group, a cyano group or a group represented by $-(CH2)_q-C(CF_3)_2OH$ and, when a plurality of $Ra_2$s exist, $Ra_2$s may be the same or different or may be connected to each other to form a ring, and q represents an integer of 0 to 3.

4. The positive working pattern-forming method of claim 3, wherein the repeating unit represented by formula (a2) in claim 3 is a repeating unit represented by the following formula:

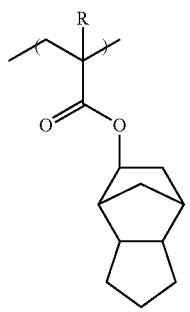

wherein R represents a hydrogen atom or a methyl group.

5. The positive working pattern-forming method of claim 1, wherein n in formula (a1) represents an integer of 1.

6. The positive working pattern-forming method of claim 1, wherein the resin (C) has a fluorine atom.

7. The positive working pattern-forming method of claim 1, wherein the amount of the resin (C) is from 0.1 to 5% by weight based on the weight of the total solid components of the positive resist composition.

8. A positive working pattern-forming method comprising:
(1) providing as positive resist composition comprising:
  (A) a resin that has a repeating unit represented by general formula (a1) and increases its solubility in an alkali developer by action of an acid;
  (B) a compound which generates an acid upon irradiation with an actinic ray or radiation; and
  (C) a resin that has at least one of a fluorine atom and a silicon atom and has a group (y) which is capable of decomposing by action of an alkali developer to undergo an increase in a solubility of the resin (C) in an alkali developer and which group (y) has a lactone structure and
(D) a solvent:

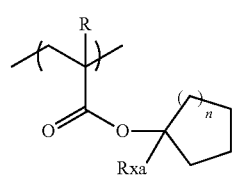
(a1)

wherein R represents a hydrogen atom or a methyl group, Rxa represents an alkyl group or a cycloalkyl group, and n represents an integer of 1 to 8;
(2) forming a resist film with the positive resist composition;
(3) exposing the resist film to an immersion exposure; and
(4) developing the resist film.

9. The positive working pattern-forming method of claim 8, wherein the resin (A) further comprises a repeating unit represented by formula (a1-1) or (a1-2):

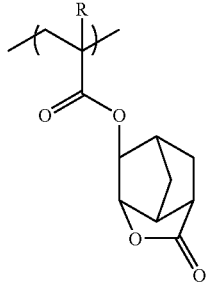 (a1-1)

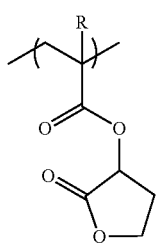 (a1-2)

wherein R represents a hydrogen atom or a methyl group.

10. The positive working pattern-forming method of claim 8, wherein the resin (A) further comprises a repeating unit represented by formula (a2):

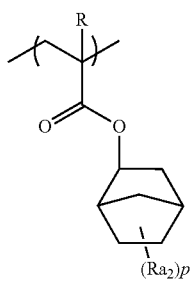 (a2)

wherein R represents a hydrogen atom or a methyl group, p represents an integer of 0 to 8, $Ra_2$ represents an alkyl group, a cyano group or a group represented by $-(CH2)_q-C(CF_3)_2OH$ and, when a plurality of $Ra_2$s exist, $Ra_2$s may be the same or different or may be connected to each other to form a ring, and q represents an integer of 0 to 3.

11. The positive working pattern-forming method of claim 10, wherein the repeating unit represented by formula (a2) in claim 10 is a repeating unit represented by the following formula:

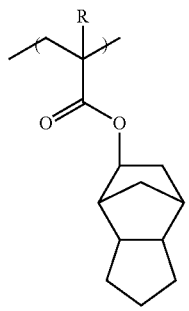

wherein R represents a hydrogen atom or a methyl group.

12. The positive working pattern-forming method of claim 8, wherein n in formula (a1) represents an integer of 1.

13. The positive working pattern-forming method of claim 8, wherein the resin (C) has a fluorine atom.

14. The positive working pattern-forming method of claim 8, wherein the amount of the resin (C) is from 0.1 to 5% by weight based on the weight of the total solid components of the positive resist composition.

* * * * *

UNITED STATES PATENT AND TRADEMARK OFFICE
CERTIFICATE OF CORRECTION

| | |
|---|---|
| PATENT NO. | : 7,998,654 B2 |
| APPLICATION NO. | : 12/056330 |
| DATED | : August 16, 2011 |
| INVENTOR(S) | : Fumiyuki Nishiyama et al. |

It is certified that error appears in the above-identified patent and that said Letters Patent is hereby corrected as shown below:

Col. 99, line 15

In claim 1: At the end of the claim after structural formula (a1) and inside the ".", insert the language:

--wherein R represents a hydrogen atom or a methyl group, Rxa represents an alkyl group or a cycloalkyl group, and n represents an integer of 1 to 8;

(2) forming a resist film with the positive resist composition;

(3) exposing the resist film to an immersion exposure; and (4) developing the resist film.--

Signed and Sealed this
Twenty-seventh Day of December, 2011

David J. Kappos
*Director of the United States Patent and Trademark Office*